(12) United States Patent
Kinoshita et al.

(10) Patent No.: US 12,130,305 B2
(45) Date of Patent: Oct. 29, 2024

(54) INERTIA MEASUREMENT DEVICE, VEHICLE, AND ELECTRONIC DEVICE

(71) Applicant: SEIKO EPSON CORPORATION, Tokyo (JP)

(72) Inventors: Yusuke Kinoshita, Minowa (JP); Nobuyuki Imai, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/487,459

(22) Filed: Oct. 16, 2023

(65) Prior Publication Data
US 2024/0044936 A1 Feb. 8, 2024

Related U.S. Application Data

(60) Division of application No. 18/072,836, filed on Dec. 1, 2022, now Pat. No. 11,860,185, which is a (Continued)

(30) Foreign Application Priority Data

Mar. 8, 2018 (JP) .................. 2018-042387

(51) Int. Cl.
*G01P 15/18* (2013.01)
*G01C 21/16* (2006.01)
(Continued)

(52) U.S. Cl.
CPC ............ *G01P 15/18* (2013.01); *G01C 21/165* (2013.01); *G01C 21/18* (2013.01); *G01S 19/47* (2013.01);
(Continued)

(58) Field of Classification Search
CPC ....... G01P 15/18; G01C 21/165; G01C 21/18; G01C 21/188; G01C 25/005; G01S 19/47;
(Continued)

(56) References Cited

U.S. PATENT DOCUMENTS

| 7,040,922 B2 | 5/2006 | Harney et al. |
| 9,321,498 B2 | 4/2016 | Oikawa |

(Continued)

FOREIGN PATENT DOCUMENTS

| JP | H03224814 A | 10/1991 |
| JP | H04-204059 A | 7/1992 |

(Continued)

*Primary Examiner* — Francis C Gray
(74) *Attorney, Agent, or Firm* — Harness, Dickey & Pierce, P.L.C.

(57) ABSTRACT

An inertia measurement device, which is used in combination with a satellite positioning receiver that outputs a positioning result at every T seconds in a positioning system equipped on a vehicle, when a Z-axis angular velocity sensor, a position error P[m] based on the detection signal of the Z-axis angular velocity sensor while the vehicle moves at a moving speed V[m/sec] for T seconds satisfies $Pp \geq P = (V/Bz) \times (1-\cos(Bz \times T))$ (where, a bias error of the Z-axis angular velocity sensor is Bz[deg/sec] and a predetermined allowable maximum position error during movement for T seconds is Pp[m]), and a bias error Bx and By of the Y-axis angular velocity sensor satisfies Bz<Bx and Bz<By.

10 Claims, 30 Drawing Sheets

Related U.S. Application Data continuation of application No. 17/643,603, filed on Dec. 10, 2021, now Pat. No. 11,549,962, which is a continuation of application No. 17/197,121, filed on Mar. 10, 2021, now Pat. No. 11,231,442, which is a continuation of application No. 16/295,008, filed on Mar. 7, 2019, now Pat. No. 10,976,342.

(51) Int. Cl.
*G01C 21/18* (2006.01)
*G01S 19/47* (2010.01)
*G01S 19/49* (2010.01)

(52) U.S. Cl.
CPC ....... *G01S 19/49* (2013.01); *B81B 2201/0235* (2013.01); *B81B 2201/0242* (2013.01)

(58) Field of Classification Search
CPC .................. G01S 19/235; G01S 19/40; B81B 2201/0235; B81B 2201/0242
See application file for complete search history.

(56) References Cited

U.S. PATENT DOCUMENTS

| | | |
|---|---|---|
| 2006/0090358 A1 | 5/2006 | Campbell et al. |
| 2007/0176702 A1 | 8/2007 | Takizawa et al. |
| 2007/0245826 A1 | 10/2007 | Cardarelli |
| 2012/0304768 A1 | 12/2012 | Sakuma et al. |
| 2012/0330497 A1 | 12/2012 | De Tommasi |
| 2013/0068019 A1 | 3/2013 | Takase |
| 2013/0158940 A1 | 6/2013 | Crane et al. |
| 2013/0238269 A1 | 9/2013 | Sheng |
| 2014/0347823 A1 | 11/2014 | Kinoshita et al. |
| 2016/0327654 A1 | 11/2016 | Kumabe et al. |
| 2017/0153646 A1 | 6/2017 | Shin et al. |
| 2017/0191832 A1* | 7/2017 | Kinoshita ............. G01P 15/125 |
| 2018/0245924 A1 | 8/2018 | Ishigami et al. |
| 2019/0101562 A1 | 4/2019 | Kigure |
| 2019/0107397 A1 | 4/2019 | Ito |
| 2019/0113401 A1* | 4/2019 | Naruse ................. G01P 15/125 |
| 2019/0154446 A1* | 5/2019 | Komizo ................ B81B 3/0059 |
| 2019/0187171 A1* | 6/2019 | Takizawa ................ G01P 15/14 |
| 2019/0369137 A1 | 12/2019 | Naruse |
| 2020/0278377 A1 | 9/2020 | Takizawa |

FOREIGN PATENT DOCUMENTS

| | | |
|---|---|---|
| JP | H10-221098 A | 8/1998 |
| JP | 2001074449 A | 3/2001 |
| JP | WO2008087778 A1 | 5/2010 |
| JP | 2012-251803 A | 12/2012 |
| JP | 2014-228489 A | 12/2014 |
| JP | 2015-072231 A | 4/2015 |
| JP | 2017-020829 A | 1/2017 |
| KR | 2014-0080261 A | 6/2014 |

* cited by examiner

FIG. 13
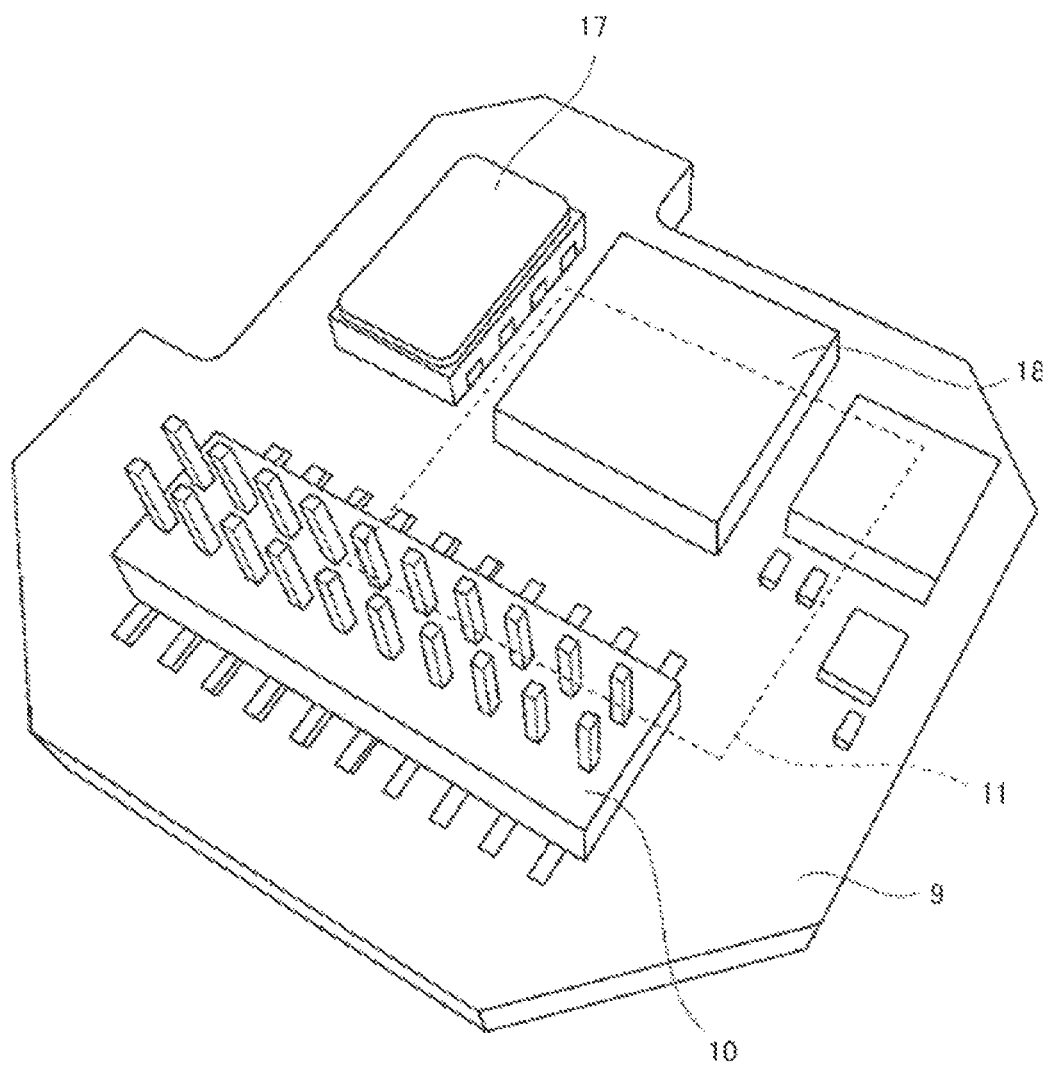
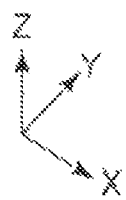

INERTIA MEASUREMENT DEVICE, VEHICLE, AND ELECTRONIC DEVICE

CROSS-REFERENCE TO RELATED APPLICATIONS

This application is a divisional of U.S. patent application Ser. No. 18/072,836 filed on Dec. 1, 2022, which is a continuation of U.S. patent application Ser. No. 17/643,603 filed on Dec. 10, 2021, now U.S. Pat. No. 11,549,962 issued on Jan. 10, 2023, which is a continuation of U.S. patent application Ser. No. 17/197,121 filed on Mar. 10, 2021, now U.S. Pat. No. 11,231,442 issued on Jan. 25, 2022, which is a continuation of U.S. patent application Ser. No. 16/295,008 filed on Mar. 7, 2019, now U.S. Pat. No. 10,976,342 issued on Apr. 13, 2021, which are based on, and claim priority from, JP Application Serial Number 2018-042387, filed Mar. 8, 2018, the disclosures of which are hereby incorporated by reference herein in their entirety.

BACKGROUND

1. Technical Field

The present invention relates to an inertia measurement device and the like.

2. Related Art

For example, as disclosed in JP-A-2012-251803, JP-A-2014-228489, and JP-A-2017-20829, various inertia measurement devices including a triaxial angular velocity sensor and a triaxial acceleration sensor are known.

In the inertia measurement device of the related art, angular velocity sensors having the same specification but different only in an installation orientation are used for an angular velocity sensor for measuring a roll angle, an angular velocity sensor for measuring a pitch angle, and an angular velocity sensor for measuring a yaw angle. For that reason, a measurement error of each angular velocity sensor is approximately the same.

In a case where a positioning system including an inertia measurement device is equipped on a vehicle, there is no problem as long as required accuracy for a measured value of each of the roll angle, the pitch angle, and the yaw angle of the vehicle measured by the angular velocity sensors is approximately the same. In practice, however, it was found that a measured value of the yaw angle is desirably higher in accuracy than the roll angle and the pitch angle.

SUMMARY

The invention is based on the knowledge.

A first aspect of the invention is directed to an inertia measurement device which is used in combination with a satellite positioning receiver that outputs a positioning result at every T[second] in a positioning system equipped on a vehicle, and the device including, when a front and rear direction of the vehicle is set as an X-axis, a left and right direction of the vehicle is set as a Y-axis, and a direction orthogonal to the X-axis and the Y-axis set as a Z-axis, an X-axis angular velocity sensor which measures an angular velocity around the X-axis and outputs a first angular velocity signal, a Y-axis angular velocity sensor which measures an angular velocity around the Y-axis and outputs a second angular velocity signal, a Z-axis angular velocity sensor which measures an angular velocity around the Z-axis and outputs a third angular velocity signal, an X-axis acceleration sensor which measures acceleration in a direction of the X-axis and outputs a first acceleration signal, a Y-axis acceleration sensor which measures acceleration in a direction of the Y-axis and outputs a second acceleration signal, and a Z-axis acceleration sensor which measures acceleration in a direction of the Z-axis and outputs a third acceleration signal, and in which, in the Z-axis angular velocity sensor, a position error P[m] based on the third angular velocity signal while the vehicle moves at a moving speed V[m/sec] for T seconds satisfies $Pp \geq P = (V/Bz) \times (1-\cos(Bz \times T))$, (where, a bias error of the third angular velocity signal is set as $Bz[deg/sec]$ and a predetermined allowable maximum position error during movement for T seconds is set as $Pp[m]$), in the X-axis angular velocity sensor, a bias error $Bx[deg/sec]$ of the first angular velocity signal satisfies $Bz<Bx$, and in the Y-axis angular velocity sensor, a bias error $By[deg/sec]$ of the second angular velocity signal satisfies $Bz<By$.

According to the first aspect, since the bias error Bz of the Z-axis angular velocity sensor is smaller than the bias error Bx of the X-axis angular velocity sensor and the bias error By of the Y-axis angular velocity sensor, the angular velocity around the Z-axis which is the yaw angle can be obtained with higher accuracy than the angular velocity around the X-axis which is the roll angle and the angular velocity around the Y-axis which is the pitch angle. The bias error Bz of the Z-axis angular velocity sensor is a value that makes a position error of the vehicle during movement of T seconds which is an output interval of a positioning result by a satellite positioning receiver equal to or less than a predetermined allowable maximum position error Pp. Accordingly, when the inertia measurement device is equipped on the vehicle as a positioning system by being combined with a satellite positioning receiver, accuracy of the inertial navigation which allows the position error during T seconds, which is the output interval of the positioning result of the satellite positioning receiver, to be equal to or less than the predetermined allowable maximum position error can be secured.

A second aspect of the invention is directed to the inertia measurement device according to the first aspect, in which $Bz<0.5 \times Bx$ and $Bz<0.5 \times By$ is satisfied.

According to the second aspect, the bias error Bz of the Z-axis angular velocity sensor can be 0.5 times or less of each of the bias error Bx of the X-axis angular velocity sensor and the bias error By of the Y-axis angular velocity sensor.

A third aspect of the invention is directed to an inertia measurement device used in a positioning system equipped on a vehicle, and the device including, when a front and rear direction of the vehicle is set as an X-axis, a left and right direction of the vehicle is set as a Y-axis, and a direction orthogonal to the X-axis and the Y-axis set as a Z-axis, an X-axis angular velocity sensor which measures an angular velocity around the X-axis and outputs a first angular velocity signal, a Y-axis angular velocity sensor which measures an angular velocity around the Y-axis and outputs a second angular velocity signal, a Z-axis angular velocity sensor which measures an angular velocity around the Z-axis and outputs a third angular velocity signal, an X-axis acceleration sensor which measures acceleration in a direction of the X-axis and outputs a first acceleration signal, a Y-axis acceleration sensor which measures acceleration in a direction of the Y-axis and outputs a second acceleration signal, and a Z-axis acceleration sensor which measures acceleration in a direction of the Z-axis and outputs a third acceleration signal, and in which, when the Allan variance of the first angular velocity signal of the X-axis angular velocity sensor is set as BISx[deg/hour], the Allan variance of the second angular velocity signal of the Y-axis angular velocity sensor is set as BISy[deg/hour], and the Allan variance of the third angular velocity signal of the Z-axis angular velocity sensor is set as BISz[deg/hour], BISz<0.5×BISx, and BISz<0.5×BISy are satisfied.

According to the third aspect, since the Allan variance BISz of the Z-axis angular velocity sensor is smaller than the Allan variance BISx of the X-axis angular velocity sensor and the Allan variance BISy of the Y-axis angular velocity sensor, the measured value of the yaw angle can be obtained with higher accuracy than the roll angle and the pitch angle. Also, the Allan variance BISz of the Z-axis angular velocity sensor can be made less than 0.5 times each of the Allan variance BISx of the X-axis angular velocity sensor and the Allan variance BISy of the Y-axis angular velocity sensor.

A fourth aspect of the invention is directed to the inertia measurement device according to the third aspect, in which BISx>5, BISy>5, and BISz<2.5 is satisfied.

According to the fourth aspect, the Allan variance BISz of the Z-axis angular velocity sensor can be set to be less than 2.5 [deg/hour], and the Allan variance BISx of the X-axis angular velocity sensor and the Allan variance BISy of the Y-axis angular velocity sensor can be set to be greater than 5 [deg/hour].

A fifth aspect of the invention is directed to the inertia measurement device according to any one of the first to fourth aspects, in which Bx>1140 [deg/hour], By>1140 [deg/hour], and Bz<570 [deg/hour] is satisfied.

According to the fifth aspect, the bias error Bz of the Z-axis angular velocity sensor can be set to be less than 570 [deg/hour], the bias error Bx of the X-axis angular velocity sensor and the bias error By of the Y-axis angular velocity sensor can be set to be greater than 1140 [deg/Hour].

A sixth aspect of the invention is directed to the inertia measurement device according to any one of the first to fifth aspects, in which the X-axis angular velocity sensor is configured to include Ngx sensor elements, the Y-axis angular velocity sensor is configured to include Ngy sensor elements, and the Z-axis angular velocity sensor is configured to include Ngz sensor elements, and Ngz>Ngx and Ngz>Ngy are satisfied.

According to the sixth aspect, by constituting the Z-axis angular velocity sensor with a larger number of sensor elements than those of the X-axis angular velocity sensor and those the Y-axis angular velocity sensor, the bias error Bz of the Z-axis angular velocity sensor can be made smaller than the bias error Bx of the X-axis angular velocity sensor and the bias error By of the Y-axis angular velocity sensor.

A seventh aspect of the invention is directed to the inertia measurement device according to the sixth aspect, in which Ngz≥2 is satisfied.

According to the seventh aspect, the Z-axis angular velocity sensor can be configured to include two or more sensor elements.

As a configuration of the Z-axis angular velocity sensor, for example, an eighth aspect adopted. That is, the eighth aspect of the invention is directed to the inertia measurement device according to any one of the first to seventh aspects, in which the Z-axis angular velocity sensor includes, in an orthogonal coordinate system including an electric axis, a mechanical axis, and an optical axis of quartz crystal, a base portion having a principal surface along a plane defined by the electric axis and the mechanical axis, a pair of detection vibration arms one of which extending from the base portion in a plus direction of the mechanical axis and the other of which extending in a minus direction of the mechanical axis, a pair of connection arms one of which extending from the base portion in a plus direction of the electric axis and the other of which extending from the base portion in a minus direction of the electric axis, a pair of drive vibration arms one of which extending from each connection arm in the plus direction of the mechanical axis and the other of which extending from each connection arm in the minus direction of the mechanical axis, at least two beams extending from the base portion, and a support portion connected to a tip portion of each beam, and in which a first beam made of quartz crystal, which is one of the beams, extends from an outer edge of the base portion between the connection arm positioned on the plus side from the base portion in the electric axis direction and the detection vibration arm positioned on the plus side from the base portion in the mechanical axis direction, and the first beam includes a first extension portion extending from the base portion in the plus direction of the electric axis, a second extension portion extending from the first extension portion in the plus direction of the mechanical axis, and a third extension portion extending from the second extension portion in the minus direction of the electric axis.

A ninth aspect of the invention is directed to the inertia measurement device according to the eighth aspect, in which the X-axis angular velocity sensor and the Y-axis angular velocity sensor are Si-MEMS type angular velocity sensors, and the X-axis acceleration sensor, the Y-axis acceleration sensor, and the Z-axis acceleration sensor are Si-MEMS type acceleration sensors.

According to the ninth aspect, by using the Si-MEMS type angular velocity sensors as the X-axis angular velocity sensor and the Y-axis angular velocity sensor, and using the Si-MEMS type acceleration sensors as the X-axis acceleration sensor, the Y-axis acceleration sensor, and the Z-axis acceleration sensor, it can be configured at lower cost than the Z-axis angular velocity sensor.

A tenth aspect of the invention is directed to the inertia measurement device according to the ninth invention, which further includes a container that accommodates the X-axis angular velocity sensor, the Y-axis angular velocity sensor, the X-axis acceleration sensor, the Y-axis acceleration sensor, and the Z-axis acceleration sensor.

According to the tenth aspect, the X-axis angular velocity sensor, the Y-axis angular velocity sensor, the X-axis acceleration sensor, the Y-axis acceleration sensor, and the Z-axis acceleration sensor can be accommodated in the container and packaged.

An eleventh aspect of the invention is directed to the inertia measurement device according to the first to tenth aspects, in which the first angular velocity signal and the first acceleration signal become calculation reference signals for a roll angle of the vehicle, and the second angular velocity signal and the second acceleration signal become calculation reference signals for a pitch angle of the vehicle.

According to the eleventh aspect, although the roll angle and the pitch angle measured by the X-axis angular velocity sensor and the Y-axis angular velocity sensor are lower in accuracy than the yaw angle, by using the acceleration signals of the X-axis acceleration sensor and the Y-axis acceleration sensor as reference signals, it is possible to obtain the roll angle and the pitch angle with higher accuracy than a case where these reference signals are not used.

A twelfth aspect of the invention is directed to a vehicle including the inertia measurement device according to any one of the first to eleventh aspects, and a control unit that controls at least one of acceleration, braking, and steering based on an output signal of the inertia measurement device, and in which execution or non-execution of the automatic operation is switched based on the output signal of the inertia measurement device.

According to the twelfth aspect, an automatic operation of the vehicle can be performed with high quality.

A thirteenth aspect of the invention is directed to a portable electronic device including a case having an opening portion, the inertia measurement device according to any one of the first to eleventh aspects accommodated in the case, and a processing unit accommodated in the case and processing an output signal of the inertia measurement device, a display unit accommodated in the case and having a display screen which faces the opening portion, and a translucent cover that covers the opening portion.

According to the thirteenth aspect, a portable electronic device using inertial navigation can be realized.

A fourteenth aspect of the invention is directed to an electronic device including the inertia measurement device according to any one of the first to eleventh aspects, and a control unit that performs predetermined control based on an output signal of the inertia measurement device.

According to the fourteenth aspect, an electronic device using inertial navigation can be realized.

A fifteenth aspect of the invention is directed to a vehicle including the inertia measurement device according to any one of the first to eleventh aspects, and an attitude control unit that performs attitude control based on an output signal of the inertia measurement device.

According to the fifteenth aspect, attitude control of the vehicle can be performed with high quality.

BRIEF DESCRIPTION OF THE DRAWINGS

The invention will be described with reference to the accompanying drawings, wherein like numbers reference like elements.

FIG. 13 is a perspective view of a circuit board of the second embodiment.

DESCRIPTION OF EXEMPLARY EMBODIMENTS

Figure 1:
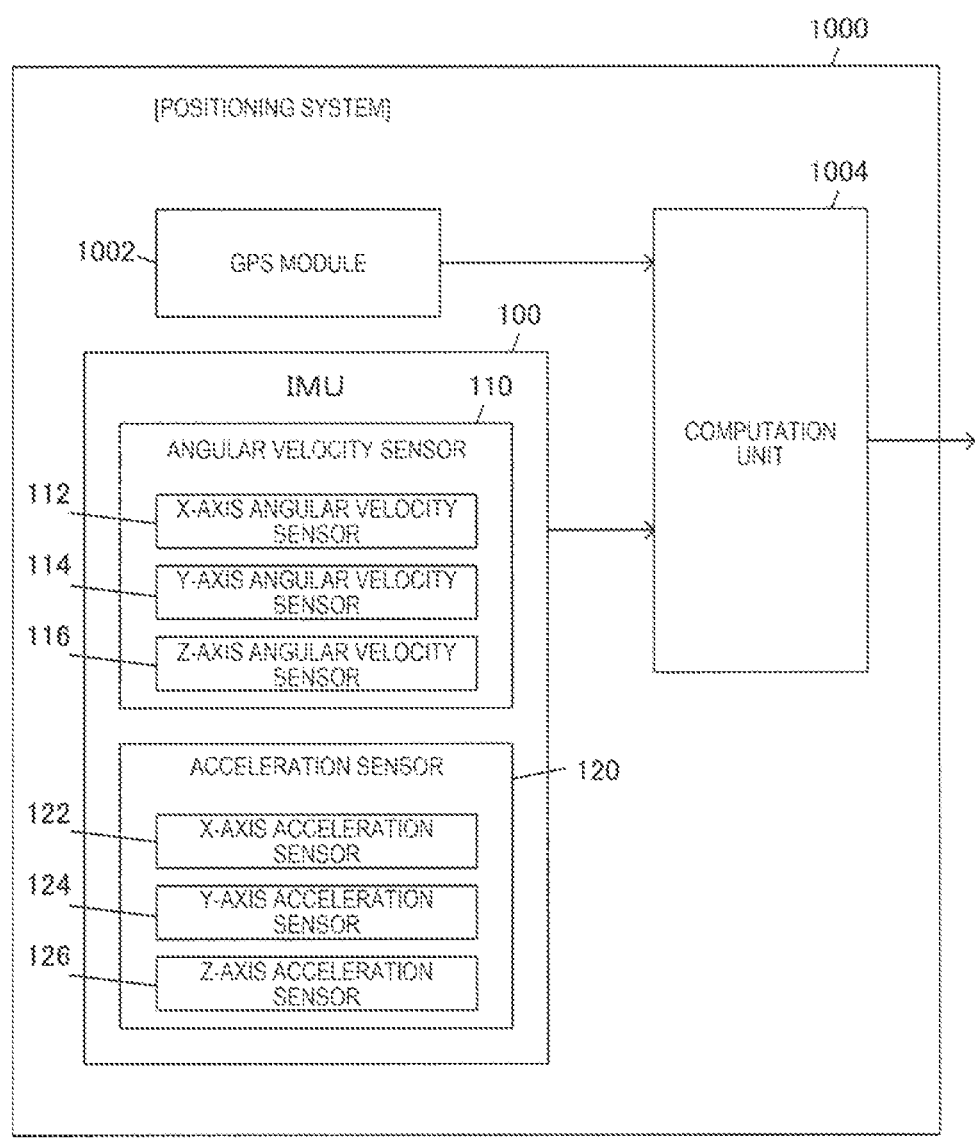
FIG. 1 is a function block diagram of a positioning system of a first embodiment.

Hereinafter, preferred embodiments of the invention will be described with reference to the drawings. The invention is not limited by the embodiments described below, and modes to which the invention can be applied are not limited to the following embodiments. In the description of the drawings, the same reference numerals are given to the same elements.

First Embodiment

System Configuration

FIG. 1 is a block diagram illustrating a configuration of a positioning system 1000 according to a first embodiment. The positioning system 1000 is used by being equipped on a vehicle and measures a position of the vehicle. As the vehicle, any vehicle may be used as long as it is moving on the ground which is a substantially horizontal surface such as a bicycle, a motorcycle, a four-wheel automobile including a truck and a bus, an agricultural machine such as a tractor, a movable construction machine such as a bulldozer or a shovel car, and there is no particular limitation. As illustrated in FIG. 1, the positioning system 1000 includes a global positioning system (GPS) module 1002 which is a satellite positioning receiver, an inertial measurement unit (IMU) 100 which is an inertia measurement device, and a computation unit 1004.

The GPS module 1002 receives a GPS satellite signal transmitted from a GPS satellite and measures GPS positioning information including a date and time, a position, a speed, and an attitude represented by latitude and longitude based on the received GPS satellite signal. A satellite positioning receiver may be a receiver of a global navigation satellite system (GNSS), and may be not a GPS but a satellite positioning receiver using other satellite positioning systems such as a global navigation satellite system (GLONASS), GALILEO, a beidou navigation satellite system (Beidou) or the like.

The IMU 100 is a sensor unit including an angular velocity sensor 110 and an acceleration sensor 120.

The angular velocity sensor 110 is a sensor that measures an angular velocity in a sensor coordinate system that is a three-dimensional orthogonal coordinate system associated with the IMU 100, and is also referred to as a gyro sensor.

The angular velocity sensor 110 includes an X-axis angular velocity sensor 112 which detects an angular velocity around the X-axis and outputs the detected angular velocity as a first angular velocity signal, a Y-axis angular velocity sensor 114 which detects an angular velocity around the Y-axis and outputs the detected angular velocity as a second angular velocity signal, and a Z-axis angular velocity sensor 116 which detects an angular velocity around the Z-axis and outputs the detected angular velocity as a third angular velocity signal.

The acceleration sensor 120 measures acceleration in the sensor coordinate system which is the same as that of the angular velocity sensor 110 and is a three-dimensional orthogonal coordinate system associated with the IMU 100. The acceleration sensor 120 includes an X-axis acceleration sensor 122 which detects acceleration in the X-axis direction and outputs the detected acceleration as a first acceleration signal, a Y-axis acceleration sensor 124 which detects acceleration in the Y-axis direction and outputs the detected acceleration as a second acceleration signal, and a Z-axis acceleration sensor 126 which detects acceleration in the Z-axis direction and outputs the detected acceleration as a third acceleration signal.

The computation unit 1004 calculates a position of the positioning system 1000 using the GPS module 1002 and measured data of the IMU 100. For example, the inertial navigation computation using the measured data of the IMU 100 is performed to calculate the position of the positioning system 1000. When GPS positioning information is output from the GPS module 1002, the position calculated by the inertial navigation computation is corrected using the GPS positioning information. This because although positioning information obtained by the GPS module 1002 is higher in accuracy than the position obtained by the inertial navigation computation using the measured data of the IMU 100, an output interval (positioning interval) of the GPS positioning information is longer than an output interval of the measured data of the IMU 100. For example, the IMU 100 outputs measured data every 10 milliseconds, and the GPS module 1002 outputs GPS positioning information every one second.

Sensor Coordinate System

Figure 2:
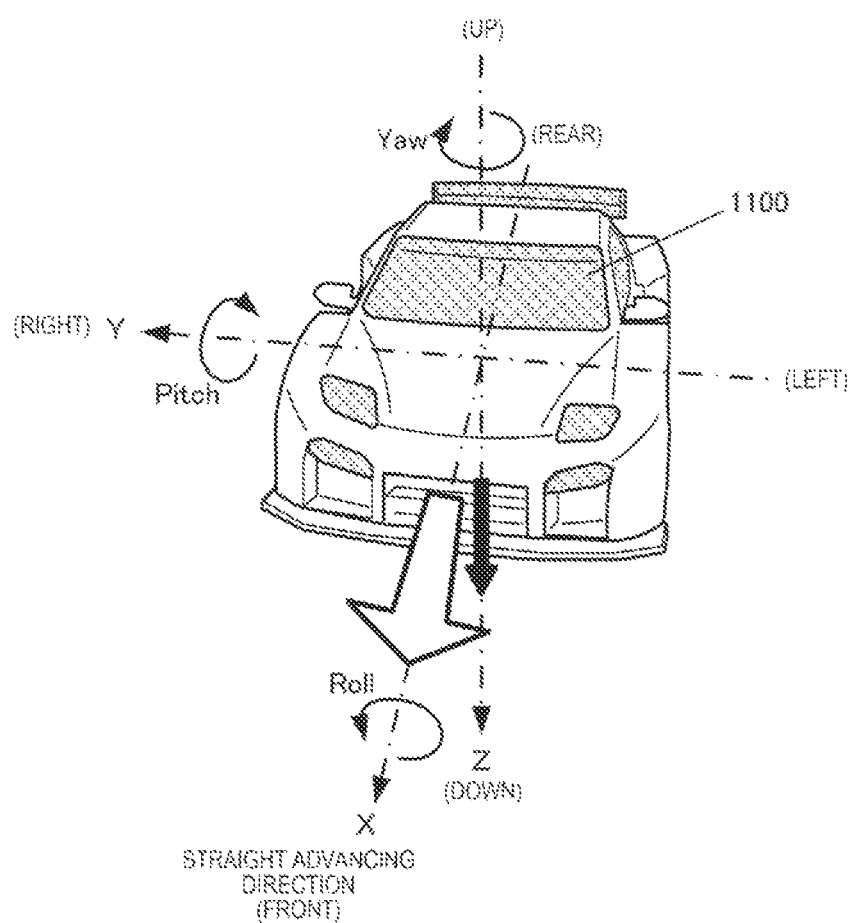
FIG. 2 is an explanatory diagram of a sensor coordinate system of the first embodiment.

The positioning system 1000 is fixedly equipped on the vehicle so that a sensor coordinate system which is a three-dimensional orthogonal coordinate system associated with the IMU 100 satisfies a predetermined relationship with respect to a direction of the vehicle. FIG. 2 is a diagram for explaining a relationship between the sensor coordinate system and a moving direction of a vehicle 1100. FIG. 2 illustrates an example in which the positioning system 1000 is equipped on a four-wheel automobile which is an example of the vehicle 1100. The X-axis of the sensor coordinate system is the front and rear direction of the vehicle 1100, and the forward direction (straight advancing direction) is the positive direction of the X-axis. Further, the Y-axis of the sensor coordinate system is the left and right direction of the vehicle 1100, and the right direction is the positive direction of the Y-axis. The Z-axis of the sensor coordinate system is a direction orthogonal to the X-axis and the Y-axis, and the down direction of the vehicle 1100 is the positive direction of the Z-axis.

In the first embodiment, since the vehicle 1100 moves in a substantially horizontal plane, the XY-plane becomes a moving plane of the vehicle, and a Z-axis positive direction of the Z-axis matches the direction of gravity. The attitude of the vehicle 1100 is represented by a roll angle around the X-axis, a pitch angle around the Y-axis, and a yaw angle around the Z-axis. Further, since the vehicle 1100 moves in a substantially horizontal plane, the roll angle which is the attitude corresponds to inclination in the left and right direction of the vehicle 1100, the pitch angle corresponds to inclination in the front and rear direction of the vehicle 1100, the yaw angle corresponds to conversion or an azimuth in the moving direction of the vehicle 1100.

Angular Velocity Sensor

As the characteristics of the first embodiment, the angular velocity sensor 110 is configured so that a bias error (output error at stationary condition) B and the Allan variance BIS representing bias stability have the following characteristics. That is, the Z-axis angular velocity sensor 116 is configured to have "higher accuracy" than the X-axis angular velocity sensor 112 and the Y-axis angular velocity sensor 114.

(A) Bias Error

The X-axis angular velocity sensor 112, the Y-axis angular velocity sensor 114, and the Z-axis angular velocity sensor 116 are configured so that bias errors of Bx [deg/sec], By [deg/sec], and Bz [deg/sec] satisfy the following expressions (1a) to (1c) when the Bx [deg/sec] is a bias error of an output signal of the X-axis angular velocity sensor 112, the By [deg/sec] is a bias error of an output signal of the Y-axis angular velocity sensor 114, and the Bz [deg/sec] is a bias error of the output signal of the Z-axis of the Z-axis angular velocity sensor 116.

$$P \leq (V/Bz) \times (1 - \cos(Bz \times T)) \quad (1a)$$

$$Bz < Bx \quad (1b)$$

$$Bz < By \quad (1c)$$

In the expression (1a), "T" is a positioning interval (second) of the GPS module 1002, and is an interval at which a positioning result is output from the GPS module 1002 to the computation unit 1004. "P" is a position error [m] caused by a bias error B of the output signal of the angular velocity sensor 110 while a vehicle 1100 moves for T seconds at the moving speed V [m/sec].

Figure 3:
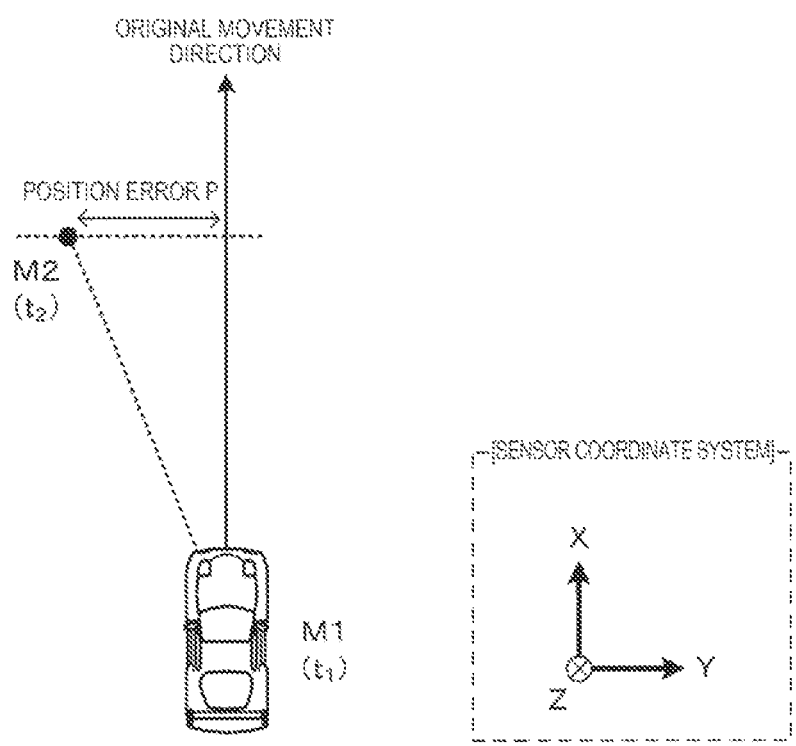
FIG. 3 is an explanatory diagram of a position error of the first embodiment.

FIG. 3 is a diagram for explaining a position error P. FIG. 3 is a view in which the mobile object 1100 is viewed from above, that is, illustrates a view of the XY-plane in the sensor coordinate system. The actual movement direction is indicated by the solid line as an original movement direction. Since the forward direction of the vehicle 1100 is the positive direction of the X-axis, the actual moving direction is also the positive direction of the X-axis. It is assumed that a position M1 of the vehicle 1100 at the time $t_1$ is known and set a position of the vehicle 1100 at the time $t_2$ as "M2", which is the position calculated by the inertial navigation computation using the measured data of the IMU 100. The distance between the position M2 and the original advancing direction is the position error P caused by the bias error B of the output signal of the angular velocity sensor 110 while the vehicle 1100 moves from the time $t_1$ to the time $t_2$.

Although the position calculated by the inertial navigation computation based on the measured data of the IMU 100 deviates from the original moving direction, this positional deviation is caused by an error in the attitude based on the measured data of the IMU 100. Specifically, in the first embodiment, since the vehicle 1100 moves in a substantially horizontal plane, the positional deviation is caused by an error in the yaw angle which is an attitude.

In the inertial navigation computation, the attitude is calculated by integrating the angular velocity which is the output signal of the angular velocity sensor 110 with respect to time. That is, a roll angle around the X-axis calculated by integrating the output signal of the X-axis angular velocity sensor 112 with respect to time, and a pitch (Pitch) angle around the Y-axis is calculated by integrating the output signal of the Y-axis angular velocity sensor 114 with respect to time, and the yaw angle around the Z-axis calculated by integrating the output signal of the Z-axis angular velocity sensor 116. However, since the output signal of the angular velocity sensor 110 includes the bias error B, the calculated attitude also includes an error. Further, since the output signal of the angular velocity sensor 110 is integrated with respect to time, the error included in the calculated attitude increases with the lapse of time.

On the other hand, the attitude can also be calculated from the output signal of the acceleration sensor 120. Specifically, the acceleration sensor 120 constantly detects gravitational acceleration G. That is, the X-axis acceleration sensor 122 detects an X-axis direction component of gravitational acceleration G, the Y-axis acceleration sensor 124 detects a Y-axis direction component of the gravitational acceleration G, and the Z-axis acceleration sensor 126 detects a Z-axis direction component of the gravitational acceleration G. For that reason, by combining gravitational acceleration components of the respective axes based on the output signals of the respective axes of the acceleration sensor 120 at a stationary state, it is possible to calculate the direction of the gravitational acceleration G with respect to the sensor coordinate system, that is, the attitude of the vehicle 1100 which is the attitude of the sensor coordinate system in real space.

Since a bias error is included also in the output signal of the acceleration sensor 120, an error is included also in the attitude calculated from the output signal of the acceleration sensor 120. However, the error included in the attitude calculated from the output signal of the acceleration sensor 120 is not an error which increases with the lapse of time but is a stable error with time. Accordingly, by complementarily using the attitude calculated from the output signal of the acceleration sensor 120, it is possible to calculate the attitude with stable accuracy with time regardless of the bias error B of the output signal of the angular velocity sensor 110.

However, as in the first embodiment, in the case where the vehicle 1100 moves on a substantially horizontal plane, the Z-axis of the sensor coordinate system is substantially coincident with the gravitational acceleration direction. For that reason, even if the yaw angle of the vehicle 1100 changes, the Z-axis direction component of the gravitational acceleration G hardly changes. Accordingly, with respect to the yaw angle, supplementation by the output signal of the acceleration sensor 120 is almost impossible or extremely difficult.

As illustrated in FIG. 3, in a case where the vehicle 1100 moves on a substantially horizontal plane, positional deviation calculated by the inertial navigation computation using the measured data of the IMU 100 is caused by the error of the yaw angle which is the attitude. Although the yaw angle is calculated from the output signal of the Z-axis angular velocity sensor 116, as the bias error Bz of the output signal of the Z-axis angular velocity sensor 116 is integrated, the error of the yaw angle increases with the lapse of time.

Figure 4:
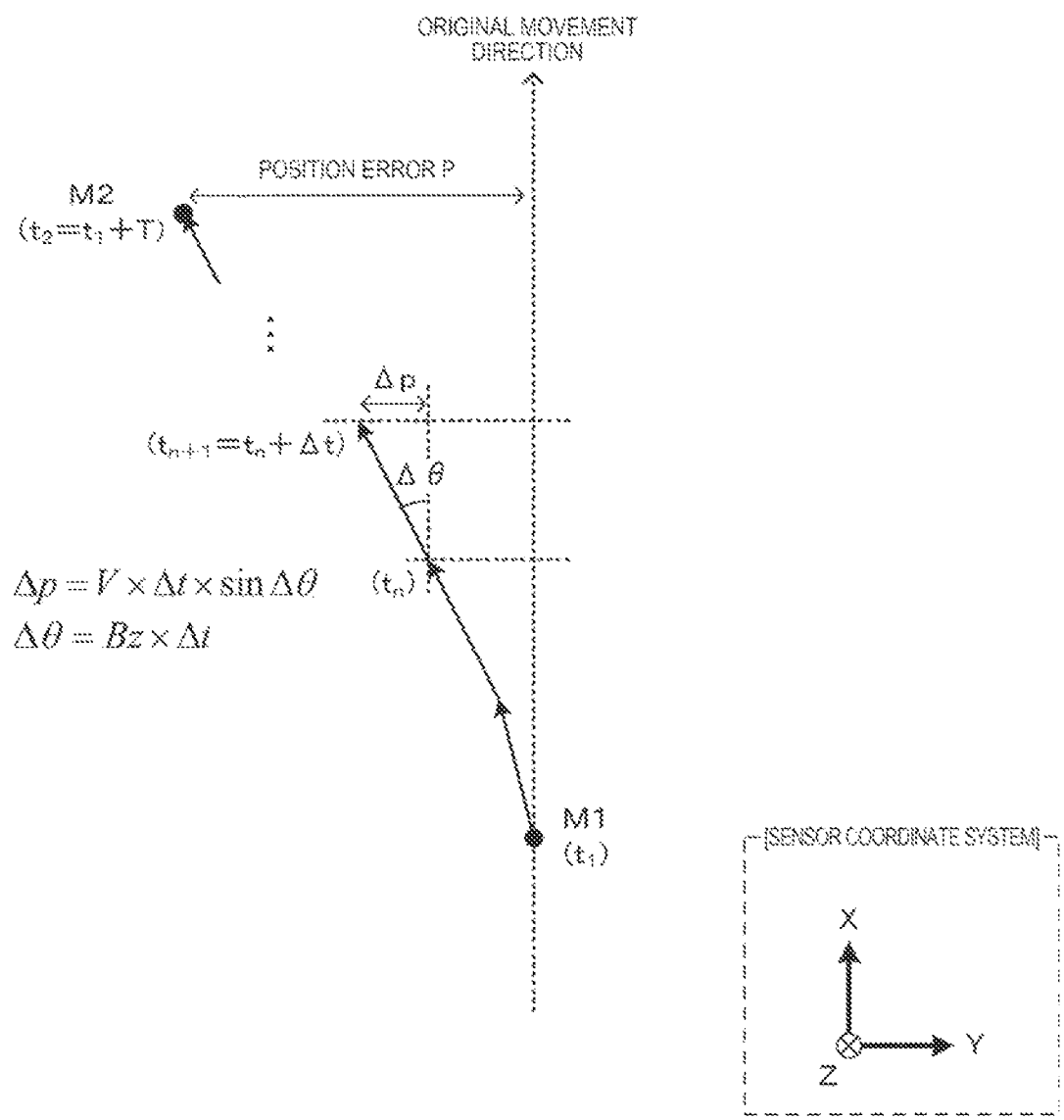
FIG. 4 is an explanatory diagram of calculation of a position by an inertial navigation computation of the first embodiment.

FIG. 4 is a diagram for explaining calculation of the position by the inertial navigation computation. It is assumed that the vehicle 1100 linearly moves on a substantially horizontal plane at the moving speed V [m/sec]. Further, the bias error of the Z-axis angular velocity sensor 116 is assumed as Bz [deg/sec]. When the position of the vehicle 1100 is calculated by inertial navigation computation using the measured data of the IMU 100 assuming that the position M1 of the vehicle 1100 at the time $t_1$ is known, since the error of the yaw angle which is the attitude increases with the lapse of time, a trajectory of the position draws a locus gradually moving away from the original moving direction which is the linear direction.

In the inertial navigation computation, it is repeated to obtain the yaw angle from the output signal of the Z-axis angular velocity sensor 116 and calculate the position at the next time t assuming that the vehicle has moved at the moving speed V in the direction of the yaw angle are repeated, at each predetermined minute time Δt. The error Δθ[deg] of the yaw angle occurring during the minute time Δt[second] is expressed by the following expression (2).

$$\Delta\theta = Bz \times \Delta t \tag{2}$$

Then, the position error Δp [m] occurring during the minute time Δt [second] is expressed by the following expression (3).

$$\Delta p = V \times T \times \sin \Delta\theta \tag{3}$$

By integrating the position error Δp from the time $t_1$ to the time $t_2$ (=$t_1$+T) after T seconds with respect to time, the position error P[m] that occurs when moving at the moving speed V[m/sec] during the T seconds from the time $t_1$ to the time $t_2$ is obtained by the following expression (4).

$$P = (V/Bz) \times (1 - \cos(Bz \times T)) \tag{4}$$

As described above, the position calculated by the inertial navigation computation can be corrected by using high accurate GPS positioning information output at each positioning interval T from the GPS module 1002. For that reason, it is sufficient that the position error P occurring during the positioning interval T is at least equal to or less than the predetermined allowable maximum position error Pp. The extent of the allowable maximum position error Pp is determined depending on the purpose of use of the vehicle 1100 and the like. Accordingly, the expression (1a) expressing that the position error P calculated by the expression (4) becomes equal to or less than the predetermined allowable maximum position error Pp is a conditional expression to be satisfied by the bias error Bz of the Z-axis angular velocity sensor 116.

Since the bias error Bx of the X-axis angular velocity sensor 112 and the bias error By of the Y-axis angular velocity sensor 114 can be supplemented by the output signal of the acceleration sensor 120 as described above, accuracy of the bias errors Bx and By may be lower than that of the bias error Bz of the Z-axis angular velocity sensor 116. However, since it is undesirable to have an accuracy as low as to detect that the vehicle 1100 in the horizontal state has rolled over, the bias error Bx of the X-axis angular velocity sensor 112 and the bias error By of the Y-axis angular velocity sensor 114 are conditional on satisfying the following expressions (5a) and (5b).

$$T \times Bx < 90 \text{ [degrees]} \quad (5a)$$

$$T \times By < 90 \text{ [degrees]} \quad (5b)$$

Subsequently, consider specific examples of the bias errors Bx, By, and Bz of the angular velocity sensor 110.

Specifically, as a vehicle, assume an agricultural machine that is controlled to be automatically operated, a movable construction machine, and a transportation work vehicle. In recent years, in order to realize automatic operation control in the agricultural machine, the construction machine, and the like, accuracy of centimeter order is required for the measurement position of the positioning system 1000 equipped on the agricultural machine, the construction machine, and the like. That is, in a case of automatic operation control of the agricultural machine such as a rice planting machine, the construction machine such as a shovel car, the transportation work vehicle such as a forklift truck, and the like, although the moving speed is a low speed of about 15 km/h or less, the accuracy of the position is very important from the purpose of its use. The bias errors Bx, By, and Bz of the angular velocity sensor 110 necessary for responding to this positional accuracy requirement are obtained. That is, the error of the yaw angle which is the attitude and a position error caused by the error of this yaw angle were calculated assuming that the moving speed V of the vehicle 1100 is 15 [km/h], which is the general moving speed of agricultural machine, the construction machine, and the transportation work vehicle. For calculation, seven types of Z-axis angular velocity sensors 116 having bias errors Bz of 0 [deg/hour], 360 [deg/hour], 570 [deg/hour], 760 [deg/hour], 890 [deg/hour], 1010 [deg/hour], and 1140 [deg/hour], respectively, were assumed.

Figure 5:
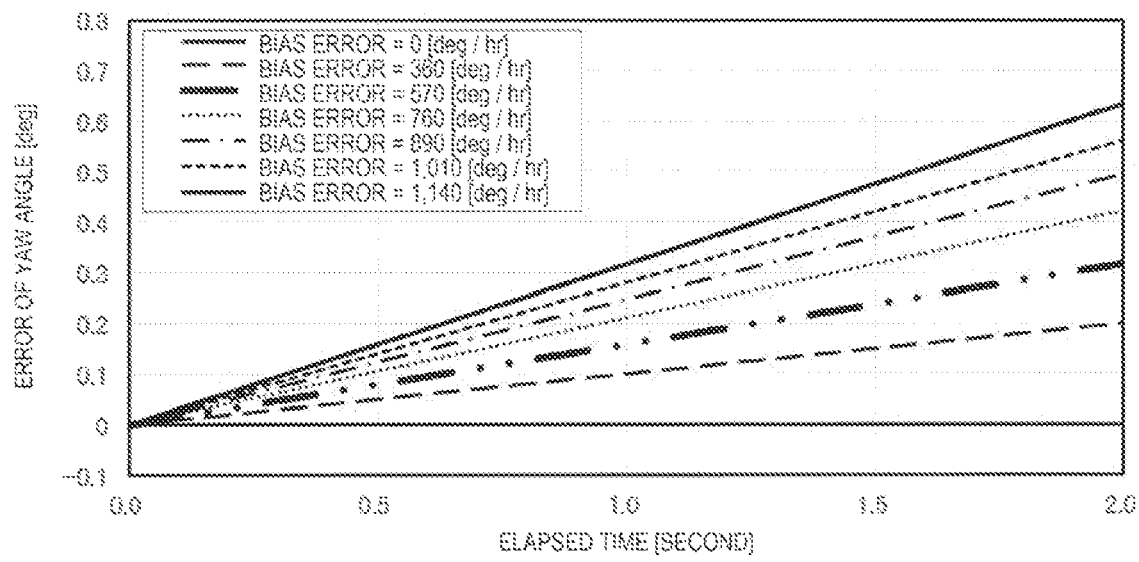
FIG. 5 is a graph illustrating an example of a relationship between elapsed time and an error of yaw angle of the first embodiment.
Figure 6:
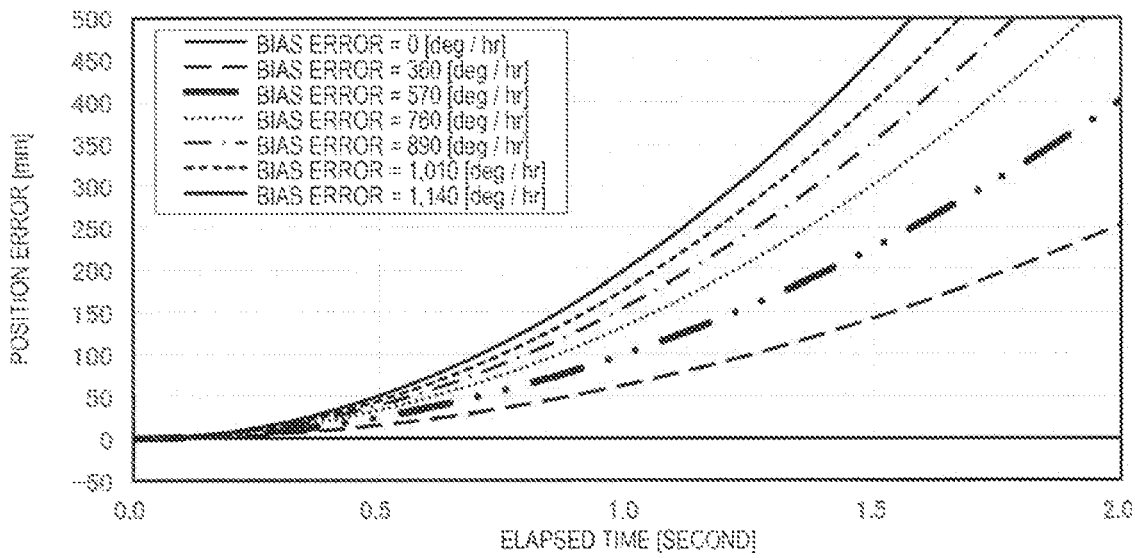
FIG. 6 is a graph illustrating an example of a relationship between elapsed time and a position error of the first embodiment.

FIG. 5 is a graph illustrating a relationship between the elapsed time and an error of the yaw angle which is the attitude, and FIG. 6 is a graph illustrating a relationship between the elapsed time and a position error. The position error is obtained from the bias error Bz and the moving speed V according to the expression (4). As illustrated in FIG. 5, since the yaw angle is obtained by integrating the output signal of the Z-axis angular velocity sensor 116 with respect to time, the error of the yaw angle increases in proportion to the elapsed time. Also, even if the elapsed time is the same, the larger the bias error Bz, the larger the error of the yaw angle. Accordingly, as illustrated in FIG. 6, the position error also increases as the elapsed time increases. Even if the elapsed time is the same, as the bias error Bz increases, the error of the yaw angle increases, so that the position error also increases.

Generally, the positioning interval T of the GPS module 1002 is 1 [second]. This positioning interval T is a time interval during which GPS positioning information is not output and corresponds to a period of time during which position correction based on GPS positioning information cannot be performed. In order to allow the position accuracy to satisfy accuracy of centimeter order, it is necessary to set the position error during the positioning interval T to 10 cm or less. Accordingly, according to FIG. 6, in order to make the elapsed time equal to or less than 100 mm (=10 cm) at the time point of 1 [second], which is the positioning interval T of the GPS module 1002, the bias error Bz of the Z-axis angular velocity sensor 116 needs to be 570 [deg/hour] or less.

There is no problem even if the bias error Bx of the X-axis angular velocity sensor 112 and the bias error By of the Y-axis angular velocity sensor 114 exceed 1140 [deg/hour] greater than the 570 [deg/hour]. That is, the bias error Bz of the Z-axis angular velocity sensor 116 needs to be smaller than the bias error Bx of the X-axis angular velocity sensor 112 and the bias error By of the Y-axis angular velocity sensor 114. Specifically, the bias error Bz is sufficient to satisfy the following expressions (6a) to (6c)).

$$Bx > 1140 \text{ [deg/hour]} \quad (6a)$$

$$By > 1140 \text{ [deg/hour]} \quad (6b)$$

$$Bz < 570 \text{ [deg/hour]} \quad (6c)$$

According to this, it can be said that it is desirable that the bias error Bz is desirably 50% or less ($0.5 \approx 570/1140$) of the bias errors Bx and By as illustrated in the following expressions (7a) and (7b).

$$Bz < 0.5 \times Bx \quad (7a)$$

$$Bz < 0.5 \times By \quad (7b)$$

(B) Bias Stability (Allan Variance)

Next, it is assumed that the vehicle equipped with the positioning system 1000 is, for example, an agricultural machine or a construction machine of which operation is automatically controlled. It is assumed that the agricultural machine and the construction machine are used in an environment where GPS satellite signals cannot be received due to multipath and the like by surrounding buildings, forests, and the like. Matters that that accuracy related to long-term stability of the required measuring position can be secured even in such an environment will be described below.

Specifically, the X-axis angular velocity sensor 112, the Y-axis angular velocity sensor 114, and the Z-axis angular velocity sensor 116 are configured so that the Allan variances of BISx[deg/hour], BISy[deg/hour], and BISz[deg/hour] satisfy the following expressions (8a) and (8b) when the BISx[deg/hour] is the Allan variance of an output signal of the X-axis angular velocity sensor 112, the BISy[deg/hour] is the Allan variance of an output signal of the Y-axis angular velocity sensor 114, and the BISz[deg/hour] is the Allan variance of the output signal of the Z-axis of the Z-axis angular velocity sensor 116.

$$BISz < 0.5 \times BISx \quad (8a)$$

$$BISz < 0.5 \times BISy \quad (8b)$$

Since 1/f noise (fluctuation) that determines bias stability is not modeled in estimation means of the bias error B such as the Kalman filter, that is, the 1/f noise is not eliminated, this causes an increase in an attitude error due to accumulation of bias errors over a long period of time.

Figure 7:
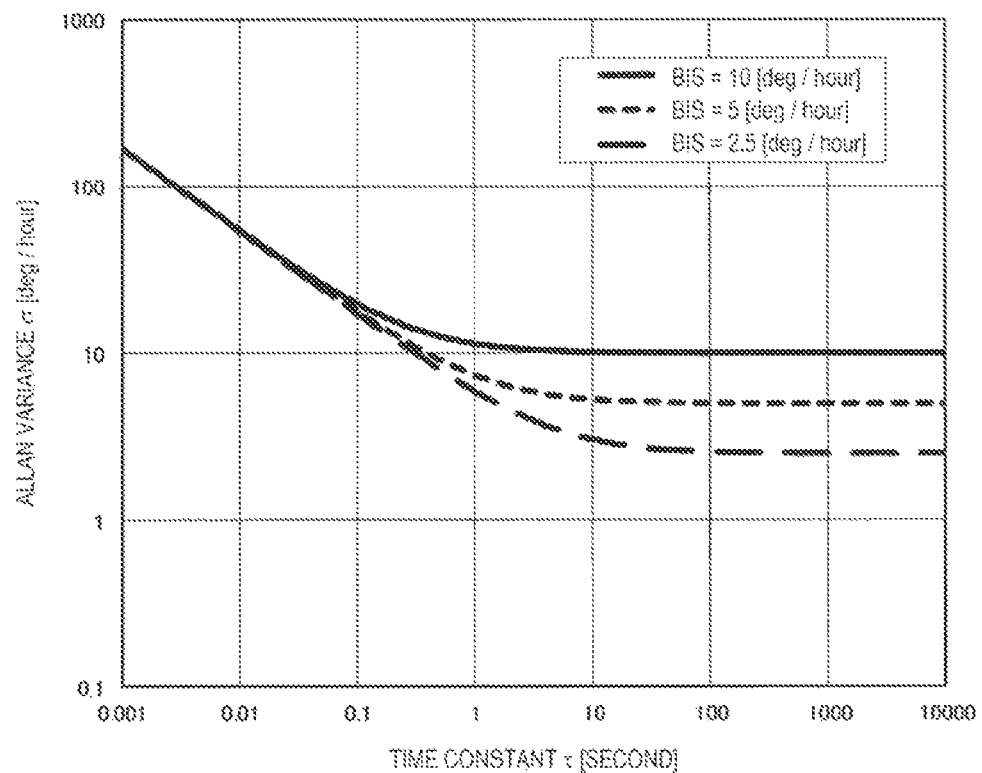
FIG. 7 is a graph illustrating an example of the Allan variance of the first embodiment.

FIG. 7 is a graph illustrating an example of an Allan variance curve, and illustrates three types of angular velocity sensors having different characteristics. In general, the Allan variance 6 draws a curve in which it decreases as the time constant (averaging time) τ increases, and then converges to a fixed value. This fixed value is taken as the Allan variance BIS representing bias stability of the first embodiment. In the example of FIG. 7, the Allan variance BIS is exemplified for three types of angular velocity sensors with the Allan variance BIS being 2.5 [deg/hour], 5 [deg/hour], and 10 [deg/hour].

Subsequently, consider specific examples of Allan variance BISx, BISy, and BISz of the angular velocity sensor 110. Similarly to the consideration of the specific example of the bias error Bz, assume the agricultural machine, the construction machine, and the transportation work vehicle of which operations are automatically controlled as the vehicle. Then, the error of the yaw angle which is the attitude and the position error is calculated assuming that the moving speed V of the vehicle is 15 [km/h], which is a high speed when the agricultural machine, the construction machine, and the transportation work vehicle perform a work by automatic operation. For the calculation, three types of Z-axis angular velocity sensors 116 with the Allan variance BISz being 2.5 [deg/hour], 5 [deg/hour], and 10 [deg/hour] were assumed.

Figure 8:
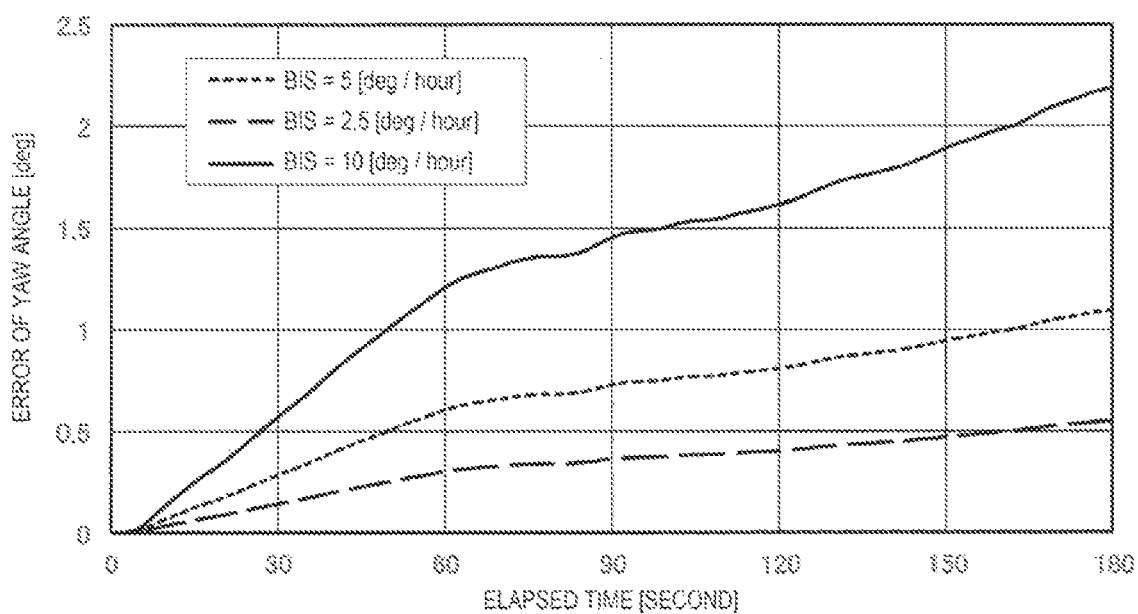
FIG. 8 is a graph illustrating an example of a relationship between elapsed time and an error of yaw angle of the first embodiment.
Figure 9:
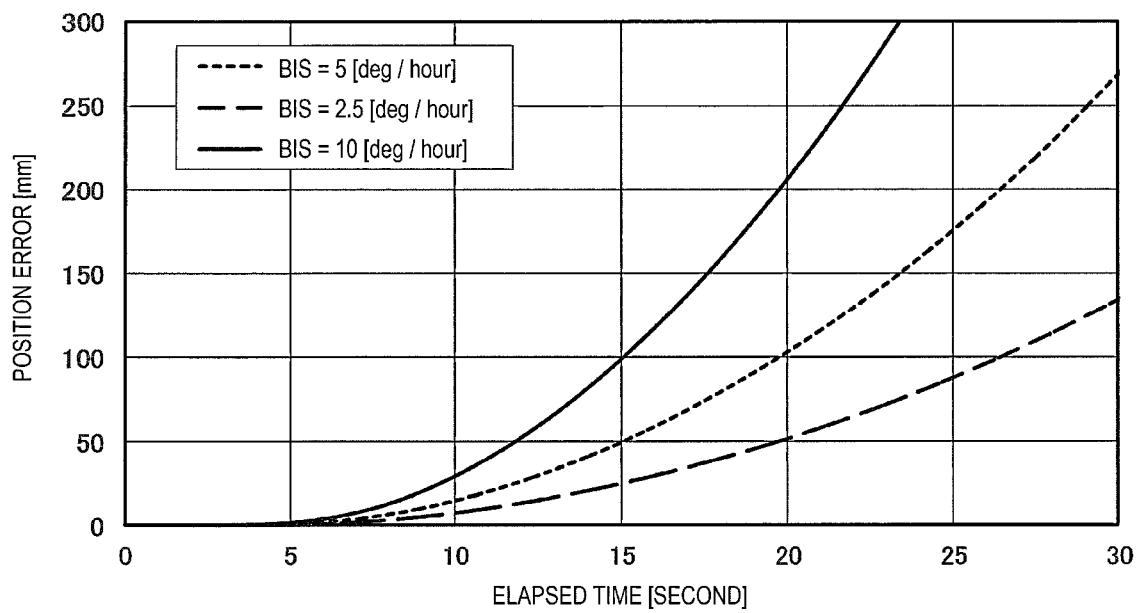
FIG. 9 is a graph illustrating an example of a relationship between elapsed time and a position error of the first embodiment.

FIG. 8 is a graph illustrating a relationship between the elapsed time and the error of the yaw angle which is the attitude, and FIG. 9 is a graph illustrating a relationship between the elapsed time and the position error. As illustrated in FIG. 8, the error of the yaw angle increases as the elapsed time increases. Also, even if the elapsed time is the same, the larger the Allan variance BISz is, the larger the error of the yaw angle becomes. Accordingly, as illustrated in FIG. 9, the position error also increases as the elapsed time increases, and even if the elapsed time is the same, the larger the Allan variance BISz is, the larger the position error becomes.

The position error due to Allan variance becomes a problem in a case where the bias error B of the angular velocity sensor 110 is accumulated over a relatively long period of time. Matters that the assumed agricultural machine and construction machine are used in an environment in which GPS satellite signals due to multipath or the like by surrounding buildings, forests or the like cannot be received or reception signals are weak signals, and matters that the work transportation vehicle is used indoors where it cannot receive the GPS satellite signal are assumed. Therefore, consider securing a position error of approximately 15 [cm] that can be determined as an excessive error for automatic operation in a case where a GPS satellite signal is not received for 30 seconds.

According to FIG. 9, in order to make the position error 15 cm (=150 mm) or less at the time when the elapsed time is 30 seconds, the Allan variance BISz of the Z-axis angular velocity sensor 116 needs to be 2.5 [deg/hour]. Then, the Allan variance BISx of the X-axis angular velocity sensor 112 and the Allan variance BISy of the Y-axis angular velocity sensor 114 do not cause a problem even if the Allan variances BISx and BISy are 5 [deg/hour] or more which is larger than 2.5 [deg/hour]. That is, the Allan variance BISz of the Z-axis angular velocity sensor 116 needs to be smaller than the Allan variance BISx of the X-axis angular velocity sensor 112 and BISy of the Y-axis angular velocity sensor 114. Specifically, the following expressions (9a) to (9c) may be satisfied.

$$BISx \geq 5 \text{ [deg/hour]} \quad (9a)$$

$$BISy \geq 5 \text{ [deg/hour]} \quad (9b)$$

$$BISz \leq 2.5 \text{ [deg/hour]} \quad (9c)$$

According to this, as illustrated in the expressions (8a) and (8b) described above, it can be said that the Allan variance BISz is desirably 50% (0.5=2.5/5) or less of the Allan variances BISx and BISy.

Operational Effect

As such, in the first embodiment, the Z-axis angular velocity sensor 116 is configured such that the bias error B and the Allan variance BIS are smaller than those of the X-axis angular velocity sensor 112 and the Y-axis angular velocity sensor 114. That is, the Z-axis angular velocity sensor 116 is configured to have "higher accuracy" than the X-axis angular velocity sensor 112 and the Y-axis angular velocity sensor 114.

Specifically, the Z-axis angular velocity sensor 116 has the bias error Bz which is smaller than the bias errors Bx and By of the X-axis angular velocity sensor 112 and the Y-axis angular velocity sensor 114 and is a value that makes the position error during the movement of the vehicle mounted with the positioning system 1000 for T[seconds], which is the positioning interval of the GPS module 1002, equal to or less than the predetermined allowable maximum position error Pp. With this configuration, the position error due to the positioning system 1000 can be made to be equal to or less than the allowable maximum position error Pp. The Allan variance BISz of the Z-axis angular velocity sensor 116 is smaller than the Allan variances BISxz and BISy of the X-axis angular velocity sensor 112 and the Y-axis angular velocity sensor 114. With this configuration, even if the GPS satellite signal cannot be received for a predetermined period of time, it is possible to set the position error due to the positioning system 1000 within the predetermined allowable range.

Second Embodiment

Next, a second embodiment will be described. Hereinafter, differences from the first embodiment will be mainly described, and the same reference numerals are given to the same constituent elements as in the first embodiment, and redundant description thereof will be omitted. The second embodiment is an embodiment of a sensor unit that is the IMU 100 in the first embodiment.

Outline of Sensor Unit

Figure 10:
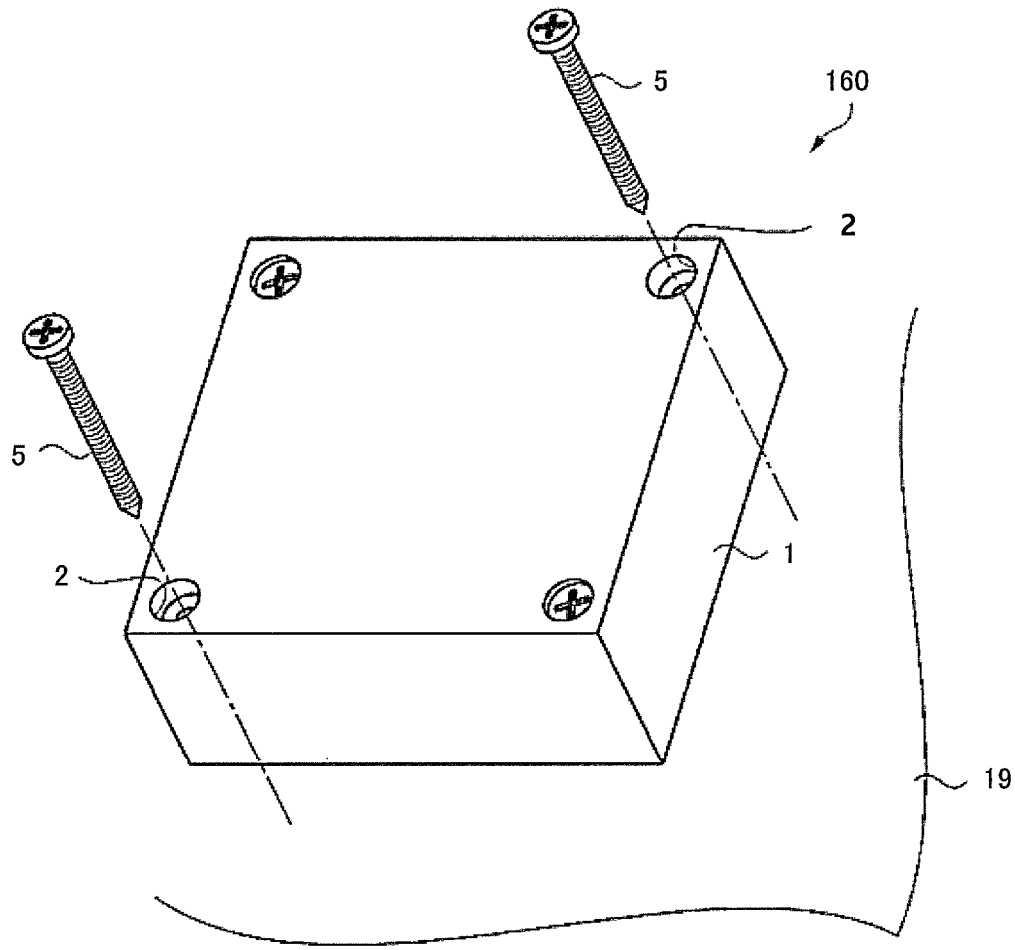
FIG. 10 is a perspective view of a sensor unit of a second embodiment.
Figure 11:
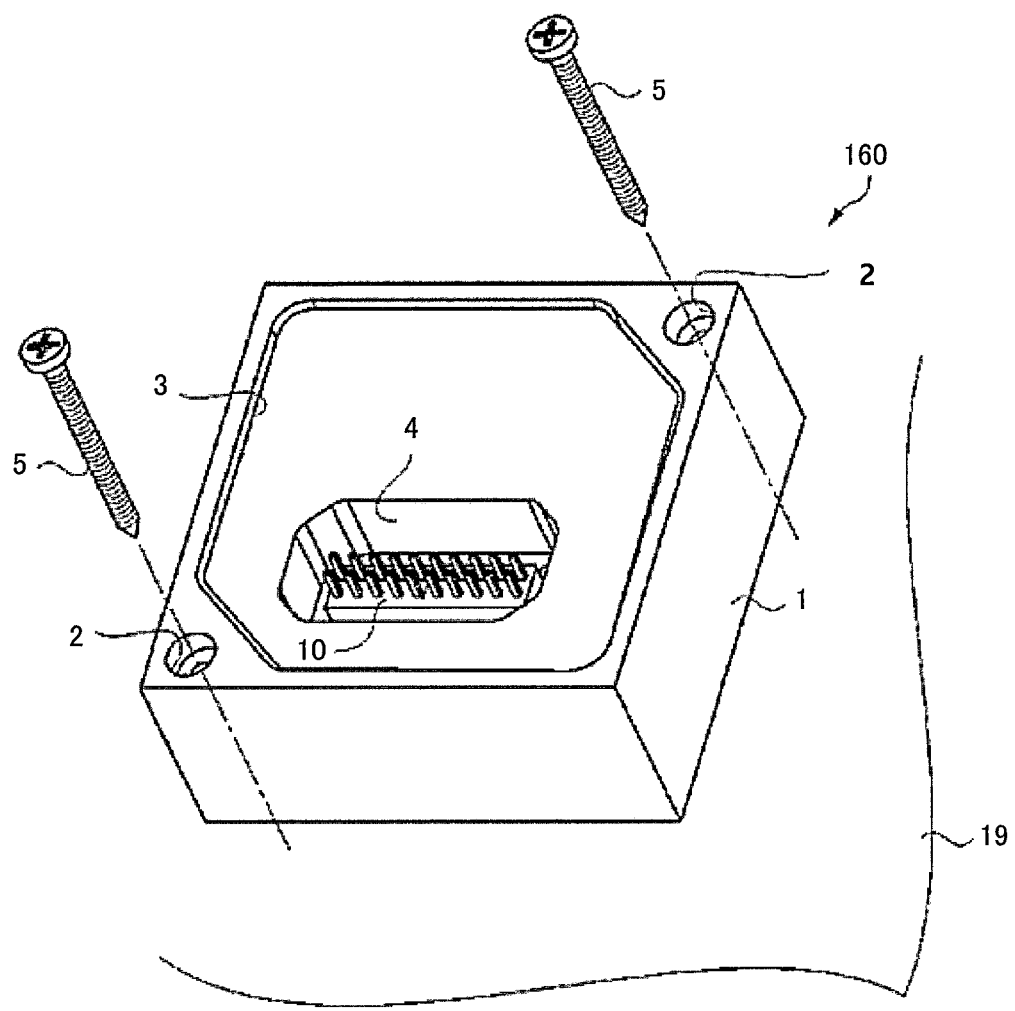
FIG. 11 is another perspective view of the sensor unit of the second embodiment.

FIG. 10 is a perspective view for explaining a state of fixing a sensor unit 160 to a mounted surface 19 according to a second embodiment. FIG. 11 is a perspective view of the sensor unit 160 when viewed from the mounted surface 19 side of FIG. 10. First, an outline of the sensor unit 160 according to the second embodiment will be described.

In FIGS. 10 and 11, the sensor unit 160 is an inertial measurement unit (IMU) which is an inertia measurement device and detects the attitude and behavior (inertial momentum) of a moving body (mounted device) such as a car or a moving body such as a robot. The sensor unit 160 includes a plurality of inertial sensors, for example, a triaxial acceleration sensor 120 which measures acceleration acting in directions of three axes orthogonal to each other and a three-axis angular velocity sensor 110 which measures an angular velocity acting around each axis.

The sensor unit 160 is a rectangular parallelepiped having a planar shape of a rectangle, and includes screw holes 2 as fixing portions formed in the vicinity of two apexes positioned in the diagonal direction of the rectangle. The sensor unit 160 is used in a state of being fixed on the mounted surface 19 of a mounted object (device) such as an automobile through two screws 5 in the two screw holes 2. The shape described above is an example, and it is possible to reduce the size of the sensor unit to a size that can be mounted on, for example, various wearable electronic devices, smart phones, digital cameras, and the like by selection of parts and design change.

As illustrated in FIG. 11, an opening 4 is formed on the surface of the sensor unit 160 when viewed from the mounted surface side. A plug type (male) connector 10 is disposed inside (inside) the opening 4. In the connector 10, a plurality of pins are arranged side by side. A connector (not illustrated) of a socket type (female) is connected to the connector 10 from the mounted device, and transmission and reception of electrical signals such as power supply to the sensor unit 160 and output of detection data detected by the sensor unit 160 are performed between the sensor unit 160 and the mounted device.

Configuration of Sensor Unit

Figure 12:
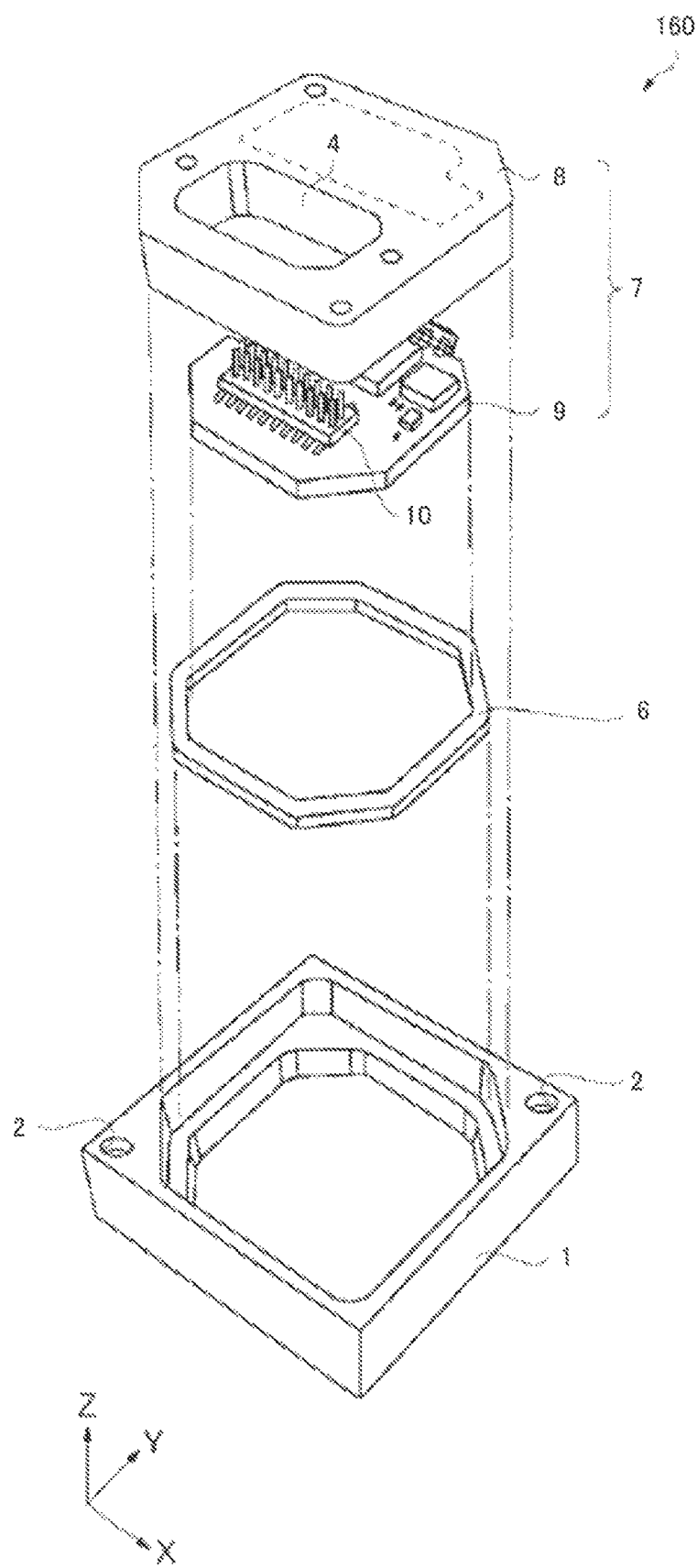
FIG. 12 is an exploded perspective view of the sensor unit of the second embodiment.

FIG. 12 is an exploded perspective view of the sensor unit 160 when viewed in the same direction as FIG. 11. Subsequently, a configuration of the sensor unit 160 will be described in detail with reference mainly to FIG. 12 while appropriately combining FIG. 10 and FIG. 11. As illustrated in FIG. 12, the sensor unit 160 is configured with an outer case 1, an annular cushioning material 6, a sensor module 7, and the like. In other words, a configuration in which the sensor module 7 is mounted on the inside 3 of the outer case 1 with an annular cushioning material 6 interposed therebetween is adopted. The sensor module 7 is configured with an inner case 8 and a circuit board 9. In order to make the description easier to understand, although the outer case and the inner case are used as the part names, the outer case and the inner case may be referred to as a first case and a second case.

The outer case 1 is a pedestal from which aluminum is cut out into a box shape. The material thereof is not limited to aluminum, but other metals such as zinc and stainless steel, a resin, a composite material of a metal and a resin, or the like may be used. The outer shape of the outer case 1 is a rectangular parallelepiped having a planar shape of a rectangle similarly to the overall shape of the sensor unit 160 described above, and the screw holes 2 are respectively formed in the vicinity of two apexes positioned in the diagonal direction of the square. An example in which the outer shape of the outer case 1 is a rectangular parallelepiped having a planar shape of a rectangle and a box shape without a lid is described, but is not limited thereto. The planar shape of the outer shape of the outer case 1 may be a polygon such as a hexagon or an octagon, and corners of the apex portion of the polygon may be chamfered, each side may be curved, or the outer shape may be circular.

Configuration of Circuit Board

FIG. 13 is a perspective view of the circuit board 9. The configuration of the circuit board 9 on which a plurality of inertial sensors are mounted will be described below. The circuit board 9 is a multilayer substrate having a plurality of through-holes formed therein, and a glass epoxy substrate is used. The invention is not limited to the glass epoxy substrate, but may be a rigid substrate capable of mounting a plurality of inertial sensors, electronic components, connectors and the like. For example, a composite substrate or a ceramic substrate may be used. On the surface of the circuit board 9 (surface on the side of the inner case 8), a connector 10, a multi-axis inertial sensor 17 in which three-axis angular velocity sensors and three-axis acceleration sensors are accommodated, and a high-accuracy angular velocity sensor 18, and the like are installed. The connector 10 is a plug type (male) connector, and includes two rows of connection terminals in which a plurality of pins are disposed at an equal pitch. The number of terminals may be appropriately changed according to design specifications.

The high-accuracy angular velocity sensor 18 is a gyro sensor for detecting an angular velocity of one axis in the Z-axis direction which is the direction of gravity. In the vehicle on which the sensor unit 160 is mounted, when a preset straight advancing direction of the vehicle is set as an X-axis, a gravitational direction of the vehicle is set as a Z-axis, and an axis orthogonal to the X-axis and the Z-axis set as a Y-axis, the sensor unit 160 functions as a Z-axis angular velocity sensor which detects an angular velocity around the Z-axis and outputs an angular velocity signal around the Z-axis, and calculates the yaw (YAW) angle around the Z-axis of the vehicle based on the angular velocity signal around the Z-axis.

As a preferable example of the high-accuracy angular velocity sensor 18, a resonance frequency change type crystal gyro sensor in which quartz crystal is used as a material and which measures an angular velocity from a Coriolis force applied to a vibrating object is used. Further, the high-accuracy angular velocity sensor 18 is not limited to the quartz crystal-crystal gyro sensor, but may be a multi-gyro sensor in which a plurality of electrostatic capacitance change type silicon-micro electro mechanical systems (Si-MEMS) angular velocity sensors are connected in a multi-connected manner.

The multi-axial inertial sensor 17 includes an X-axis angular velocity sensor 112 which detects an angular velocity around the X-axis and outputs a first angular velocity signal, a Y-axis angular velocity sensor 114 which detects an angular velocity around the Y-axis and outputs a second angular velocity signal, a Z-axis angular velocity sensor 116 which detects an angular velocity around the Z-axis and outputs a third angular velocity signal, an X-axis acceleration sensor 122 which detects acceleration in the X-axis direction and outputs a first acceleration signal, a Y-axis acceleration sensor 124 which detects acceleration in the Y-axis direction and outputs a second acceleration signal, and a Z-axis acceleration sensor 126 which detects acceleration in the Z-axis direction, and outputs a third acceleration signal. Here, since the high-accuracy angular velocity sensor 18 installed on the circuit board 9 by itself functions as the Z-axis angular velocity sensor 116 which detects the angular velocity around the Z-axis and outputs the angular velocity signal around the Z-axis, the Z-axis angular velocity sensor is not necessarily mounted, for the multi-axis inertial sensor 17. In the case where the Z-axis angular velocity sensor is mounted on the multi-axis inertial sensor 17, the high-accuracy angular velocity sensor 18 and the Z-axis angular velocity sensor may share the functional role as appropriate according to design specifications and the like.

As the acceleration sensor 120 mounted on the multi-axis inertial sensor 17, an electrostatic capacitance change type Si-MEMS acceleration sensor (acceleration sensor) capable of measuring (detecting) acceleration in the X-axis direction, the Y-axis direction, and the Z-axis direction with one device (one chip) is used. That is, the acceleration sensor 120 mounted on the multi-axis inertial sensor 17 includes the X-axis acceleration sensor 122 which detects acceleration in the X-axis direction and outputs the first acceleration signal, and the Y-axis acceleration sensor 124 which detects acceleration in the Y-axis direction and outputs the second acceleration signal, and the Z-axis acceleration sensor 126 which detects acceleration in the Z-axis direction and outputs the third acceleration signal.

The acceleration sensor 120 is not limited to this capacitance change type Si-MEMS acceleration sensor, and it suffices if the acceleration sensor 120 is a sensor capable of detecting acceleration. For example, the acceleration sensor 120 may be a frequency change type quartz crystal acceleration sensor, a piezo-resistive type acceleration sensor, or a heat detection type acceleration sensor, or the acceleration sensor 120 may have a configuration in which one acceleration sensor is provided for each axis like the high-accuracy angular velocity sensor 18 described above.

A control IC 11 is mounted on the back surface (surface on the outer case 1 side) of the circuit board 9.

The control IC 11 is a micro controller unit (MCU), and incorporates a storing unit including a nonvolatile memory, an A/D converter, and the like and controls each unit of the sensor unit 160. In the storing unit, a program defining the sequence and contents for detecting acceleration and angular velocity, a program for digitizing detected data to be incorporated into packet data, accompanying data, and the like are stored. On the circuit board 9, a plurality of other electronic components are mounted.

Third Embodiment

Next, a third embodiment will be described. Hereinafter, differences from the first and second embodiments will be mainly described, and the same reference numerals are given to the same constituent elements as those in the first and second embodiments, and redundant description will be omitted. The third embodiment is an embodiment of a quartz crystal gyro sensor element which is the high-accuracy angular velocity sensor 18 in the second embodiment.
Configuration of High Accuracy Angular Velocity Sensor In the high-accuracy angular velocity sensor 18 of the third embodiment, by adopting quartz crystal ($SiO_2$) as the material, a high Q value is obtained from high crystallinity of the quartz crystal and characteristics in which impedance characteristic and frequency temperature characteristic are stable over a wide temperature range can be exhibited. In general, the Q value of the quartz crystal is approximately 30,000, whereas the Q value of the Si-MEMS constituting the capacitance type angular velocity sensor element is approximately 5,000, which is extremely low and is one-sixth of the Q value of quartz. Since the Q value of quartz crystal is much higher than the Q value of Si-MEMS, in the high-accuracy angular velocity sensor 18 made of quartz crystal, vibration characteristics in which the amplitude is large even at a drive voltage lower than the drive voltage of Si-MEMS and noise is small are obtained and thus, excellent characteristics having a large S/N ratio compared with that of the Si-MEMS are obtained.

Figure 14:
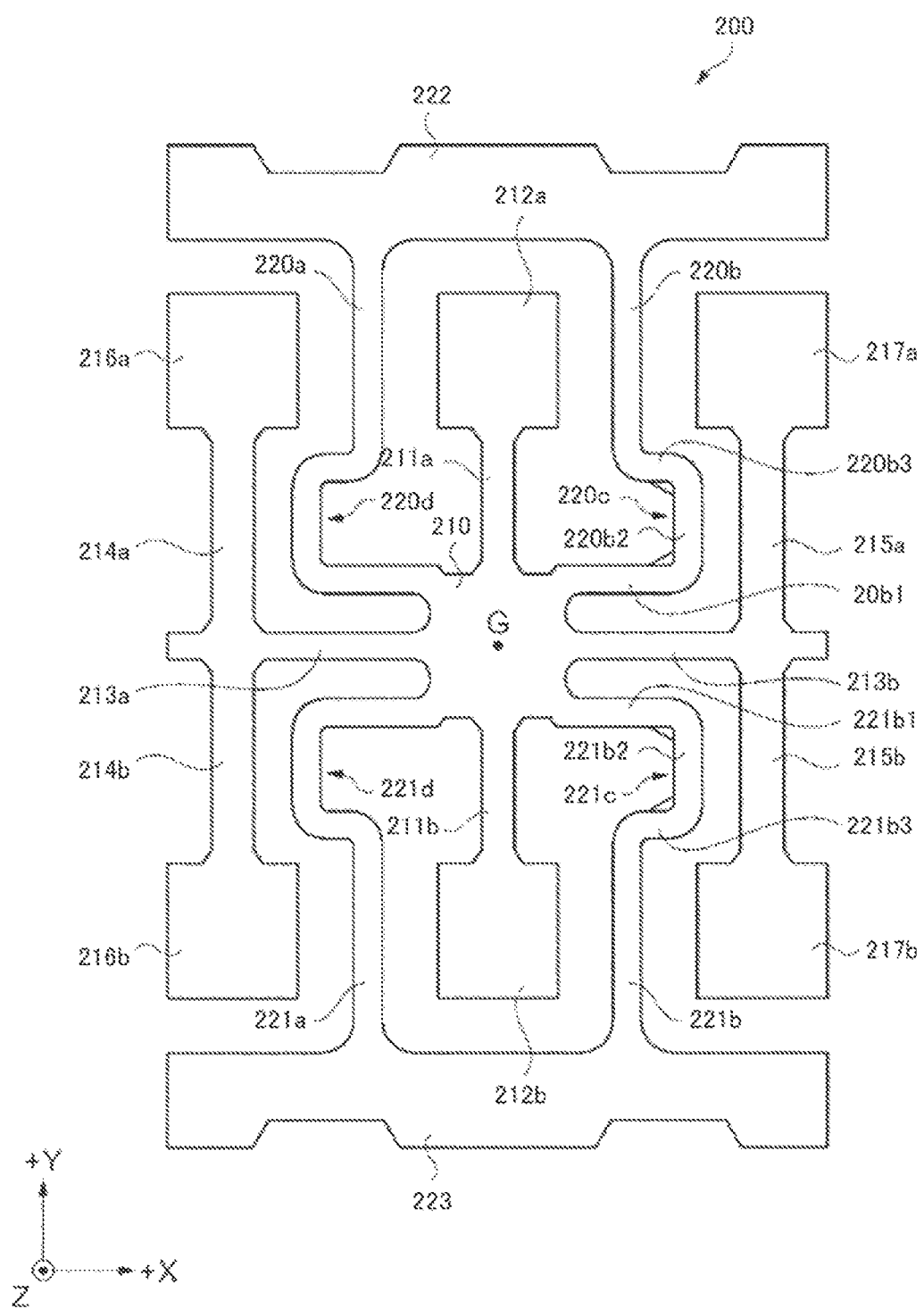
FIG. 14 is a schematic plan view of a quartz crystal gyro sensor element of a third embodiment.

FIG. 14 is a schematic plan view illustrating a quartz crystal gyro sensor element 200 of the third embodiment.

The quartz crystal gyro sensor element 200 is formed using quartz crystal, which is a piezoelectric material, as a base material. The quartz crystal has an X-axis called an electric axis, a Y-axis called a mechanical axis, and a Z-axis called an optical axis. The quartz crystal gyro sensor element 200 is cut along a plane defined by the X-axis and Y-axis orthogonal to the quartz crystal axis and processed into a flat plate shape, and has a predetermined thickness in the Z-axis direction orthogonal to the plane. The predetermined thickness is appropriately set depending on an oscillation frequency (resonance frequency), external size, workability, and the like.

It should be noted that the X-axis, the Y-axis, and the Z-axis described in the third embodiment indicate the electric axis, the mechanical axis, and the optical axis which are crystal axes of quartz crystal, and have different meanings from the X-axis, the Y-axis, and the Z-axis in the sensor coordinate system which is a three-dimensional orthogonal coordinate system associated with the IMU 100 described in the first embodiment.

Further, the flat plate constituting the quartz crystal gyro sensor element 200 can allow an error of a cutting angle from the quartz crystal to some extent for each of the X-axis, the Y-axis, and the Z-axis. For example, it is possible to use the flat plate which is rotated in a range of 0 degrees to 2 degrees around the X-axis and cut out. This also applies to the Y-axis and the Z-axis. The crystal gyro sensor element 200 is formed by etching (wet etching or dry etching) using the photolithography technique. A plurality of crystal gyro sensor elements 200 can be taken out from one quartz crystal wafer.

As illustrated in FIG. 14, the quartz crystal gyro sensor element 200 has a so-called double T type configuration. The quartz crystal gyro sensor element 200 includes a base portion 210 positioned at the center portion and a pair of detection vibration arms 211a and 211b one of which extending linearly along the Y-axis from the base portion 210 in the plus direction of the Y-axis and the other of which extending linearly along the Y-axis from the base portion 210 in the minus direction of the Y-axis. Further, the quartz crystal gyro sensor element 200 includes a pair of connection arms 213a and 213b one of which extends linearly along the X-axis from the base portion 210 in the plus direction of the X-axis and the other of which extends linearly along the X-axis from the base portion 210 in the minus direction of the X-axis so as to be orthogonal to the detection vibration arms 211a and 211b. Further, the quartz crystal gyro sensor element 200 includes a pair of drive vibration arms 214a and 214b and a pair of drive vibration arms 215a and 215b, and in the pair of drive vibration arms 214a and 214b, one of the drive vibration arms extends linearly along the Y-axis from the tip end side of a connection arms 213a in the plus direction of the Y-axis and the other of the drive vibration arms extends linearly along the Y-axis from the tip end side of the connection arms 213a in the minus direction of the Y-axis so as to be parallel to the detection vibration arm 211a, and in the pair of drive vibration arms 215a and 215b, one of the drive vibration arms extends linearly along the Y-axis from the tip end side of a connection arm 213b in the plus direction of the Y-axis and the other of the drive vibration arms extends linearly along the Y-axis from the tip end side of the connection arm 213b in the minus direction of the Y-axis so as to be parallel to the detection vibration arm 211b.

In the crystal gyro sensor element 200, detection electrodes (not illustrated) are formed on the detection vibration arms 211a and 211b and drive electrodes (not illustrated) are formed on drive vibration arms 214a, 214b, 215a, and 215b. In the quartz crystal gyro sensor element 200, a detecting vibration system for detecting the angular velocity is configured with the detection vibration arms 211a and 211b and a drive vibration system for driving the quartz crystal gyro sensor element 200 is configured with the connection arms 213a and 213b and the drive vibration arms 214a, 214b, 215a, and 215b.

In addition, weight portions 212a and 212b are formed at the tip end portions of the detection vibration arms 211a and 211b, respectively, and weight portions 216a, 216b, 217a, and 217b are formed at the tip end portions of the drive vibration arms 214a, 214b, 215a, and 215b, respectively. With this configuration, the quartz crystal gyro sensor element 200 is reduced in size and improved in detection sensitivity of angular velocity. The detection vibration arms 211a and 211b include the weight portions 212a and 212b, and the drive vibration arms 214a, 214b, 215a, 215b include weight portions 216a, 216b, 217a, and 217b.

Furthermore, in the crystal gyro sensor element 200, four beams 220a, 220b, 221a, and 221b extend from the base portion 210. The beam 220a extends from the outer edge of the base portion 210 between the connection arm 213a and the detection vibration arm 211a. The beam 220b as a first beam extends from the outer edge of the base portion 210 between the connection arm 213b positioned on the plus side from the base portion 210 in the X-axis direction and the detection vibration arm 211a positioned on the plus side from the base portion 210 in the Y-axis direction. The beam 221a extends from the outer edge of the base portion 210 between the connection arm 213a and the detection vibration arm 211b. The beam 221b as a second beam extends from the outer edge of the base portion 210 between the connection arm 213b positioned on the plus side from the base portion 210 in the X-axis direction and the detection vibration arm 211b positioned on the plus side from the base portion 210 in the Y-axis direction.

The beam 220b is configured to include a first folded portion 220c including a first extending portion 220b1 extending from the base portion 210 along the X-axis in the plus direction of the X-axis, a second extending portion 220b2 extending from the tip end portion of the first extending portion 220b1 along the Y-axis in the plus direction of the Y-axis, and a third extending portion 220b3 extending from the tip end portion of the second extending portion 220b2 along the X-axis in the minus direction of the X-axis.

The beam 221b is configured to include a second folded portion 221c including a fourth extending portion 221b1 extending from the base portion 210 along the X-axis in the plus direction of the X-axis, a fifth extending portion 221b2 extending from the tip end portion of the fourth extending portion 221b1 along the Y-axis in the minus direction of the Y-axis, and a sixth extending portion 221b3 extending from the tip end portion of the fifth extending portion 221b2 along the X-axis in the minus direction of the X-axis.

Each of the beams 220a, 220b, 221a, and 221b of the crystal gyro sensor element 200 is rotationally symmetric with respect to the center of gravity G of the quartz crystal gyro sensor element 200. Specifically, the beam 220a and the beam 221b are in a rotationally symmetrical shape with the center of gravity G of the quartz crystal gyro sensor element 200 as the rotation center, and the beam 221a and the beam 220b are in a rotationally symmetrical shape around the center of gravity G of the quartz crystal gyro sensor element 200. With this configuration, a folded portion 220d which is in a rotationally symmetric shape with respect to the second folded portion 221c is formed in the beam 220a, and a folded portion 221d which is in a rotationally symmetric shape with respect to the first folded portion 220c is formed in the beam 221a.

The tip end portions of the beams 220a and 220b are connected to a support portion 222 positioned on the plus side from the detection vibration arm 211a in the Y-axis direction and extending along the X-axis, and the tip end portions of the beams 221a and 221b are connected to a support portion 223 positioned on the minus side from the detection vibration arm 211b in the Y-axis direction and extending along the X-axis. It is preferable from the viewpoint of balance that the support portion 222 and the support portion 223 are in a rotationally symmetrical shape with the center of gravity G of the quartz crystal gyro sensor element 200 as the rotation center. The quartz crystal gyro sensor element 200 is supported by the support portions 222 and 223 being fixed to a support table or the like which will be described later.

Fourth Embodiment

Next, a fourth embodiment will be described. Hereinafter, differences from the first to third embodiments will be mainly described, and the same reference numerals are given to the same constituent elements as those in the first to third embodiments, and redundant description thereof will be omitted. The fourth embodiment is an embodiment of a physical quantity sensor which is the high-accuracy angular velocity sensor 18 in the second embodiment.

Figure 15:
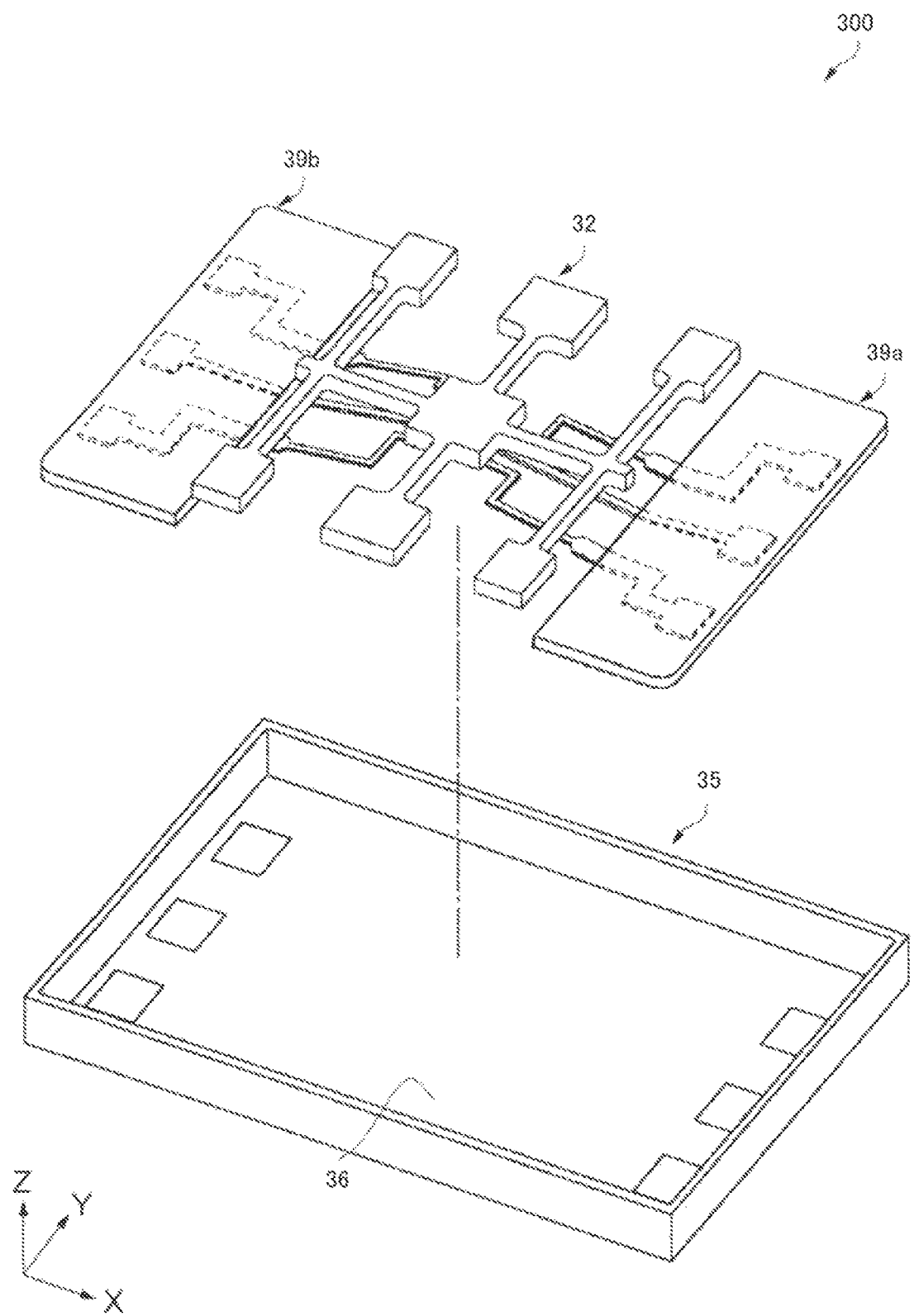
FIG. 15 is a perspective view of a gyro sensor of a fourth embodiment.
Figure 16:
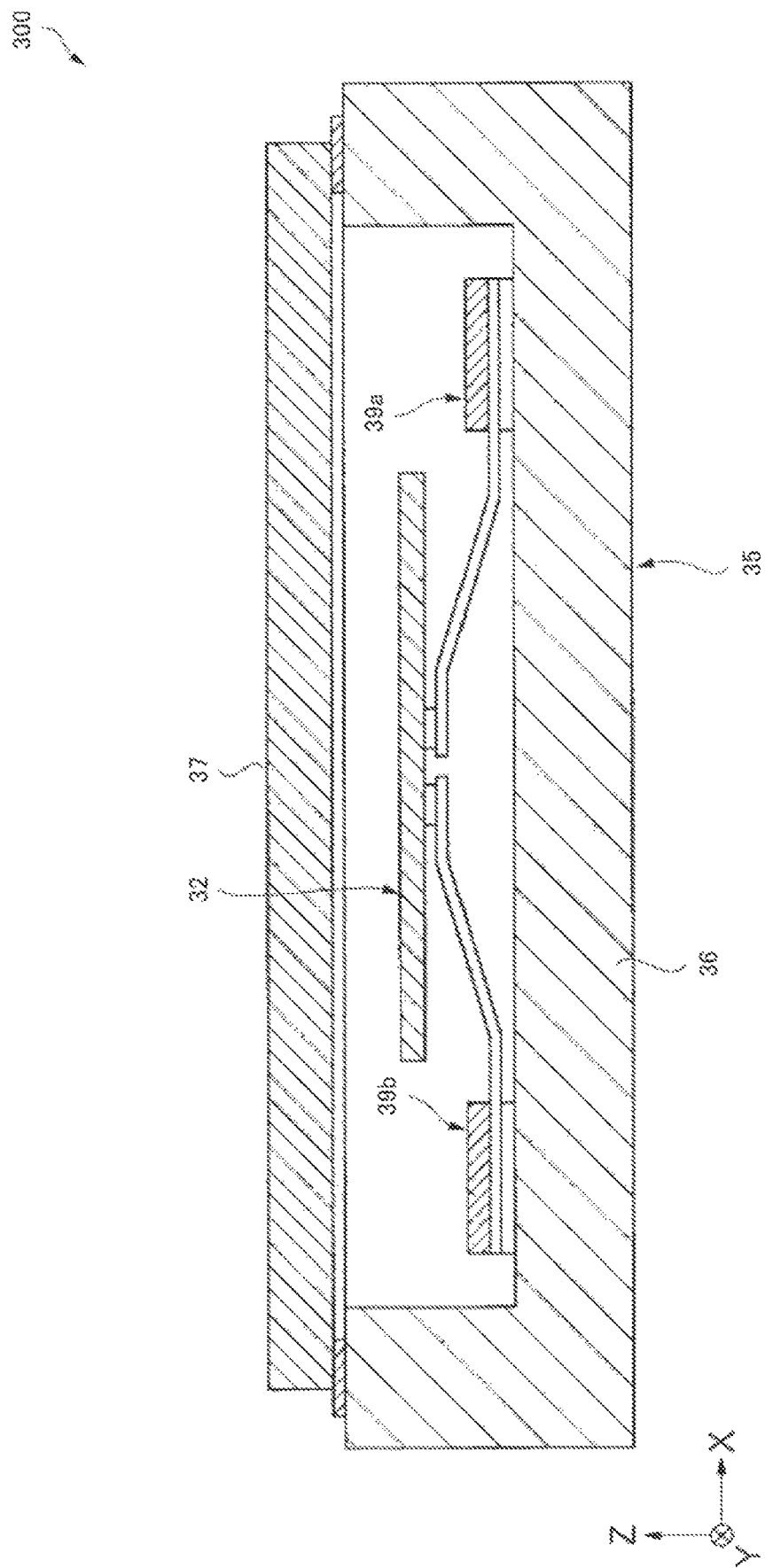
FIG. 16 is a cross-sectional view of the gyro sensor of the fourth embodiment.
Figure 17:
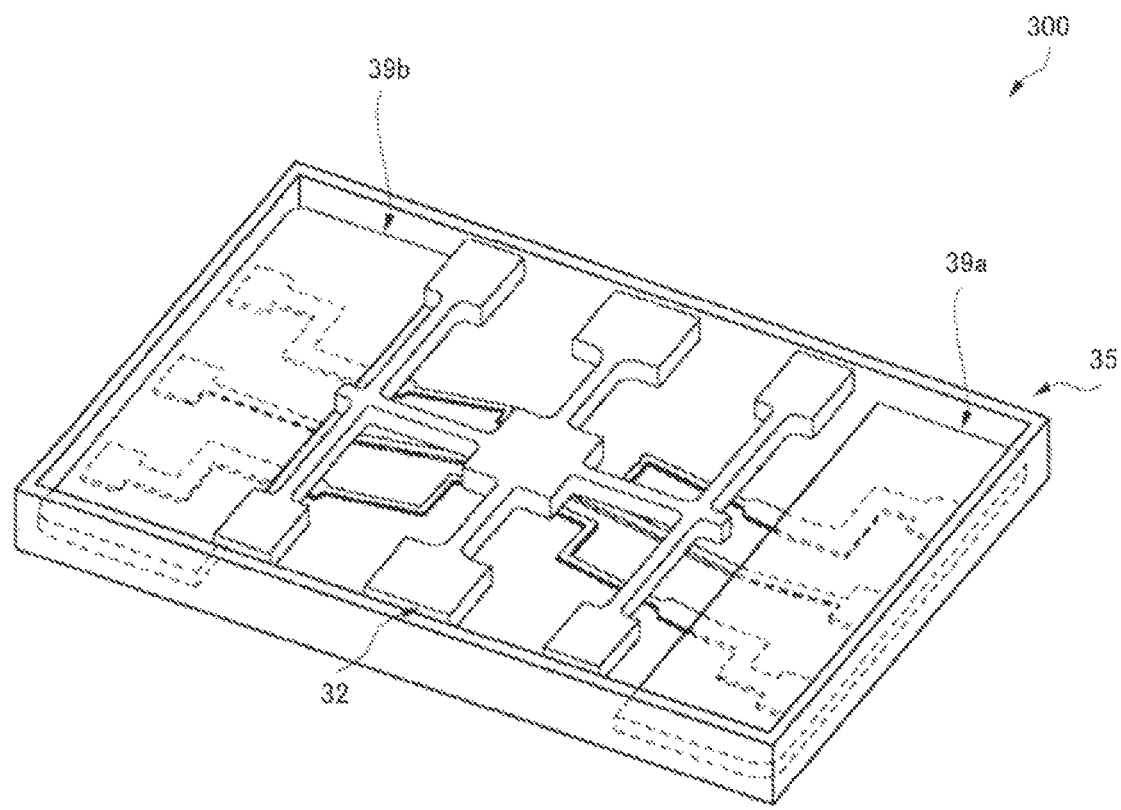
FIG. 17 is a perspective view of the gyro sensor of the fourth embodiment.

A gyro sensor (physical quantity sensor) 300 as an example of the electronic device illustrated in FIGS. 15, 16, and 17 includes a quartz crystal gyro sensor element 32 as a function element for detecting the angular velocity, a first support base material 39a and a second support base material 39b constituting a support portion for supporting the quartz crystal gyro sensor element 32, and a package 35 for collectively accommodating support portions divided into the quartz crystal gyro sensor element 32, the first support base material 39a, and the second support base material 39b. The quartz crystal gyro sensor element 32 is, for example, the quartz crystal gyro sensor element 200 in the third embodiment. The package 35 includes a base 36 and a lid 37 joined to the base 36.

Fifth Embodiment

Next, a fifth embodiment will be described. Hereinafter, differences from the first to fourth embodiments will be mainly described, and the same reference numerals are given to the same constituent elements as those of the first to fourth embodiments, and redundant description thereof will be omitted. The fifth embodiment is an embodiment of a physical quantity sensor which is the high-accuracy angular velocity sensor 18 in the second embodiment.

Figure 18:
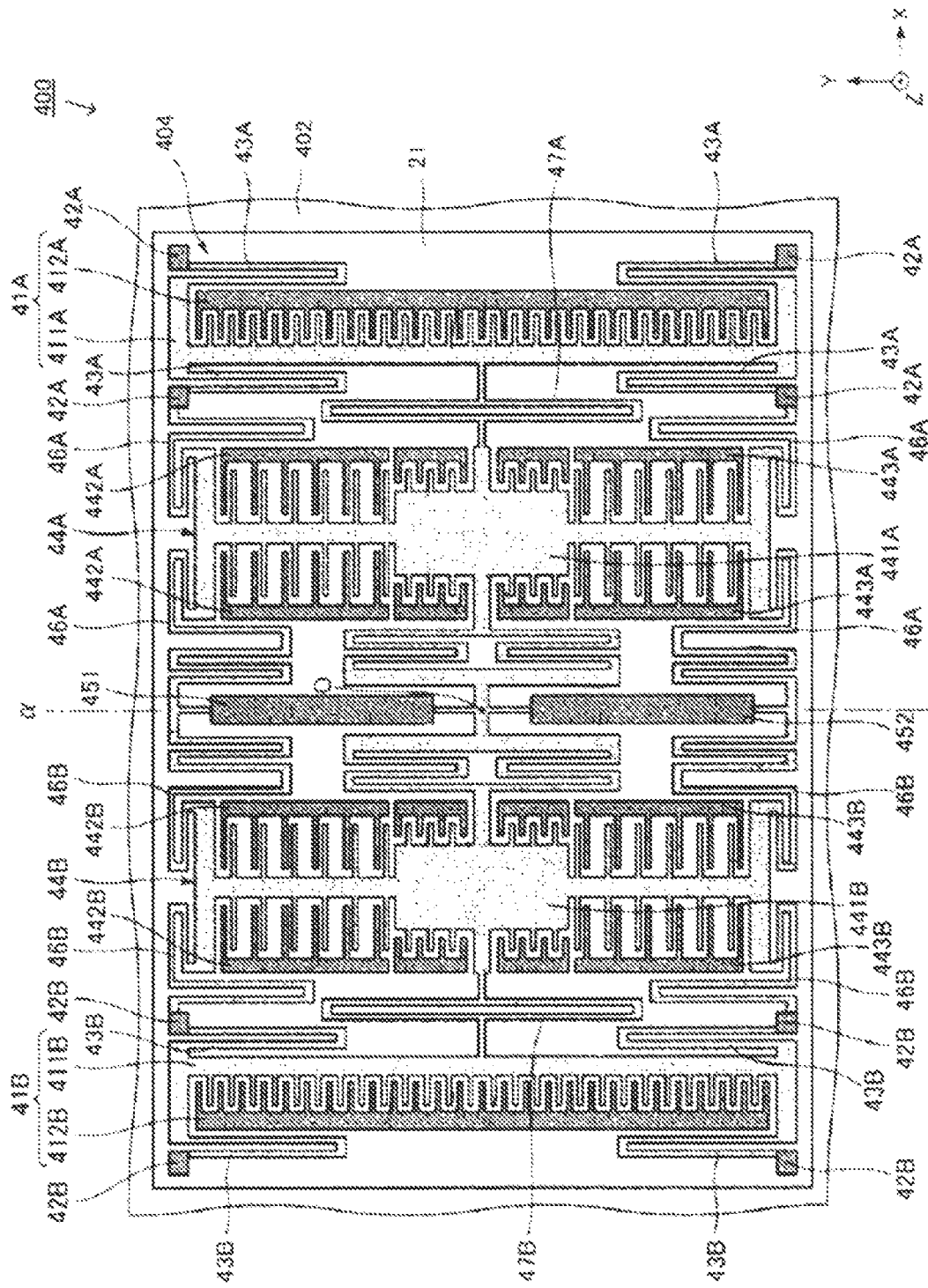
FIG. 18 is a schematic plan view of a physical quantity sensor of a fifth embodiment.

A physical quantity sensor 400 illustrated in FIG. 18 is a Si-MEMS type angular velocity sensor element capable of measuring an angular velocity $\omega z$ around the Z-axis.

As illustrated in FIG. 18, a shape of an element portion 404 is symmetrical with respect to an imaginary straight line $\alpha$. The element portion 404 includes drive portions 41A and 41B disposed on both sides of the imaginary straight line $\alpha$. The drive portion 41A includes a tooth-shaped movable drive electrode 411A and a fixed drive electrode 412A which is formed in a tooth shape and disposed to be in mesh with the movable drive electrode 411A. Similarly, the drive portion 41B includes a tooth-shaped movable drive electrode 411B and a fixed drive electrode 412B which is formed in a tooth shape and disposed to be in mesh with the movable drive electrode 411B.

The fixed drive electrode 412A is positioned outside (farther from the imaginary straight line $\alpha$) than the movable drive electrode 411A, and the fixed drive electrode 412B is positioned outside (side farther from the imaginary straight line $\alpha$) than the movable drive electrode 411B. Each of the fixed drive electrodes 412A and 412B is joined to the upper surface of a mount 221 and is fixed to the substrate 402. Each of the movable drive electrodes 411A and 411B is electrically connected to a wiring 73 and each of the fixed drive electrodes 412A and 412B is electrically connected to a wiring 74.

In addition, the element portion 404 includes four fixed portions 42A disposed around the drive portion 41A and four fixed portions 42B disposed around the drive portion 41B. Each of the fixing portions 42A and 42B is joined to the upper surface of the mount and is fixed to the substrate 402.

The element portion 404 includes four drive springs 43A connecting the fixed portions 42A and the movable drive electrode 411A and four drive springs 43B connecting the fixed portions 42B and the movable drive electrode 411B. The drive springs 43A are elastically deformed in the X-axis direction so that displacement of the movable drive electrode 411A in the X-axis direction is permitted and the driving springs 43B are elastically deformed in the X-axis direction so that displacement of the movable drive electrode 411B in the X-axis direction is permitted.

When a drive voltage is applied between the movable drive electrodes 411A and 411B and the fixed drive electrodes 412A and 412B through the wirings 73 and 74, electrostatic attractive forces are generated between the movable drive electrode 411A and the fixed drive electrode 412A and between the movable drive electrode 411B and the fixed drive electrode 412B, and the movable drive electrode 411A vibrates in the X-axis direction while elastically deforming the drive spring 43A in the X-axis direction and the movable drive electrode 411B vibrates in the X-axis direction while elastically deforming the drive spring 43B in the X-axis direction. Since the drive portions 41A and 41B are disposed symmetrically with respect to the imaginary straight line α, the movable drive electrodes 411A and 411B vibrate in opposite phases in the X-axis direction so as to repeat approaching and separating from each other. For that reason, vibration of the movable drive electrodes 411A and 411B is canceled, and vibration leakage can be reduced. Hereinafter, this vibration mode is also referred to as a drive vibration mode.

In the physical quantity sensor 400 of the fifth embodiment, although an electrostatic drive method is used in which the drive vibration mode is excited by electrostatic attractive force is applied, a method of exciting the drive vibration mode is not particularly limited, and for example, a piezoelectric drive method, an electromagnetic drive method using a Lorentz force of a magnetic field, or the like can also be applied.

Further, the element portion 404 includes detection portions 44A and 44B disposed between the drive portions 41A and 41B. The detection portion 44A includes a movable detection electrode 441A having a plurality of electrode fingers disposed in a tooth shape and fixed detection electrodes 442A and 443A disposed to be in mesh with electrode fingers of the movable detection electrode 441A provided with a plurality of electrode fingers disposed in a tooth shape. The fixed detection electrodes 442A and 443A are arranged side by side in the Y-axis direction, and the fixed detection electrode 442A is positioned on the plus side in the Y-axis direction and the fixed detection electrode 443A is positioned on the minus side in the Y-axis direction with respect to the center of the movable detection electrode 441A. In addition, a pair of the fixed detection electrodes 442A and a pair of fixed detection electrodes 443A are arranged so as to sandwich the movable detection electrode 441A from both sides in the X-axis direction.

The movable detection electrode 441A has mass different from that of the movable drive electrode 411A. In the fifth embodiment, the mass of the movable detection electrode 441A is larger than the mass of the movable drive electrode 411A. However, the mass of the movable detection electrode 441A is not limited thereto, and the mass of the movable detection electrode 441A may be equal to the mass of the movable drive electrode 411A, or may be smaller than the mass of the movable drive electrode 411A.

Similarly, the detection portion 44B includes a movable detection electrode 441B having a plurality of electrode fingers disposed in a tooth shape and fixed detection electrodes 442B and 443B disposed to be in mesh with electrode fingers of the movable detection electrode 441B provided with a plurality of electrode fingers disposed in a tooth shape. The fixed detection electrodes 442A and 443B are arranged side by side in the Y-axis direction, and the fixed detection electrode 442B is positioned on the plus side in the Y-axis direction and the fixed detection electrode 443B is positioned on the minus side in the Y-axis direction with respect to the center of the movable detection electrode 441B. In addition, a pair of the fixed detection electrodes 442B and a pair of fixed detection electrodes 443B are arranged so as to sandwich the movable detection electrode 441B from both sides in the X-axis direction.

The movable detection electrode 441B has mass different from that of the movable drive electrode 411B. In the fifth embodiment, the mass of the movable detection electrode 441B is larger than the mass of the movable drive electrode 411B. However, the mass of the movable detection electrode 441B is not limited thereto, and the mass of the movable detection electrode 441B may be equal to the mass of the movable drive electrode 411B, or may be smaller than the mass of the movable drive electrode 411B.

The movable detection electrodes 441A and 441B are electrically connected to the wiring 73, respectively, the fixed detection electrodes 442A and 443B are electrically connected to the wiring 75, respectively, and the fixed detection electrodes 443A and 442B are electrically connected to the wiring 76, respectively. When the physical quantity sensor 400 is driven, an electrostatic capacitance Ca is formed between the movable detection electrode 441A and the fixed detection electrode 442A and between the movable detection electrode 441B and the fixed detection electrode 443B, and an electrostatic capacitance Cb is formed between the movable detection electrode 441A and the fixed detection electrode 443A and between the movable detection electrode 441B and the fixed detection electrode 442B.

Further, the element portion 404 includes two fixed portions 451 and 452 disposed between the detection portions 44A and 44B. The fixed portions 451 and 452 are respectively bonded to the upper surface of the mount and fixed to the substrate 402. The fixed portions 451 and 452 are arranged in the Y-axis direction and spaced apart from each other. In the fifth embodiment, the movable drive electrodes 411A and 411B and the movable detecting electrodes 441A and 441B are electrically connected to the wiring 73 via the fixed portions 451 and 452.

In addition, the element portion 404 includes four detection springs 46A for connecting the movable detection electrode 441A and the fixed portions 42A, 451, and 452, and four detection springs 46B for connecting the movable detection electrode 441B and the fixed portions 42B, 451, and 452. The detection springs 46A are elastically deformed in the X-axis direction so that displacement of the movable drive electrode 441A in the X-axis direction is permitted and the detection springs 46A are elastically deformed in the Y-axis direction so that displacement of the movable drive electrode 441A in the Y-axis direction is permitted. Similarly, the detection springs 46B are elastically deformed in the X-axis direction so that displacement of the movable drive electrode 441B in the X-axis direction is permitted, and the detection springs 46B are elastically deformed in the Y-axis direction so that displacement of the movable drive electrode 441B in the Y-axis direction is permitted.

Further, the element portion 404 includes a reverse phase spring 47A disposed between the drive portion 41A and the detection portion 44A and connecting the movable drive electrode 411A and the movable detecting electrode 441A and a reverse phase spring 47B disposed between the drive portion 41B and the detection portion 44B and connecting the movable drive electrode 411B and the movable detecting electrode 441B. The reverse phase spring 47A is elastically deformed in the X-axis direction so that the movable detection electrode 441A can be displaced in the X-axis direction with respect to the movable drive electrode 411A. Similarly, the reverse phase spring 47B is elastically deformed in the X-axis direction so that the movable detection electrode 441B can be displaced in the X-axis direction with respect to the movable drive electrode 411B.

When the Si-MEMS type angular velocity sensor element is driven with a drive voltage (for example, 1.8 V) equivalent to that of the quartz crystal gyro sensor element, stable vibration characteristics cannot be obtained, so that it is necessary to further generate a bias voltage (for example, 15 V) of ten and several V using a bias generation circuit for a drive voltage (for example, 1.8 V) and drive the Si-MEMS type angular velocity sensor element. However, since noise generated by the bias generation circuit is increased, a signal to noise ratio (S/N ratio) cannot be increased, and it is difficult to obtain low noise electrical characteristics as in the quartz gyro sensor element.

Sixth Embodiment

Next, a sixth embodiment will be described. Hereinafter, differences from the first to fifth embodiments will be mainly described, and the same reference numerals are given to the same constituent elements as those of the first to fourth embodiments, and redundant description thereof will be omitted. The sixth embodiment is an embodiment of a physical quantity detection device which is the high-accuracy angular velocity sensor 18 in the second embodiment.

In a physical quantity detection device 300 of the sixth embodiment, a plurality of physical quantity detection elements 302 are connected in a multi-connected manner. A physical quantity detection element 302 is, for example, the physical quantity sensor 400 in the fifth embodiment.

In the physical quantity detection device 300 configured as described above, since a plurality of physical quantity detection elements 302 are electrically connected to terminals XP and XN of a physical quantity detection circuit through terminals 307 (for output signals) and terminals 308 (ground (GND) terminals), when it is assumed that the number of the physical quantity detection elements 302 is M and physical quantity components included in signals output from M physical quantity detection elements 302 are $s1_x$, $s2_x$, . . . , $sM_x$, respectively, the physical quantity component $S_x$ included in the signals input from the terminals XP and XN is expressed by the following expression (10).

$$S_x = s1_x + s2_x + \ldots + sM_x \tag{10}$$

Structures of the M physical quantity detection elements 302 are the same, and when it is assumed that $s1_x \approx s2_x = \ldots = = SM_x = s_x$ in the expression (10), the expression (10) is transformed as illustrated in the following expression (11).

$$S_x = M \cdot s_x \tag{11}$$

On the other hand, there is no correlation between white noise components simultaneously output from the M physical quantity detection elements 302 through the terminals 307 and 308 of the physical quantity detection circuit. Accordingly, when it is assumed that the white noise components included in the signals output from the M physical quantity detection elements 302 are $n1_x$, $n2_x$, . . . , $nM_x$, a white noise component $N_x$ included in the signals input from the terminals XP and XN of the physical quantity detection is represented by the following expression (12).

$$N_x = \sqrt{(n1_x)^2 + (n2_x)^2 + \ldots + (nM_x)^2} \tag{12}$$

Structures of the M physical quantity detection elements 302 are the same, and when it is assumed that $(n1_x)^2 \approx (n2_x)^2 = \ldots = (nM_x)^2 = (n_x)^2$ in the expression (12), the expression (12) is transformed as illustrated in the following expression (13).

$$N_x = \sqrt{M} \cdot n_x \tag{13}$$

By dividing the expression (11) by the expression (13), the following expression (14) is obtained.

$$\frac{S_X}{N_X} = \sqrt{M} \cdot \frac{s_X}{n_X} \tag{14}$$

In the expression (14), the signal to noise ratio of the signal input from the terminals XP and XN of the physical quantity detection circuit is 1M times (for example, twice if M=4) the S/N ratio of the output signal of each of the M physical quantity detection elements 302. Accordingly, according to the physical quantity detection device 300 of the sixth embodiment, the S/N ratio of the output angular velocity signal is improved.

Figure 19:
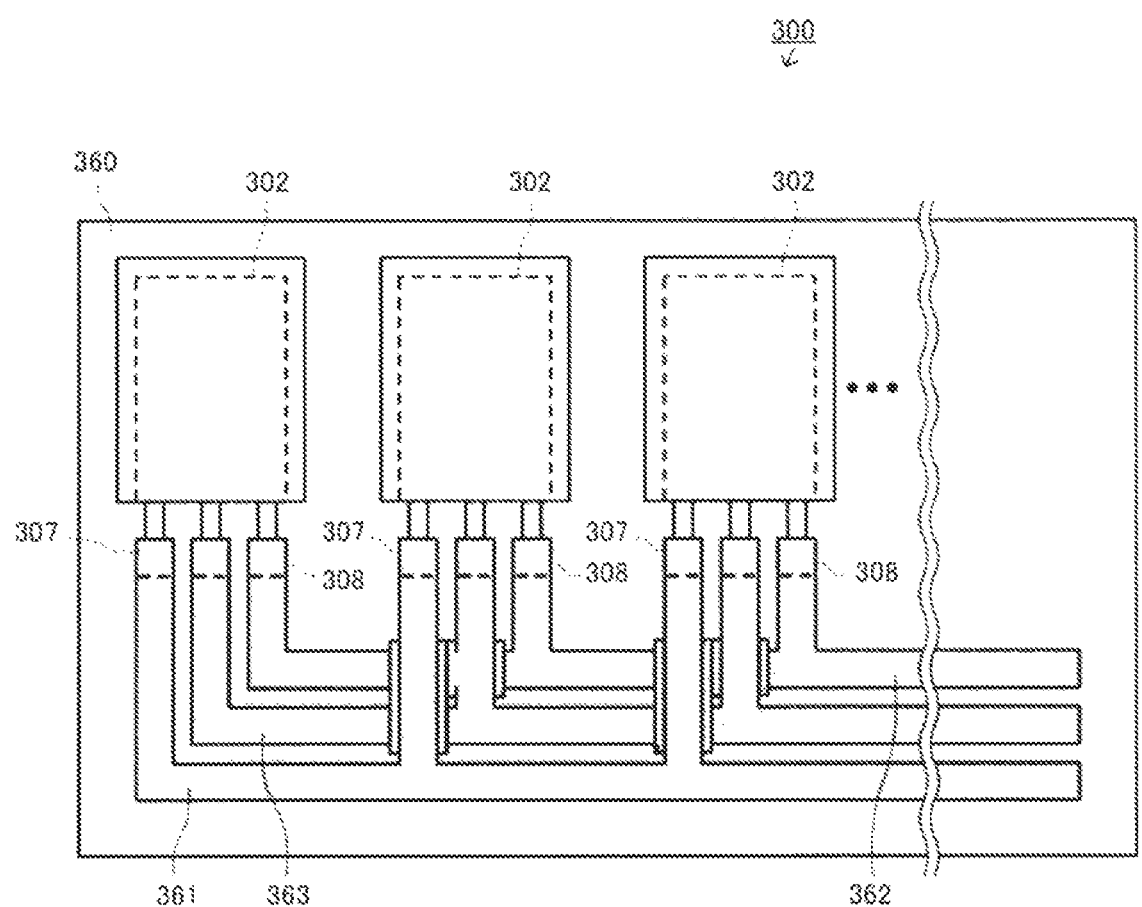
FIG. 19 is a schematic diagram of a physical quantity detection device of a sixth embodiment.

According to a mounting form illustrated in FIG. 19, since the plurality of physical quantity detection elements 302 are mounted on a common substrate 360, the distance between the adjacent physical quantity detection elements 302 can be reduced. Also, since wirings 361, 362, and 363 are provided on the substrate 360, the distance between each physical quantity detection element 302 and the wirings 361, 362, and 363 is reduced, which is advantageous for miniaturizing the physical quantity detection device 300.

Figure 20:
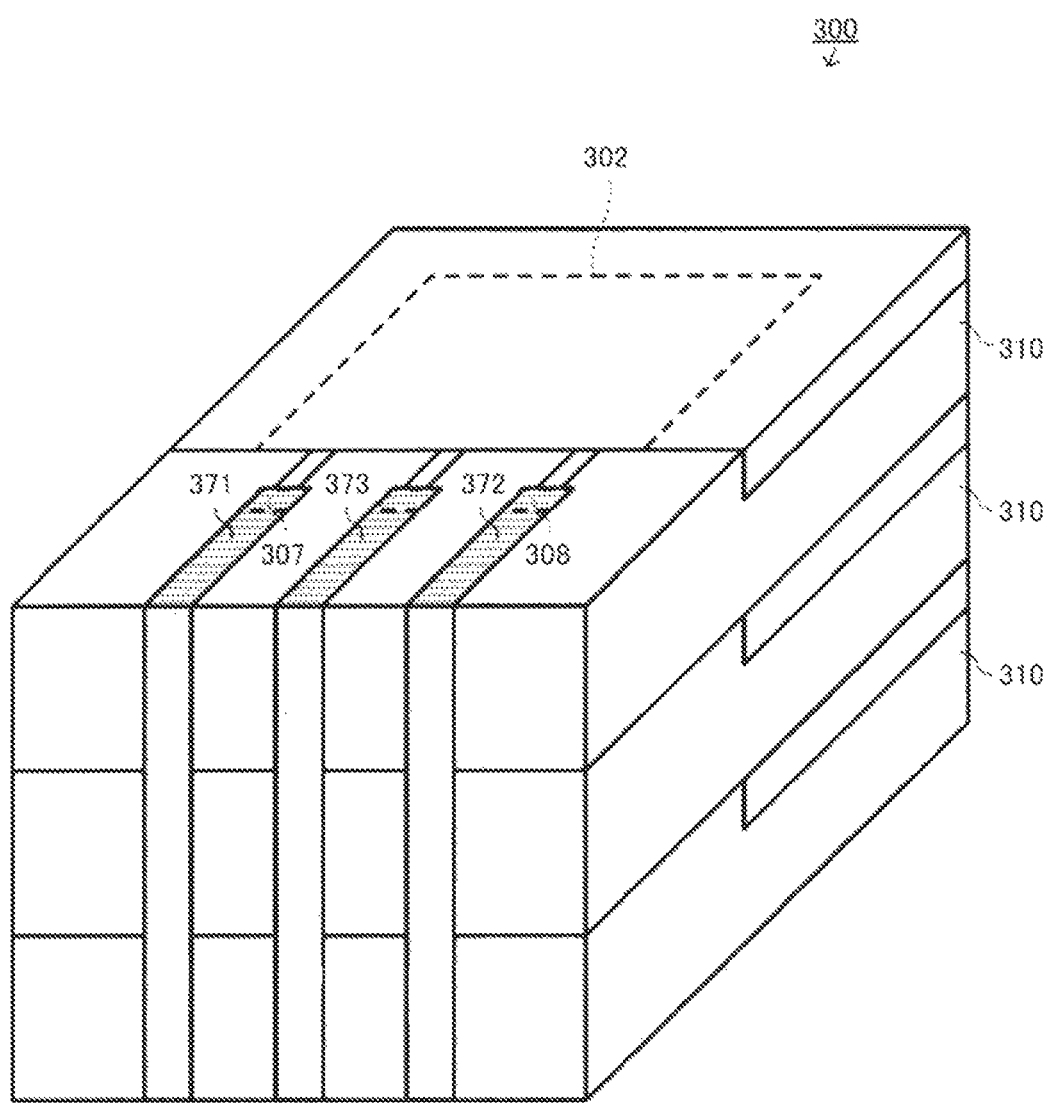
FIG. 20 is a perspective view of the physical quantity detection device of the sixth embodiment.
Figure 21:
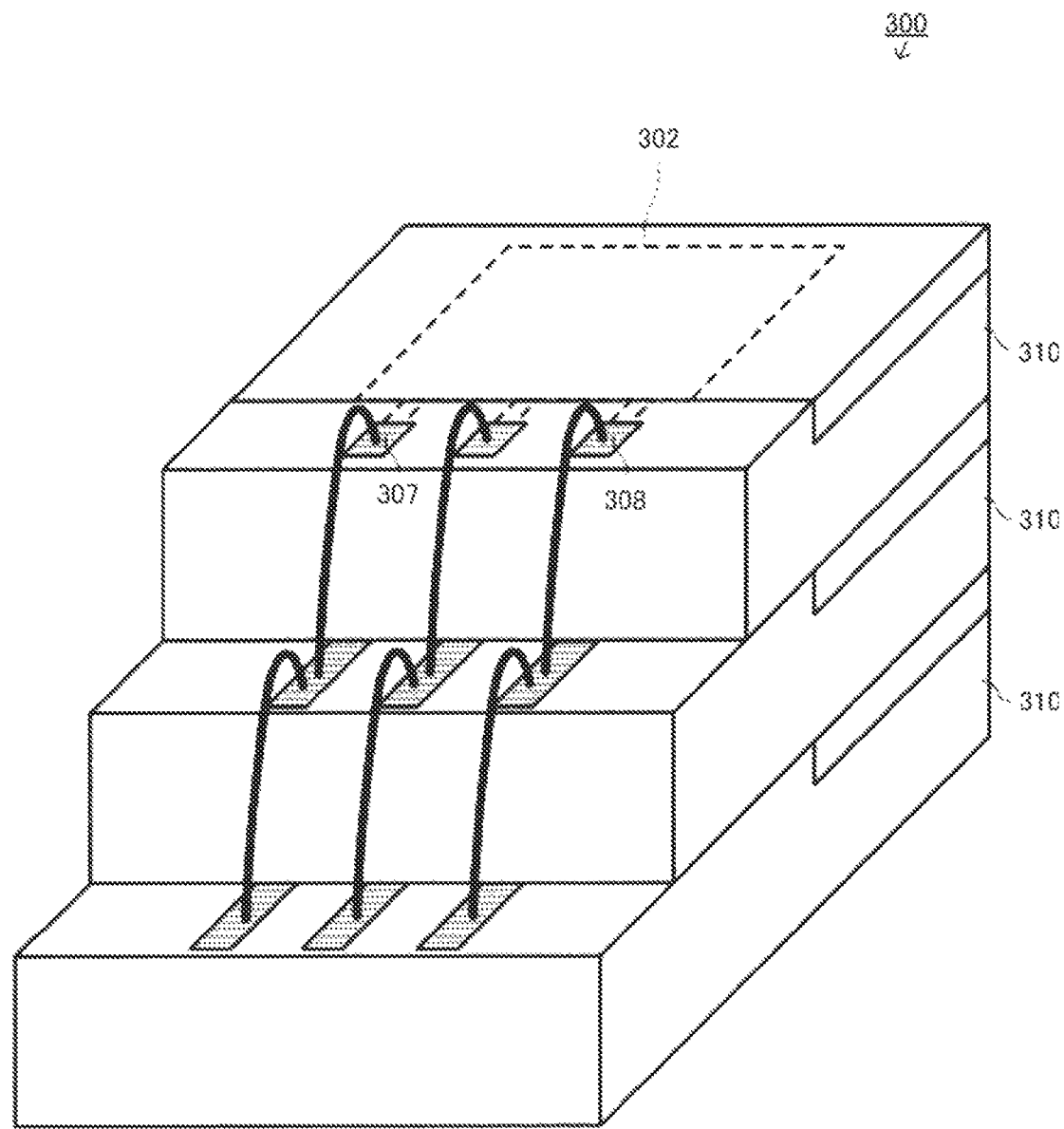
FIG. 21 is another perspective view of the physical quantity detection device of the sixth embodiment.

According to the mounting form illustrated in FIG. 20 and the mounting form illustrated in FIG. 21, since the plurality of containers 310 on which the plurality of physical quantity detection elements 302 are mounted are stacked, a disposition area of the plurality of physical quantity detection elements 302 becomes small, and the physical quantity detection device 300 can be miniaturized. Furthermore, according to the mounting form illustrated in FIG. 20 and the mounting form illustrated in FIG. 21, there is no need to provide wirings for electrically connecting the terminals 307 and 308 to the terminals XP and XN on a dedicated wiring substrate, which is advantageous for miniaturizing the physical quantity detection device 300.

Accordingly, the high-accuracy angular velocity sensor 18 according to the sixth embodiment is configured by connecting the plurality of physical quantity detection elements 302 as a plurality of Si-MEMS type angular velocity sensor elements as described above, thereby making it possible to improve the S/N ratio of the angular velocity signal output from the high-accuracy angular velocity sensor 18.

In the sixth embodiment, although the high-accuracy angular velocity sensor 18 which is the Z-axis angular velocity sensor 116 is described, similarly, the X-axis angular velocity sensor 112 and the Y-axis angular velocity sensor 114 can be configured as the physical quantity detection device 300 in which the physical quantity detection elements 302 which are a plurality of sensor elements are connected in a multi-connected manner. In this case, the sensor element may be, for example, a gyro sensor element in the seventh embodiment which will be described later.

By setting the number Ngz of the sensor elements constituting the Z-axis angular velocity sensor 116 to be larger than the number Ngx of the sensor elements constituting the X-axis angular velocity sensor 112 and the number Ngy of the sensor elements constituting the Y-axis angular velocity sensor 114, the Z-axis angular velocity sensor 116 can be made "high accuracy" as compared with the X-axis angular velocity sensor 112 and the Y-axis angular velocity sensor 114. For example, it is preferable to set the number Ngz of the sensor elements constituting the Z-axis angular velocity sensor 116 to a value larger than 2 elements, that is, 3 or more sensor elements. As the number of sensor elements increases, statistical computation and numerical analysis such as utilizing an average value and median value becomes possible, resulting in "high accuracy".

Seventh Embodiment

Next, a seventh embodiment will be described. Hereinafter, differences from the first to sixth embodiments will be mainly described, and the same reference numerals are given to the same constituent elements as those in the first to sixth embodiments, and redundant description thereof will be omitted. The seventh embodiment is an embodiment of gyro sensor elements mounted on the multi-axis inertial sensor 17 in the second embodiment, which are the X-axis angular velocity sensor 112 and the Y-axis angular velocity sensor 114 in the first embodiment.

Figure 22:
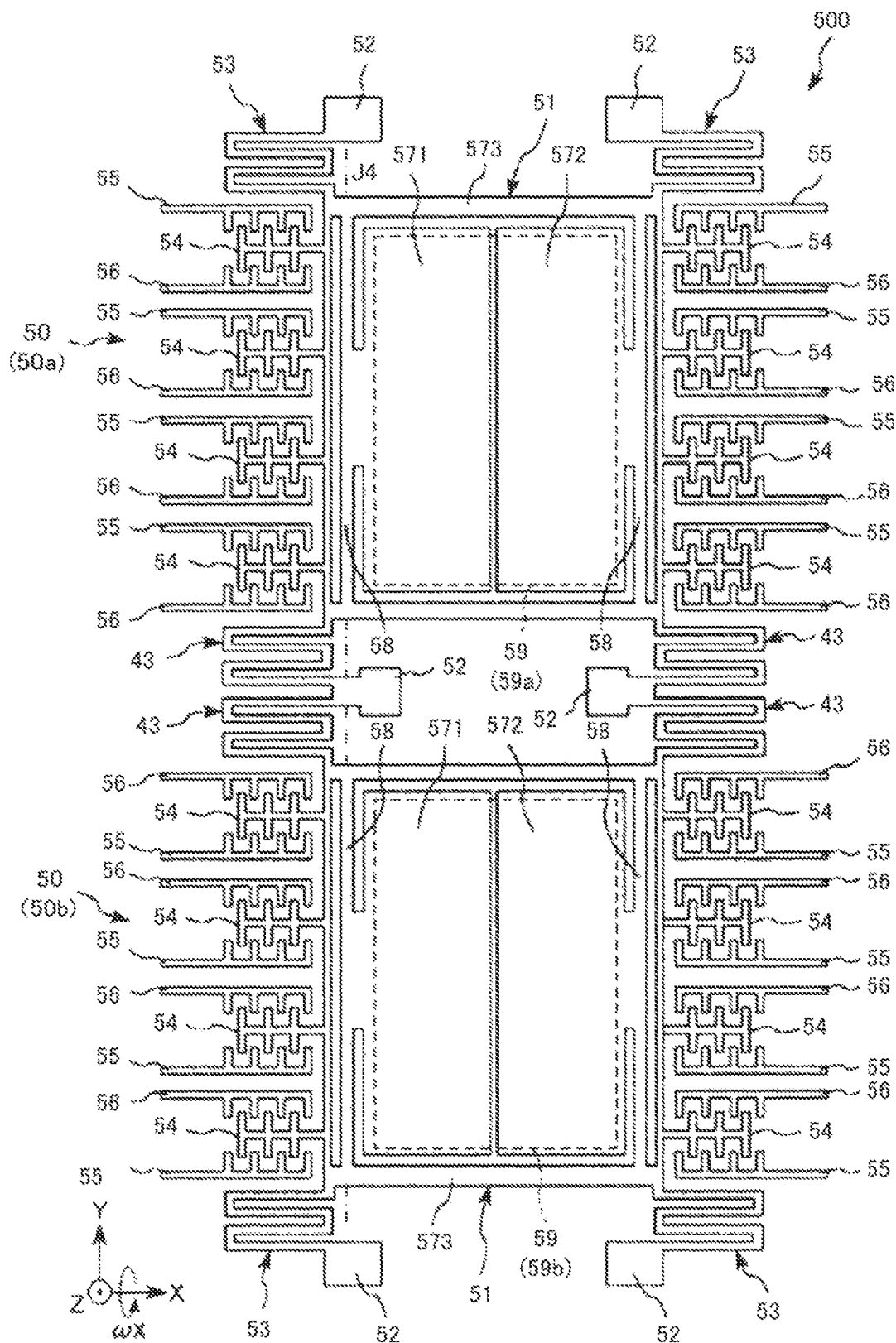
FIG. 22 is a schematic plan view of a gyro sensor element of a seventh embodiment.

A gyro sensor element 500 illustrated in FIG. 22 is an angular velocity sensor capable of detecting an angular velocity around the X-axis. The gyro sensor element 500 illustrated in FIG. 22 has two structures 50 (50a and 50b) and two fixed detection portions 59 (59a and 59b) aligned in the Y-axis direction. The two structures 50a and 50b are configured symmetrically in the vertical direction toward FIG. 22, and have configurations similar to each other.

Each structure 50 includes a mass portion 51, a plurality of fixed portions 52, a plurality of elastic portions 53, a plurality of drive portions 54 (movable drive electrodes), a plurality of fixed drive portions 55 and 56 (fixed drive electrodes), detection portions 571 and 572 (movable detection electrodes), and a plurality of beams 58. The mass portion 51 is integrally formed including the drive portions 54, a frame 573, the detection portions 571 and 572, and the beams 58. That is, the detection portions 571 and 572 are in a shape included in the mass portion 51.

The outer shape of the mass portion 51 is a quadrilateral frame shape in a plan view when seen in the Z-axis direction (hereinafter, simply referred to as "a plan view"), and includes the drive portion 54, the frame 573, the detection portions 571 and 572 as described above. Specifically, the outer shape of the mass portion 51 is configured with a pair of portions extending in parallel to each other in the Y-axis direction and a pair of portions connecting end portions of the pair of portions and extending parallel to each other along the X-axis direction.

Four fixed portions 52 are provided for one structure 50, and each fixed portion 52 is fixed to the substrate. In addition, each of the fixing portions 52 is disposed outside the mass portion 51 in a plan view, and in the seventh embodiment, each of the fixing portions 52 is disposed at a position corresponding to each corner portion of the mass portion 51. In the illustration, the fixed portion 52 positioned on the −Y-axis side of the structure 50a and the fixed portion 52 positioned on the +Y-axis side of the structure 50b are used as a common fixed portion.

Four elastic portions 53 are provided in this embodiment with respect to one structure 50, and each elastic portion 53 connects a portion of the mass portion 51 and the fixed portion 52 in a plan view. In the seventh embodiment, the elastic portions 53 are connected to the corner portions of the frame 573 of the mass portion 51, but are not limited thereto, and may be positioned at any position as long as the mass portion 51 can be displaced with respect to the fixed portion 52. In FIG. 22, a configuration in which the mass portion 51 can be displaced in the Y-axis direction is adopted. In the illustration, each of the elastic portions 53 has a meandering shape in a plan view and includes a first portion extending along the X-axis direction and a second portion extending along the Y-axis direction. The shape of the drive portion 54 is not limited to the illustrated shape as long as a configuration in which the drive portion 54 is elastically deformable in a desired driving direction (Y-axis direction in the seventh embodiment).

Eight drive portions 54 are provided for one structure 50, and each drive portion 54 is connected to a portion of the mass portion 51 extending along the Y-axis direction. Specifically, the four drive portions 54 are positioned on the +X side of the mass portion 51, and the remaining four drive portions 54 are positioned on the −X side of the mass portion 51. Each drive portion 54 has a tooth shape including a trunk portion extending from the mass portion 51 in the X-axis direction and a plurality of branch portions extending from the trunk portion in the Y-axis direction.

Eight fixed drive portions 55 and eight fixed drive portions 56 are provided for each structure 50, respectively, and respective fixed drive portions 55 and 56 are fixed to the upper surface 23 of the substrate described above. In addition, the fixed drive portions 55 and 56 have tooth shapes corresponding to the drive portion 54, and are provided so as to sandwich the driving portion 54 therebetween.

Each of the detection portions 571 and 572 is a plate-shaped member having a rectangular shape in a plan view, which is disposed inside the mass portion 51 and is connected to the mass portion 51 by the beam 58. The detection portions 571 and 572 can rotate (displace) around a rotation axis J4, respectively.

The fixed detection portion 59 (fixed detection electrode) faces the detection portions 571 and 572. Further, the fixed detection portion 59 is separated from the detection portions 571 and 572.

In addition, the mass portion 51, the elastic portion 53, the drive portion 54, a portion of the fixed drive portion 55, a portion of the fixed drive portion 56, the detection portions 571 and 572, and the beam 58 having the configuration described above are provided above the substrate and are separated from the substrate 2.

The structure 50 as described above is collectively formed by patterning a conductive silicon substrate doped with impurities such as phosphorus and boron by etching.

As the constituent material of the fixed detection portion 59, for example, aluminum, gold, platinum, indium tin oxide (ITO), ZnO (zinc oxide), or the like can be used.

Although not illustrated, the fixed portion 52, the fixed drive portion 55, the fixed drive portion 56, the fixed detection portion 59a, and the fixed detection portion 59b are electrically connected to wirings and terminals (not illustrated), respectively. These wirings and terminals are provided on a substrate, for example.

The configuration of the gyro sensor element 500 has been briefly described as above. A gyro sensor element 500 having such a configuration can detect the angular velocity ωx as follows.

First, when a drive voltage is applied between the drive portion 54 and the fixed drive portions 55 and 56 included in the gyro sensor element 500, an electrostatic attractive force periodically changing in intensity occurs between the fixed drive portions 55 and 56 and the drive portion 54. With this configuration, each drive portion 54 vibrates in the Y-axis direction with elastic deformation of each elastic portion 53. In this case, the plurality of drive portions 54 included in the structure 50*a* and the plurality of drive portions 54 included in the structure 50*b* vibrate (drive vibration) in opposite phases in the Y-axis direction.

When the angular velocity ox is applied to the gyro sensor element 500 in a state where the drive portion 54 vibrates in the Y-axis direction as described above, the Coriolis force acts and the detection portions 571 and 572 are displaced around a rotation axis J4. In this case, the detection portions 571 and 572 included in the structure 50*a* and the detection portions 571 and 572 of the structure 50*b* are displaced in opposite directions. For example, when the detection portions 571 and 572 included in the structure 50*a* are respectively displaced in the +Z-axis direction, the detection portions 571 and 572 included in the structure 50*b* are respectively displaced in the −Z-axis direction. Further, when the detection portions 571 and 572 included in the structure 50*a* are respectively displaced in the −Z-axis direction, the detection portions 571 and 572 included in the structure 50*b* are respectively displaced in the +Z-axis direction.

As the detection portions 571 and 572 displace (detect vibration) in this manner, a distance between the detection portions 571 and 572 and the fixed detection portion 59 changes. As the distance changes, the electrostatic capacitance between the detection portions 571 and 572 and the fixed detection portion 59 changes. The angular velocity ox applied to the gyro sensor element 500 can be detected based on the amount of change in the electrostatic capacitance.

Although the X-axis angular velocity sensor 112 is described, the same applies to the Y-axis angular velocity sensor 114.

Eighth Embodiment

Next, an eighth embodiment will be described. Hereinafter, differences from the first to seventh embodiments will be mainly described, and the same reference numerals are given to the same constituent elements as those of the first to seventh embodiments, and redundant description thereof will be omitted. The eighth embodiment is an embodiment of a physical quantity sensor mounted on the multi-axis inertial sensor 17 in the second embodiment, which corresponds to the X-axis acceleration sensor 122 and the Y-axis acceleration sensor 124 in the first embodiment.

Figure 23:
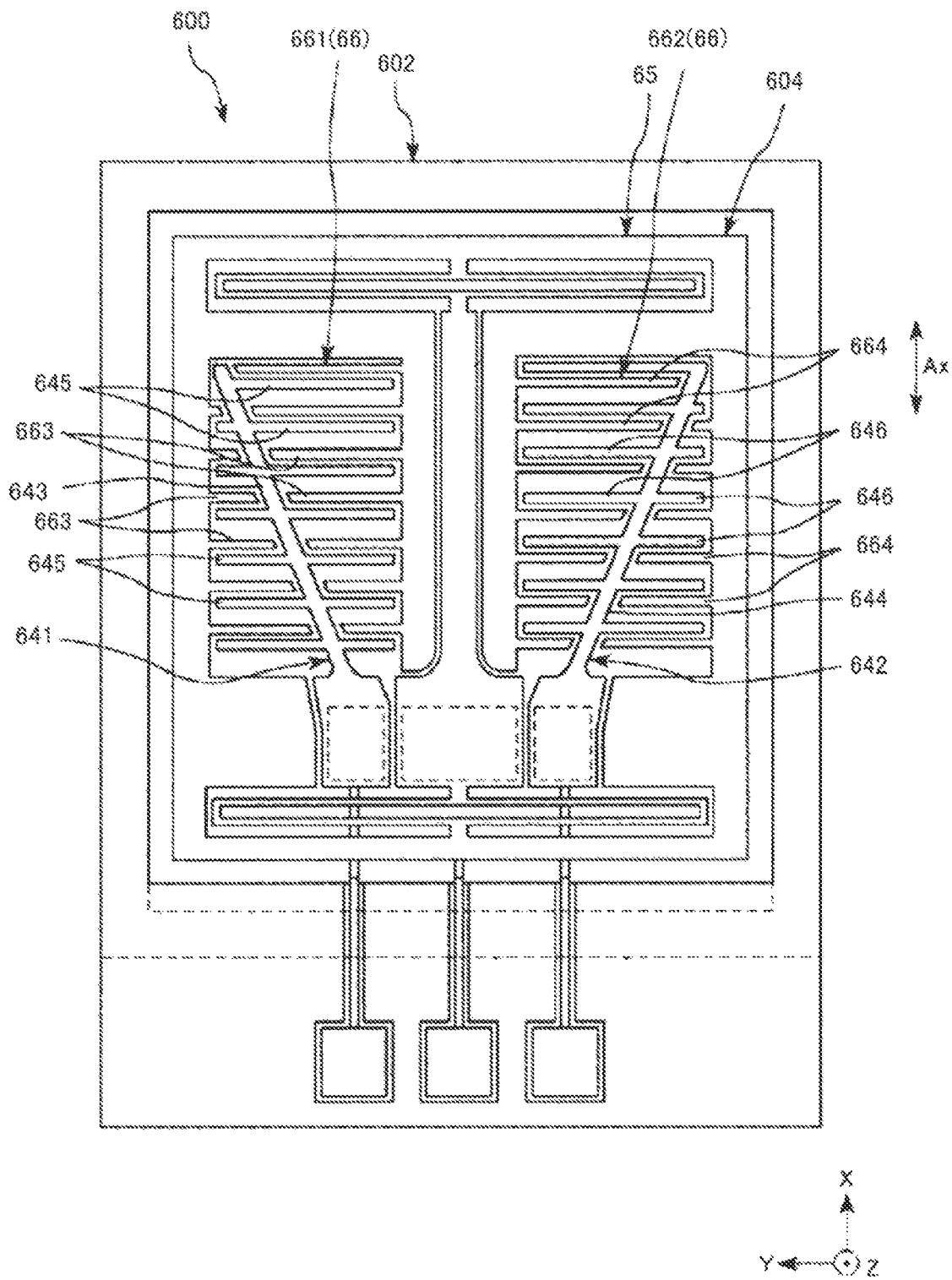
FIG. 23 is a schematic plan view of a physical quantity sensor of an eighth embodiment.

A physical quantity sensor 600 illustrated in FIG. 23 is an acceleration sensor capable of detecting acceleration Ax in the X-axis direction. Such a physical quantity sensor 600 includes a base portion 602 and an element portion 604 which is provided in the base portion 602 and measures acceleration Ax (physical quantity) in the X-axis direction. The element portion 604 includes a fixed electrode 64 attached to the base portion 602, a movable member 65 displaceable in the X-axis direction (a first direction which is a detection axis direction of a physical quantity) with respect to the base portion 602, and movable electrodes 66 provided on the movable member 65. The fixed electrode 64 includes a first fixed electrode 641 and a second fixed electrode 642 arranged side by side along the Y-axis direction (a second direction which is a direction crossing the detection axis (orthogonal to the detection axis in the eighth embodiment)).

The first fixed electrode 641 includes a first stem portion 643 and a plurality of first fixed electrode fingers 645 which are provided on both sides of a first stem portion 643 in the Y-axis direction (second direction) and of which a longitudinal direction is along the second direction. In addition, the second fixed electrode 642 includes a second stem portion 644 and a plurality of second fixed electrode fingers 646 which are provided on both sides in the Y-axis direction (second direction) from the second stem portion 644 and of which a longitudinal direction is along the second direction. The movable electrode 66 includes a first movable electrode 661 and a second movable electrode 662 arranged side by side along the Y-axis direction (second direction). At least a portion of the first movable electrode 661 includes a plurality of first movable electrode fingers 663 which are positioned on both sides of the first stem portion 643 in the Y-axis direction (second direction), of which the longitudinal direction is along the second direction, and which face the first fixed electrode fingers 645 in the X-axis direction (first direction). At least a portion of the second movable electrode 662 includes a plurality of second movable electrode fingers 664 which are positioned on both sides of the second stem portion 644 in the Y-axis direction (second direction), of which the longitudinal direction is along the second direction, and which face the second fixed electrode fingers 646 in the X-axis direction (first direction). With such a configuration, the first and second fixed electrode fingers 645 and 646 and the first and second movable electrode fingers 663 and 664 can be respectively shortened while maintaining the electrostatic capacitance between the first movable electrode finger 663 and the first fixed electrode finger 645 and the electrostatic capacitance between the second movable electrode finger 664 and the second fixed electrode finger 646 sufficiently large. For that reason, the physical quantity sensor 600 in which the electrode fingers 645, 646, 663, and 664 are hard to be broken and which has excellent impact resistance is obtained.

Although the X-axis acceleration sensor 122 is described, the same applies to the Y-axis acceleration sensor 124.

Ninth Embodiment

Next, a ninth embodiment will be described. Hereinafter, differences from the first to eighth embodiments will be mainly described, and the same reference numerals are given to the same constituent elements as those in the first to eighth embodiments, and redundant description thereof will be omitted. The ninth embodiment is an embodiment of the physical quantity sensor mounted on the multi-axis inertial sensor 17 in the second embodiment, which is the Z-axis angular velocity sensor 116 in the first embodiment.

Figure 24:
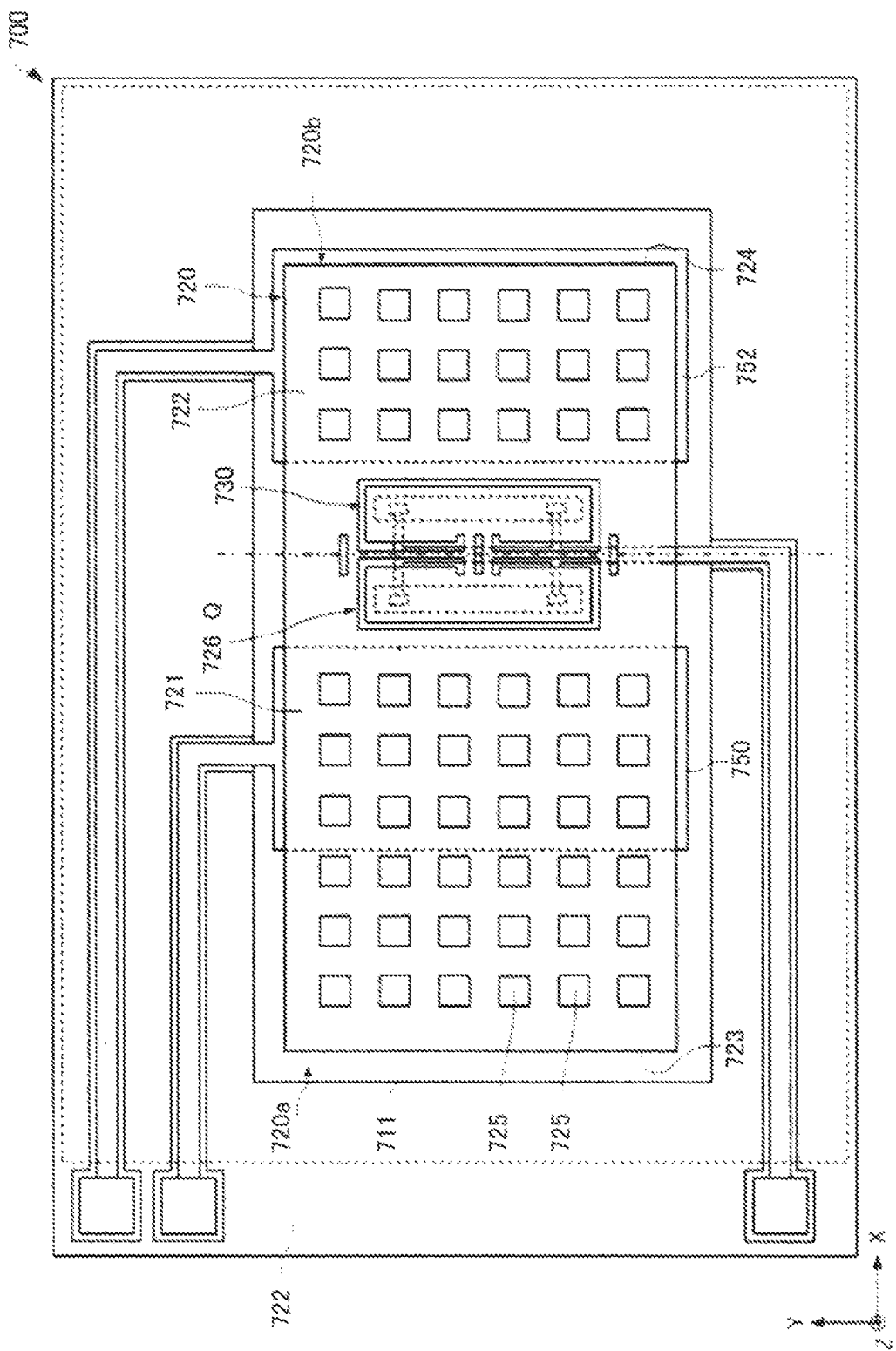
FIG. 24 is a schematic plan view of a physical quantity sensor of a ninth embodiment.

FIG. 24 is a schematic plan view of a physical quantity sensor 700 of a ninth embodiment. A movable body 720 includes a first movable member 720*a* and a second movable member 720*b*. The movable body 720 includes the first movable member 720*a* on one side in a direction orthogonal to a rotation axis, the second movable member 720*b* on the other side in the direction orthogonal to the rotation axis, and a fifth beam and a sixth beam connecting the first movable member 720a and the second movable member 720b, in a plan view, with the rotation axis as a boundary, and an opening portion 726 is disposed between the fifth beam and the sixth beam in a plan view, and the third beam connects the first beam and the fifth beam, and the fourth beam connects the second beam and the sixth beam.

The first movable member 720a is positioned on one side (−X-axis direction side in the illustrated example) of a support axis Q in a plan view (viewed from the Z-axis direction). The second movable member 720b is positioned on the other side (+X-axis direction side in the illustrated example) of the support axis Q in a plan view.

In a case where acceleration in the vertical direction (for example, gravitational acceleration) is applied to the movable body 720, rotational moment (moment of force) is generated in each of the first movable member 720a and the second movable member 720b. Here, in a case where rotational moment (for example, counterclockwise rotational moment) of the first movable member 720a and rotational moment of the second movable member 720b (for example, clockwise rotational moment) are balanced, inclination of the movable body 720 does not change and acceleration cannot be detected. Accordingly, the movable body 720 is designed so that the rotational moment of the first movable member 720a and the rotational moment of the second movable member 720b are not balanced and the movable body 720 has a predetermined inclination when the acceleration in the vertical direction is applied.

In the physical quantity sensor 700, by disposing the support axis Q at a position deviated from the center (center of gravity) of the movable body 720 (by making the distances from the support axis Q to the tip ends of the first movable member 720a and the second movable member 720b different), the first movable member 720a and the second movable member 720b have different masses.

That is, the mass of the movable body 720 is different between one side (first movable member 720a) and the other side (second movable member 720b) with the support axis Q as a boundary. In the illustrated example, the distance from the support axis Q to an end face 723 of the first movable member 720a is greater than the distance from the support axis Q to an end face 724 of the second movable member 720b. In addition, the thickness of the first movable member 720a is equal to the thickness of the second movable member 720b. Accordingly, the mass of the first movable member 720a is larger than the mass of the second movable member 720b.

As such, since the first movable member 720a and the second movable member 720b have different masses, when the acceleration in the vertical direction is applied, the rotational moment of the first movable member 720a and the rotational moment of the second movable member 720b cannot be balanced. Accordingly, when acceleration in the vertical direction is applied, it is possible to cause the movable body 720 to have a predetermined inclination.

Although not illustrated, by disposing the support axis Q at the center of the movable body 720 and making the thicknesses of the first movable member 720a and the second movable member 720b different from each other, the first movable member 720a and the second movable member 720b may have different masses from each other. Even in such a case, when the acceleration in the vertical direction is applied, a predetermined inclination can be generated in the movable body 720.

The movable body 720 is provided apart from a substrate 702. The movable body 720 is provided above a recessed portion 11. A gap is provided between the movable body 720 and the substrate 702.

With this configuration, the movable body 720 can swing.

The movable body 720 includes a first movable electrode 721 and a second movable electrode 722 which are provided with the support axis Q as a boundary. The first movable electrode 721 is provided on a first movable member 720a. The second movable electrode 722 is provided on a second movable member 720b.

The first movable electrode 721 is a portion of the movable body 720 that overlaps with a first fixed electrode 750 in a plan view. The first movable electrode 721 forms an electrostatic capacitance C1 between the first movable electrode 721 and the first fixed electrode 750. That is, an electrostatic capacitance C1 is formed by the first movable electrode 721 and the first fixed electrode 750.

The second movable electrode 722 is a portion of the movable body 720 that overlaps with the second fixed electrode 752 in a plan view. The second movable electrode 722 forms an electrostatic capacitance C2 between the second movable electrode 722 and a second fixed electrode 752. That is, the electrostatic capacitance C2 is formed by the second movable electrode 722 and the second fixed electrode 752. In the physical quantity sensor 700, since the movable body 720 is made of a conductive material (silicon doped with impurities), the movable electrodes 721 and 722 are provided.

That is, the first movable member 720a functions as the first movable electrode 721 and the second movable member 720b functions as the second movable electrode 722.

The electrostatic capacity C1 and the electrostatic capacity C2 are configured to be equal to each other, for example, in a state where the movable body 720 is horizontal. The positions of the movable electrodes 721 and 722 change according to movement of the movable body 720. Depending on the positions of the movable electrodes 721 and 722, the electrostatic capacitances C1 and C2 change. A predetermined potential is applied to the movable body 720 through a support portion 730.

In the movable body 720, a through-hole 725 penetrating the movable body 720 is formed. With this configuration, it is possible to reduce the influence (air resistance) of air when the movable body 720 swings. A plurality of through-holes 725 are formed. In the illustrated example, a planar shape of the through-hole 725 is a square.

The movable body 720 is provided with an opening portion 726 penetrating the movable body 720. The opening portion 726 is provided on the support axis Q in a plan view. In the illustrated example, the planar shape of the opening portion 726 is a rectangle.

A support portion 730 is provided on the substrate 702. The support portion 730 is positioned in an opening portion 726. The support portion 730 supports the movable body 720. The support portion 730 includes a first fixed portion, a second fixed portion, a first beam 41, a second beam 42, a third beam 43, and a fourth beam 44.

The first fixed portion and the second fixed portion are fixed to the substrate 702. The first fixed portion and the second fixed portion are provided so as to sandwich the support axis Q in a plan view. In the illustrated example, the first fixing portion is provided on the −X-axis direction side of the support axis Q, and the second fixing portion is provided on the +X-axis direction side of the support axis Q.

Tenth Embodiment

Next, a tenth embodiment will be described. Hereinafter, differences from the first to ninth embodiments will be mainly described, and the same reference numerals are given to the same constituent elements as those of the first to ninth embodiments, and redundant description thereof will be omitted. The tenth embodiment is an embodiment of the multi-axis inertial sensor 17 in the second embodiment.

Figure 25:
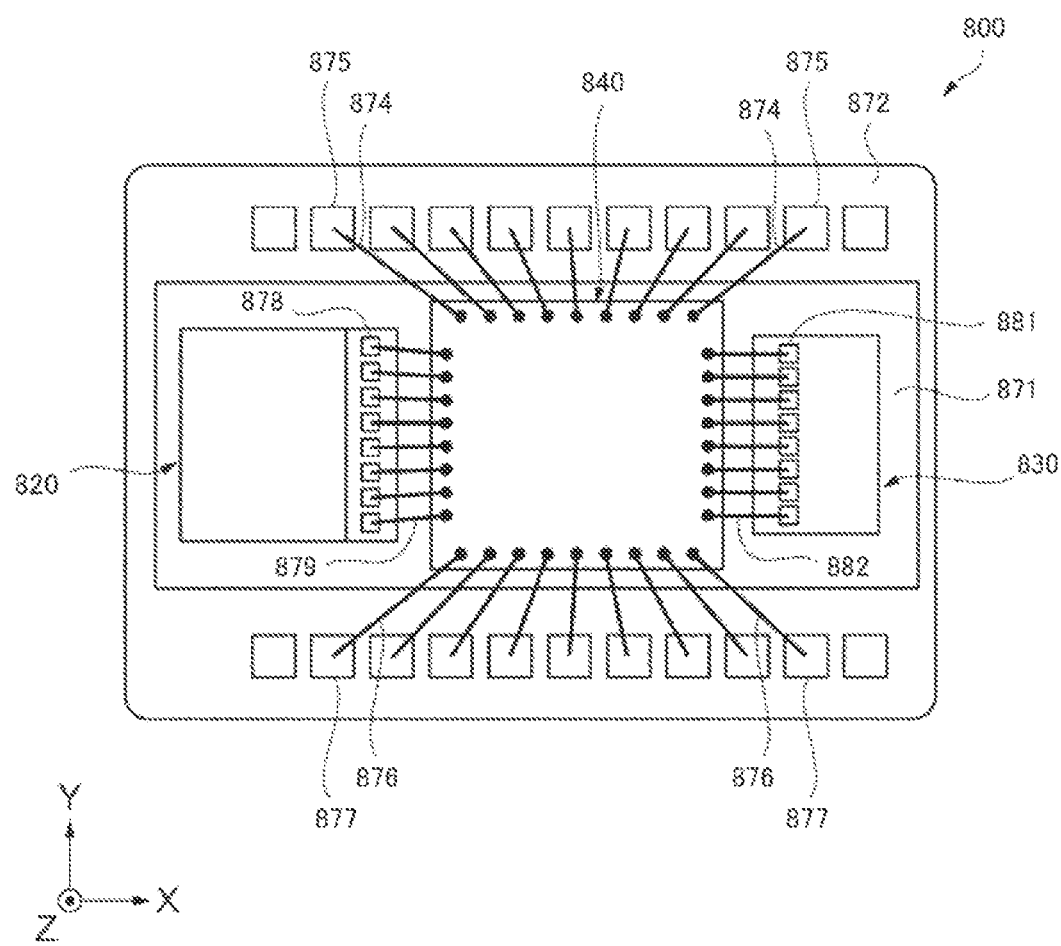
FIG. 25 is a schematic plan view of a physical quantity sensor of a tenth embodiment.
Figure 26:
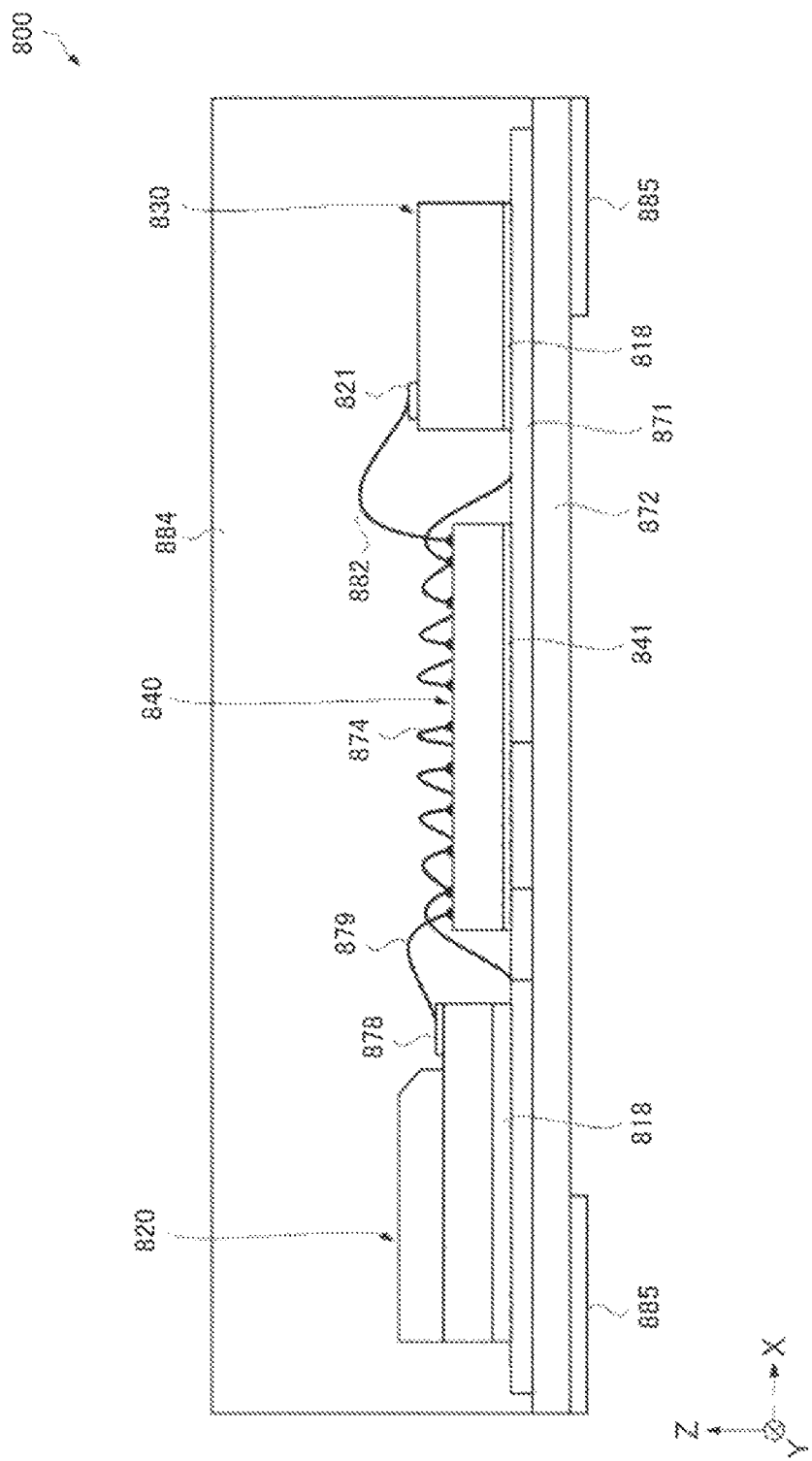
FIG. 26 is a schematic sectional view of a physical quantity sensor of the tenth embodiment.

Next, the physical quantity sensor according to the tenth embodiment will be described with reference to FIGS. 25 and 26. FIG. 25 is a plan view illustrating a schematic configuration of a physical quantity sensor 800 according to the tenth embodiment. For convenience of explanation, FIG. 25 illustrates a state in which a resin package is seen through. FIG. 26 is a cross-sectional view illustrating a schematic configuration of the physical quantity sensor 800 according to the tenth embodiment. In the following description, three axes orthogonal to each other will be described using the X-axis, the Y-axis, and the Z-axis. Also, for the sake of convenience of explanation, the surface on the +Z-axis direction side, which is the sensor element side, is referred to as an upper surface and the surface on the opposite side to the −Z-axis direction is referred to as a lower surface, in a plan view when viewed in the Z-axis direction.

As illustrated in FIGS. 25 and 26, the physical quantity sensor 800 according to the tenth embodiment can be used as a six-axis sensor including a three-axis acceleration sensor capable of independently measuring accelerations in the X-axis direction, the Y-axis direction, and the Z-axis direction and a three-axis angular velocity sensor capable of independently measuring angular velocities in the X-axis direction, the Y-axis direction, and the Z-axis direction.

Such a physical quantity sensor 800 includes a frame 871, an integrated circuit (IC) 840 as a circuit element disposed on the frame 871, and an acceleration sensor element 820 and an angular velocity sensor element 830 as sensor elements disposed one on each side of the IC 840 in the X direction in a plan view in the Z-axis direction, and a resin package 884 covering these constituent parts. The frame 871 is attached to a circuit board 872 through a joining member (not illustrated). The acceleration sensor element 820 and the angular velocity sensor element 830 are attached to the upper surface of the frame 871 through a resin adhesive material 818 as a joining material. Further, the IC 840 is attached to the upper surface of the frame 871 through an adhesive layer 841. In the tenth embodiment, the frame 871 corresponds to the substrate to which the acceleration sensor element 820 and the angular velocity sensor element 830 are attached.

The IC 840 includes, for example, a drive circuit for driving the acceleration sensor element 820 and the angular velocity sensor element 830, a detection circuit for detecting acceleration in each of the X-axis, Y-axis, and Z-axis directions based on a signal from the acceleration sensor element 820, a detection circuit for detecting an angular velocity in each of the X-axis, Y-axis, and Z-axis directions based on a signal from the angular velocity sensor element 830, and an output circuit for converting signals from the respective detection circuits into predetermined signals and outputting the signals, and the like.

The IC 840 includes a plurality of electrode pads (not illustrated) on its upper surface, and electrode pads are electrically connected to connection terminals 875 and 877 provided on the circuit board 872 through bonding wires 874 and 876. The other electrode pads are electrically connected to terminals 878 of the acceleration sensor element 820 through bonding wires 879. The other electrode pads are electrically connected to terminals 881 of the angular velocity sensor element 830 through bonding wires 882. With this configuration, the IC 840 can control the acceleration sensor element 820 and the angular velocity sensor element 830.

The acceleration sensor element 820 and the angular velocity sensor element 830 are attached to the frame 871 by a resin adhesive material 818.

On the lower surface of the circuit board 872, a plurality of external terminals 885 are provided. The plurality of external terminals 885 correspond to the connection terminals 875 and 877 provided on the upper surface of the circuit board 872, respectively, and are electrically connected through internal wiring (not illustrated) or the like.

Eleventh Embodiment

Next, an eleventh embodiment will be described. Hereinafter, differences from the first to tenth embodiments will be mainly described, and the same reference numerals are given to the same constituent elements as those of the first to tenth embodiments, and redundant description thereof will be omitted. The eleventh embodiment is an embodiment of a vehicle positioning device.

Figure 27:
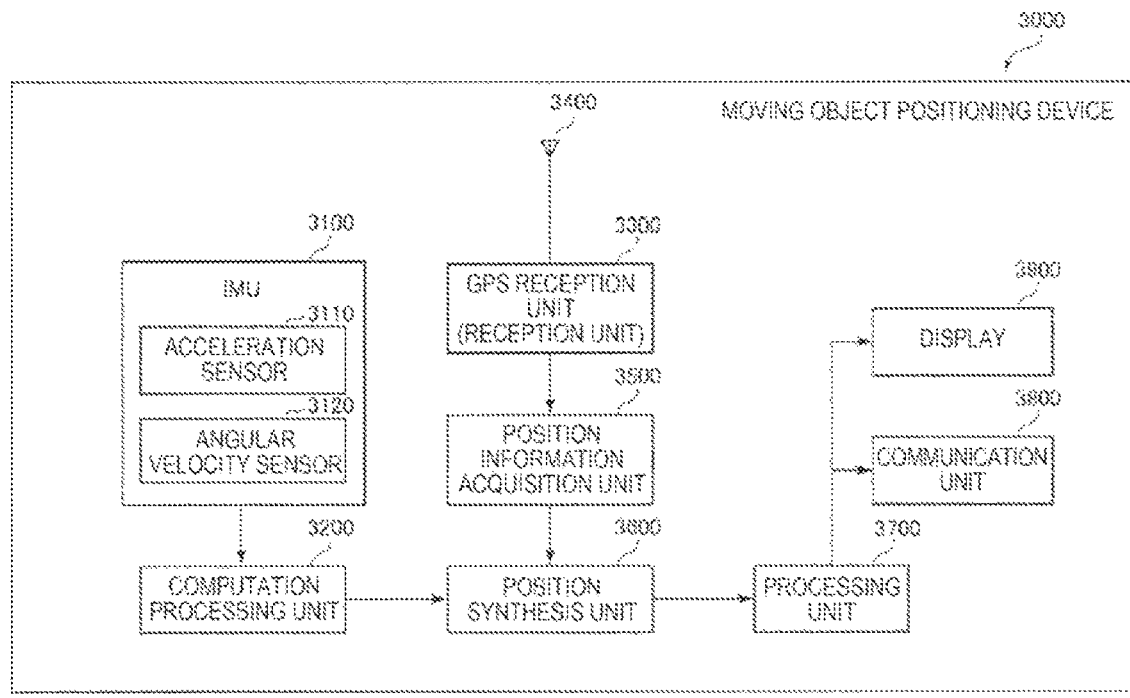
FIG. 27 is a block diagram illustrating an overall system of a vehicle positioning device of an eleventh embodiment.
Figure 28:
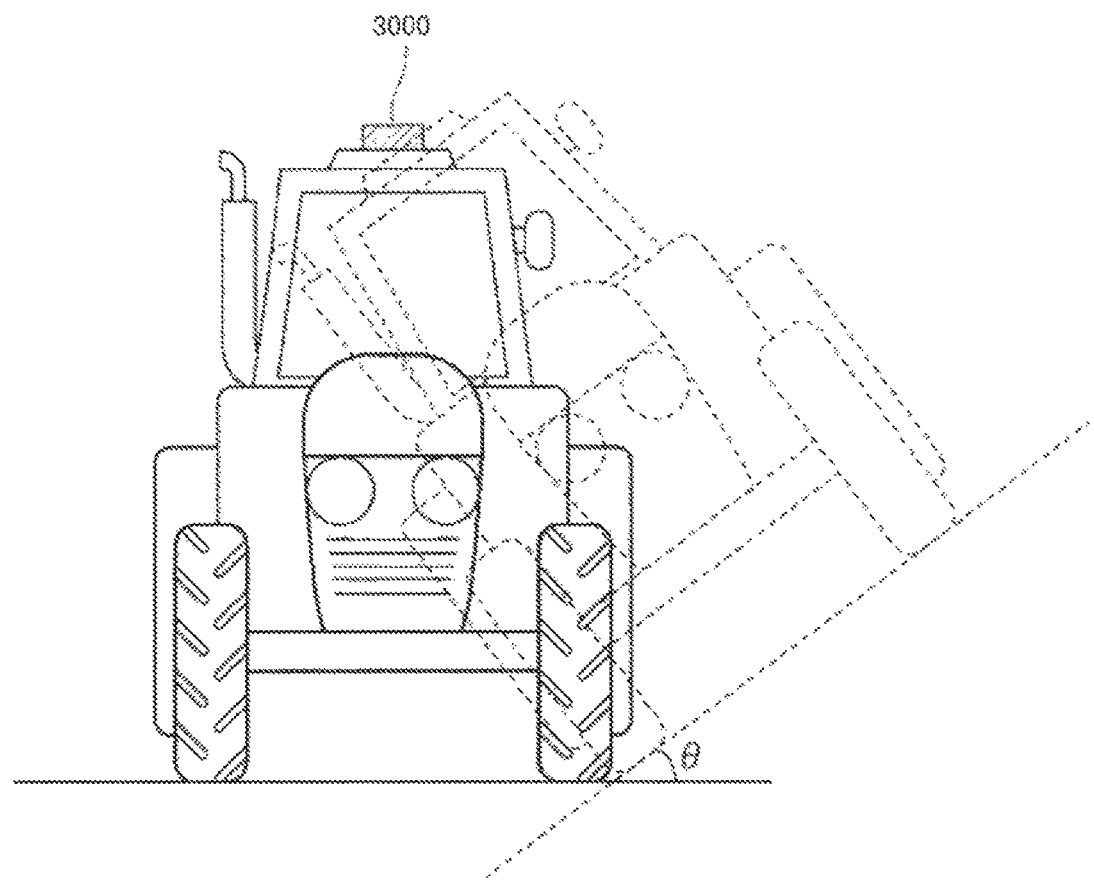
FIG. 28 is a diagram illustrating an action of the vehicle positioning device of the eleventh embodiment.

FIG. 27 is a block diagram illustrating the overall system of a vehicle positioning device 3000 according to an eleventh embodiment. FIG. 28 is a diagram illustrating an action of the vehicle positioning device 3000 illustrated in FIG. 27.

A vehicle positioning device 3000 illustrated in FIG. 27 is a device which is used by being mounted on a vehicle and performs positioning of the vehicle. The vehicle is not particularly limited, and may be any of a bicycle, an automobile (including a four-wheeled automobile and a motorcycle), a train, an airplane, a ship, and the like, but in the eleventh embodiment, the vehicle is described as a four-wheeled automobile. The vehicle positioning device 3000 includes an inertia measurement device 3100 (IMU), a computation processing unit 3200, a GPS reception unit 3300, a receiving antenna 3400, a position information acquisition unit 3500, a position synthesis unit 3600, a processing unit 3700, a communication unit 3800, and a display 3900. As the inertia measurement device 3100, for example, the IMU 100 in the first embodiment described above can be used.

The inertia measurement device 3100 includes a triaxial acceleration sensor 3110 and a triaxial angular velocity sensor 3120. The computation processing unit 3200 receives acceleration data from the acceleration sensor 3110 and angular velocity data from the angular velocity sensor 3120, performs inertial navigation computation processing on these data, and outputs inertial navigation positioning data (data including acceleration and attitude of the vehicle).

The GPS reception unit 3300 receives a signal (GPS carrier wave, satellite signal on which position information is superimposed) from the GPS satellite via the receiving antenna 3400. Further, the position information acquisition unit 3500 outputs GPS positioning data representing the position (latitude, longitude, altitude), speed, direction of the vehicle positioning device 3000 (vehicle) based on the signal received by the GPS reception unit 3300. The GPS positioning data also includes status data indicating a reception state, a reception time, and the like.

Based on inertial navigation positioning data output from the computation processing unit 3200 and the GPS positioning data output from the position information acquisition unit 3500, the position synthesis unit 3600 calculates the position of the vehicle, more specifically, the position on the ground where the vehicle is traveling. For example, even if the position of the vehicle included in the GPS positioning data is the same, as illustrated in FIG. 28, if the attitude of the vehicle is different due to the influence of inclination of the ground or the like, the vehicle is traveling at different positions on the ground. For that reason, it is impossible to calculate an accurate position of the vehicle with only GPS positioning data. Therefore, the position synthesis unit 3600 calculates the position on the ground where the vehicle is traveling, using inertial navigation positioning data (in particular, data on the attitude of the vehicle). This determination can be made comparatively easily by computation using a trigonometric function (inclination θ with respect to the vertical direction).

The position data output from the position synthesis unit 3600 is subjected to predetermined processing by the processing unit 3700 and displayed on the display 3900 as a positioning result. Further, the position data may be transmitted to the external device by the communication unit 3800.

The vehicle positioning device 3000 has been described as above. As described above, such a vehicle positioning device 3000 includes the inertia measurement device 3100, the GPS reception unit 3300 (reception unit) that receives a satellite signal on which position information is superimposed from a positioning satellite, the position information acquisition unit 3500 (acquisition unit) that acquires position information of the GPS reception unit 3300 based on the received satellite signal, the computation processing unit 3200 (computation unit) that computes the attitude of the vehicle based on the inertial navigation positioning data (inertia data) output from the inertia measurement device 3100, and the position synthesis unit 3600 (calculation unit) that calculates the position of the vehicle by correcting position information based on the calculated attitude. With this configuration, the effect of the inertia measurement device 3100 which is the IMU 100 can be achieved, and the vehicle positioning device 3000 with high reliability can be obtained.

In the above description, although description is made by using the global positioning system (GPS) as a satellite positioning system, other global navigation satellite system (GNSS) may be used. For example, one or more of satellite positioning systems among satellite positioning systems such as European geostationary-satellite navigation overlay service (EGNOS), quasi zenith satellite system (QZSS), global navigation satellite system (GLONASS), GALILEO, beidou navigation satellite system (Bei Dou) may be used. Also, a stationary satellite type satellite-based augmentation system (SBAS) such as wide area augmentation system (WAAS) or European geostationary-satellite navigation overlay service (EGNOS) may be utilized in at least one of the satellite positioning systems.

Twelfth Embodiment

Next, a twelfth embodiment will be described. Hereinafter, differences from the first to eleventh embodiments will be mainly described, and the same reference numerals are given to the same constituent elements as those of the first to eleventh embodiments, and redundant description thereof will be omitted. The twelfth embodiment is an embodiment of an electronic device.

Figure 29:
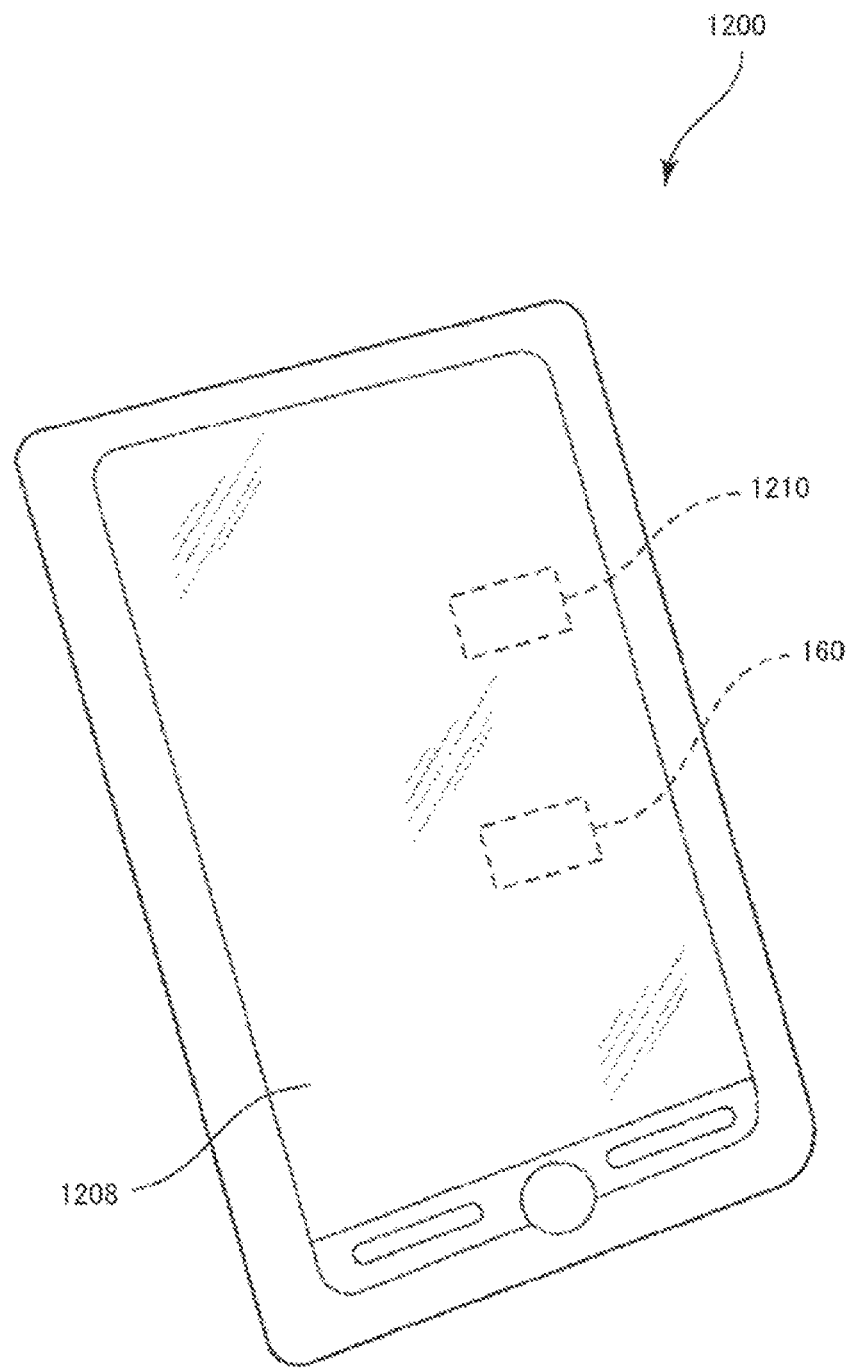
FIG. 29 is a perspective view of an electronic device of a twelfth embodiment.

FIG. 29 is a perspective view illustrating an electronic device according to the twelfth embodiment. A smartphone 1200 (mobile phone) illustrated in FIG. 29 is one to which the electronic device according to the invention is applied. In the smartphone 1200, the sensor unit 160 in the second embodiment, and the control circuit 1210 (control unit) that performs control based on detection signals output from the sensor unit 160 are incorporated. Detection data (angular velocity data) measured by the sensor unit 160 is transmitted to the control circuit 1210, and the control circuit 1210 can recognize the attitude and behavior of the smartphone 1200 from the received detection data, change a display image displayed on the display unit 1208, generate an alarm sound or sound effect, or drive the vibration motor to vibrate the main body.

Such a smartphone 1200 (electronic device) has the sensor unit 160 and the control circuit 1210 (control unit) that performs control based on detection signals output from the sensor unit 160.

Thirteenth Embodiment

Next, a thirteenth embodiment will be described. Hereinafter, differences from the first to twelfth embodiments will be mainly described, and the same reference numerals are given to the same constituent elements as those of the first to twelfth embodiments, and redundant description thereof will be omitted. The thirteenth embodiment is an embodiment of an electronic device.

Figure 30:
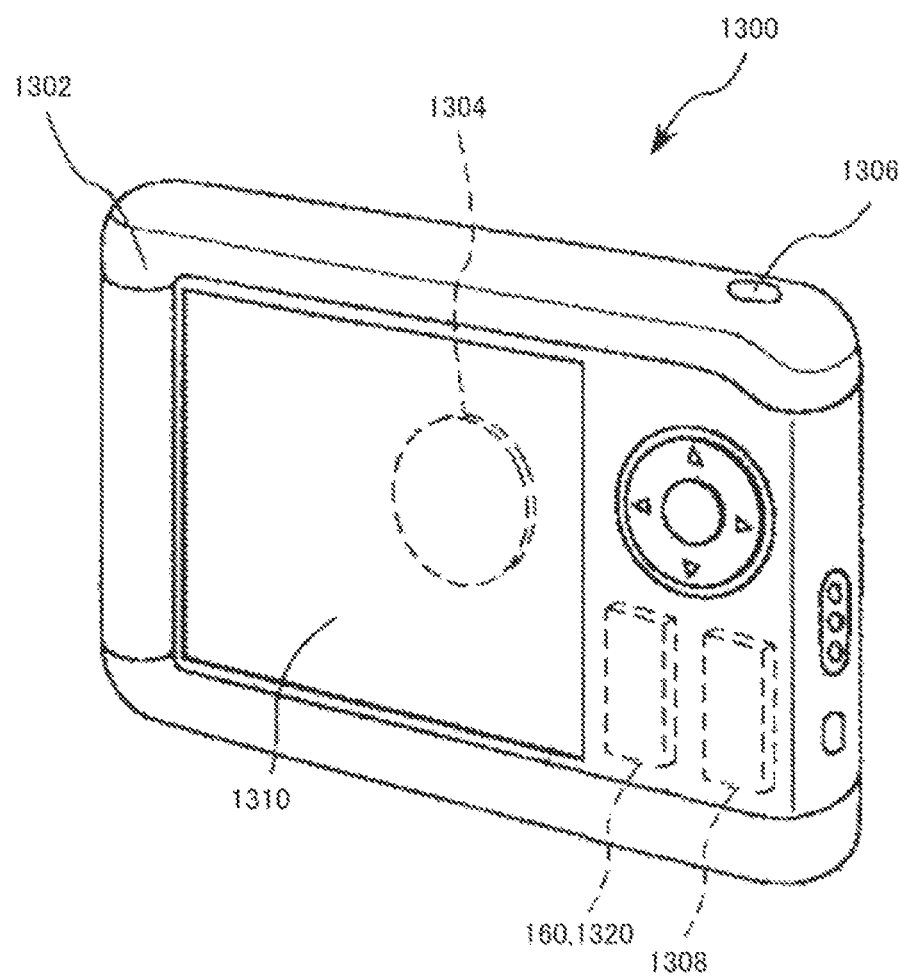
FIG. 30 is a perspective view of an electronic device of a thirteenth embodiment.

FIG. 30 is a perspective view illustrating an electronic device according to the thirteenth embodiment. A digital still camera 1300 illustrated in FIG. 30 is an example of the electronic device. The digital still camera 1300 includes a case 1302, and a display 1310 is provided on the back surface of the case 1302. The display 1310 is configured to perform display based on the image capturing signal by a charge coupled device (CCD), and functions as a finder that displays the subject as an electronic image. A light receiving unit 1304 including an optical lens (image capturing optical system), the CCD, and the like is provided on the front side (the back side in the figure) of the case 1302. When a photographer confirms the subject image displayed on the display 1310 and presses a shutter button 1306, the image capturing signal of the CCD at that time is transferred and stored in the memory 1308. In the digital still camera 1300, the sensor unit 160 of the second embodiment and a control circuit 1320 (control unit) that performs control based on detection signals output from the sensor unit 160 are incorporated. The sensor unit 160 is used for camera shake correction, for example.

Such a digital still camera 1300 (electronic device) includes the sensor unit 160 in the second embodiment and the control circuit 1320 (control unit) that performs control based on detection signals output from the sensor unit 160. For that reason, the effect of the sensor unit 160 can be achieved, and high reliability can be exhibited.

In addition to the personal computer and mobile phone and the digital still camera, the electronic device of the thirteenth embodiment can be applied to, for example, a smartphone, a tablet terminal, a clock (including smart watch), an ink jet type discharging device (for example, an ink jet printer), a laptop personal computer, a TV, a wearable terminals such as HMD (head mounted display), a video camera, a video tape recorder, a car navigation device, a pager, an electronic datebook (including a datebook with communication function), an electronic dictionary, a calculator, an electronic game machines, a word processor, a work station, a videophone, a security TV monitor, an electronic binoculars, a POS terminal, medical equipment (for example, electronic clinical thermometer, blood pressure monitor, blood glucose meter, electrocardiogram measurement device, ultrasonic diagnostic device, electronic endoscope), a fish finder, various measuring instruments, mobile terminal base station equipment, instruments (for example, instruments of vehicles, aircraft, and ships), a flight simulator, a network server, and the like.

Fourteenth Embodiment

Next, a fourteenth embodiment will be described. Hereinafter, differences from the first to thirteenth embodiments will be mainly described, and the same reference numerals are given to the same constituent elements as those of the first to thirteenth embodiments, and redundant description thereof will be omitted. The fourteenth embodiment is an embodiment of a portable electronic device.

Figure 31:
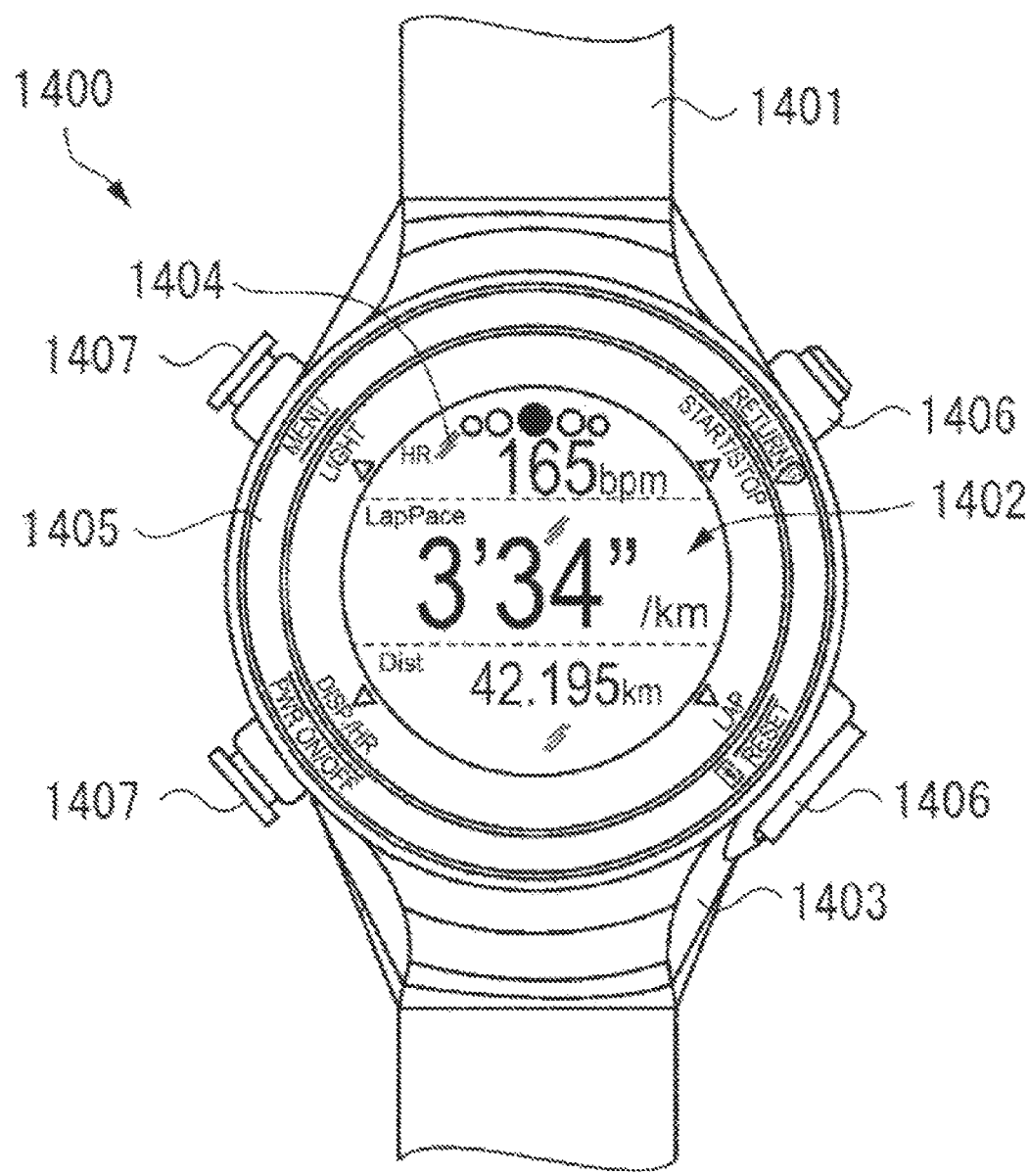
FIG. 31 is a plan view of a portable electronic device of a fourteenth embodiment.
Figure 32:
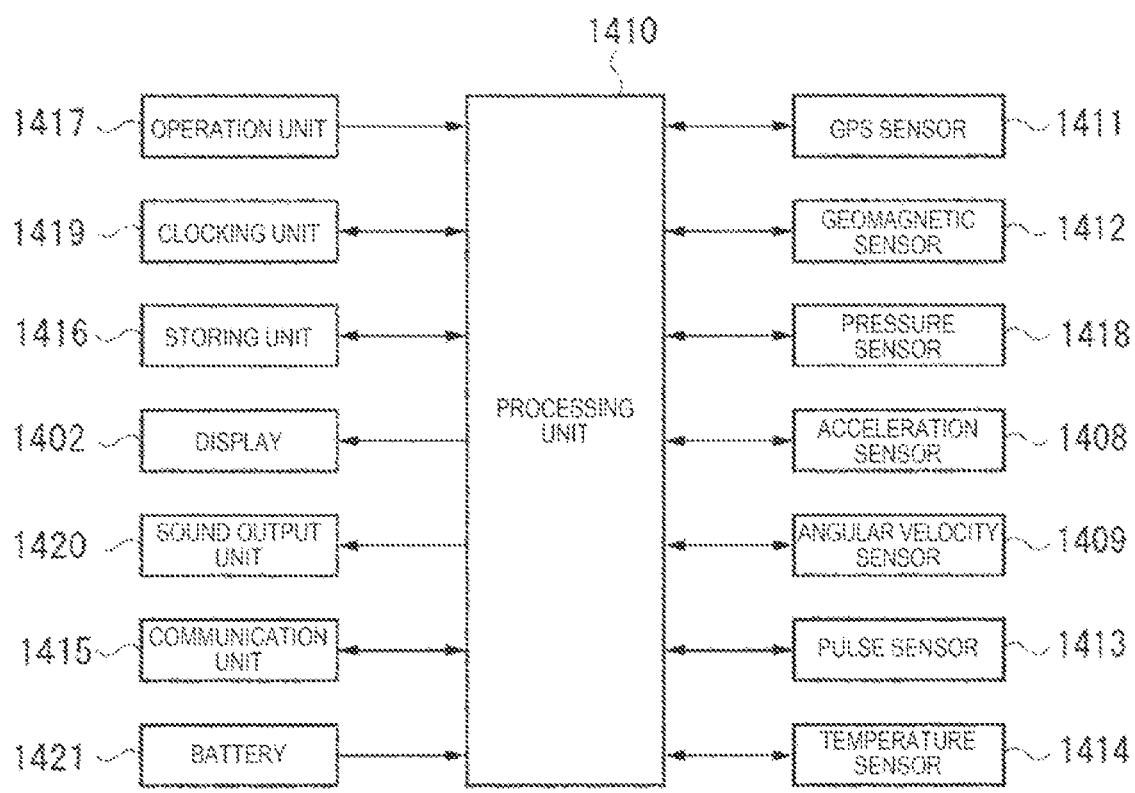
FIG. 32 is a block diagram illustrating a schematic configuration of the portable electronic device of the fourteenth embodiment.

FIG. 31 is a plan view illustrating a portable electronic device according to the fourteenth embodiment. FIG. 32 is a functional block diagram illustrating a schematic configuration of the portable electronic device illustrated in FIG. 31.

A watch type activity meter 1400 (active tracker) illustrated in FIG. 31 is a wristwatch device which is a type of the portable electronic device. The activity meter 1400 is attached to a part (subject) such as the user's wristwatch by a band 1401. The activity meter 1400 includes a display 1402 for digital display and can perform wireless communication. The sensor unit 160 in the second embodiment is incorporated in the activity meter 1400 as an acceleration sensor 1408 for measuring acceleration and an angular velocity sensor 1409 for measuring angular velocity.

The activity meter 1400 includes a case 1403 in which the acceleration sensor 1408 and the angular velocity sensor 1409 are accommodated, a processing unit 1410 which is accommodated in the case 1403 and is for processing output data from the acceleration sensor 1408 and the angular velocity sensor 1409, the display 1402 accommodated in the case 1403, and a translucent cover 1404 covering the opening of the case 1403. A bezel 1405 is provided outside the translucent cover 1404. A plurality of operation buttons 1406 and 1407 are provided on the side surface of the case 1403.

As illustrated in FIG. 32, the acceleration sensor 1408 measures acceleration in each of the three axis directions which intersect (ideally orthogonal to) each other, and outputs a signal (acceleration signal) according to the magnitude and direction of the detected three-axis acceleration. An angular velocity sensor 1409 measures angular velocity in each of the three axis directions intersecting (ideally orthogonal to) each other, and outputs a signal (angular velocity signal) according to the magnitude and direction of the detected three-axis angular velocity.

In the liquid crystal display (LCD) constituting the display 1402, depending on various detection modes, for example, position information using a GPS sensor 1411 and a geomagnetic sensor 1412, exercise information such as the amount of movement, the amount of exercise using the acceleration sensor 1408 and the angular velocity sensor 1409, biometric information such as a pulse rate using a pulse sensor 1413 or the like, and time information such as current time, and the like are displayed. The environmental temperature using a temperature sensor 1414 can also be displayed.

A communication unit 1415 performs various controls for establishing communication between a user terminal and an information terminal (not illustrated). The communication unit 1415 is configure to include a transceiver compatible with the short range wireless communication standard such as, for example, a Bluetooth (registered trademark) (including BTLE: Bluetooth Low Energy), Wireless Fidelity (Wi-Fi) (registered trademark), Zigbee (registered trademark), near field communication (NFC), ANT+ (registered trademark) or the like, and a connector compatible with a communication bus standard such as the universal serial bus (USB) or the like.

The processing unit 1410 (processor) is constituted by, for example, a micro processing unit (MPU), a digital signal processor (DSP), an application specific integrated circuit (ASIC), or the like. The processing unit 1410 executes various processing based on the program stored in a storing unit 1416 and a signal input from an operation unit 1417 (for example, operation buttons 1406 and 1407). Processing by the processing unit 1410 includes data processing for each output signal of the GPS sensor 1411, the geomagnetic sensor 1412, a pressure sensor 1418, the acceleration sensor 1408, the angular velocity sensor 1409, the pulse sensor 1413, the temperature sensor 1414, and the clocking unit 1419, display processing for causing the display 1402 to display an image, sound output processing for causing a sound output unit 1420 to output sound, communication processing for performing communication with the information terminal via the communication unit 1415, and Power control processing for supplying power from a battery 1421 to each unit, and the like.

Such an activity meter 1400 can have at least the following functions.

1. Distance: Measure the total distance from the start of measurement with highly accurate GPS function.
2. Pace: Display a current running pace from pace distance measurement.
3. Average speed: Calculate an average speed and display the average speed from the start of running to the present.
4. Altitude: Measure and display altitude with GPS function.
5. Stride: Measure and display the stride even in a tunnel where GPS radio waves do not reach.
6. Pitch: Measure and display the number of steps per minute.
7. Heart rate: The heart rate is measured and displayed by the pulse sensor.
8. Gradient: Measure and display the gradient of the ground in training and trail runs in the mountains.
9. Auto lap: Automatically perform lap measurement when running for a fixed distance set in advance or for a fixed time.
10. Exercise consumption calorie: Display calorie consumption.
11. Step count: Display the total number of steps from the start of the exercise.

Such an activity meter 1400 (portable electronic device) includes the physical quantity sensors such as the acceleration sensor 1408 and an angular velocity sensor 1409, the case 1403 accommodating the physical quantity sensors, the processing unit 1410 which is accommodated in the case 1403 and performs processing output data from the physical quantity sensor, the display 1402 accommodated in the case 1403, and the translucent cover 1404 covering the opening portion of the case 1403.

As described above, the activity meter 1400 includes the GPS sensor 1411 (satellite positioning system), and can measure a moving distance and a movement trajectory of the user. For that reason, a highly convenient activity meter 1400 can be obtained.

The activity meter 1400 can be widely applied to a running watch, a runner's watch, a runner's watch for multiple sports such as duathlon and triathlon, an outdoor watch, and a GPS watch on which a satellite positioning system such as the GPS is mounted.

Fifteenth Embodiment

Next, a fifteenth embodiment will be described. Hereinafter, differences from the first to fourteenth embodiments will be mainly described, and the same reference numerals are given to the same constituent elements as those of the first to fourteenth embodiments, and redundant description thereof will be omitted. The fifteenth embodiment is an embodiment of a vehicle.

Figure 33:
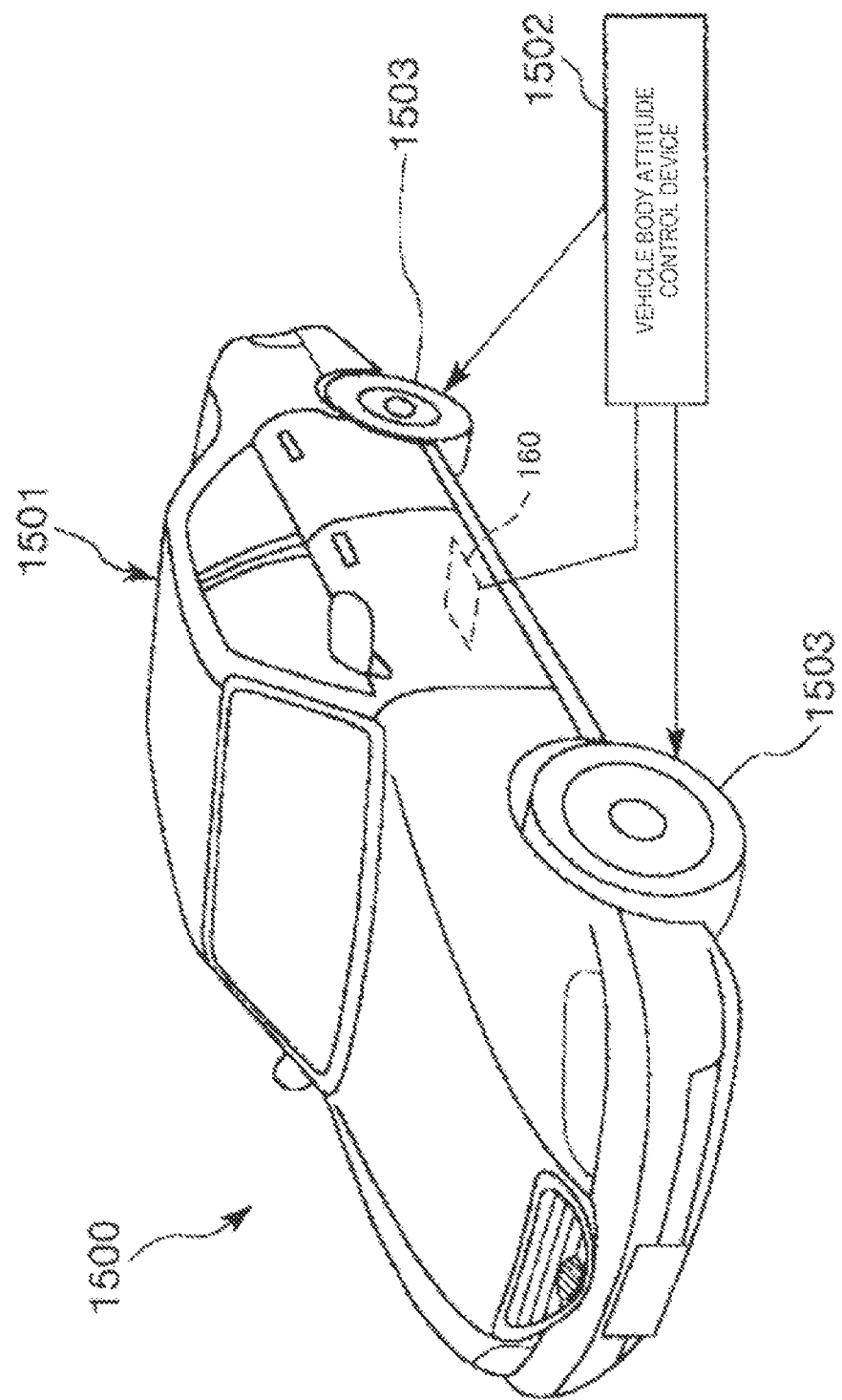
FIG. 33 is a perspective view of a vehicle of a fifteenth embodiment.

FIG. 33 is a perspective view illustrating a configuration of an automobile which is an example of a vehicle in the fifteenth embodiment.

As illustrated in FIG. 33, the sensor unit 160 in the second embodiment is incorporated in an automobile 1500, and for example, the attitude of a vehicle body 1501 can be detected by the sensor unit 160. The detection signal of the sensor unit 160 is supplied to a vehicle body attitude control device 1502 as an attitude control unit for controlling the attitude of the vehicle body and the vehicle body attitude control device 1502 can measure the attitude of the vehicle body 1501 based on the signal, control hardness of the suspension according to the detection result, and control brakes of the individual wheels 1503. In addition, the sensor unit 160 can be widely applied to an electronic control unit (ECU) such as a keyless entry, an immobilizer, a car navigation system, a car air conditioner, an anti-lock braking system (ABS), an air bag, a tire pressure monitoring system (TPMS), an engine control, a control device for inertial navigation for automatic operation, a battery monitor of a hybrid vehicle or an electric vehicle, and the like.

In addition to the examples described above, the sensor unit 160 can be used for attitude control of a biped walking robot and a train, remote control of a radio control airplane, a radio control helicopter, a drone, and the like, or attitude control of an autonomous flying object, attitude control of an agricultural machine, a construction machine, and the like, for example. As described above, in realizing attitude control of various vehicles, the sensor unit 160 and respective control units (not illustrated) are incorporated.

Since such a vehicle includes the sensor unit 160 and the control unit (not illustrated) in the second embodiment, the vehicle has excellent reliability.

Sixteenth Embodiment

A sixteenth embodiment is an embodiment that allows automatic operation in the vehicle 1500 of the fifteenth embodiment.

An advanced driver assistance systems (ADAS) locator used for the automatically operated vehicle 1500 illustrated in FIG. 33 includes, in addition to an inertial sensor including a sensor module 1610, a global navigation satellite system (GNSS) receiver, and a map database storing map data. The ADAS locator measures a traveling position of the vehicle in real time by combining a positioning signal received by the GNSS receiver and a measurement result of the inertial sensor. The ADAS locator reads the map data from the map database. An output from the ADAS locator including the sensor module 1610 is input to an automatic operation control unit 1620. The automatic operation control unit 1620 controls at least one of acceleration, braking, and steering of the vehicle 1500 based on the output (including a detection signal from the sensor module 1610) from the ADAS locator.

Figure 34:
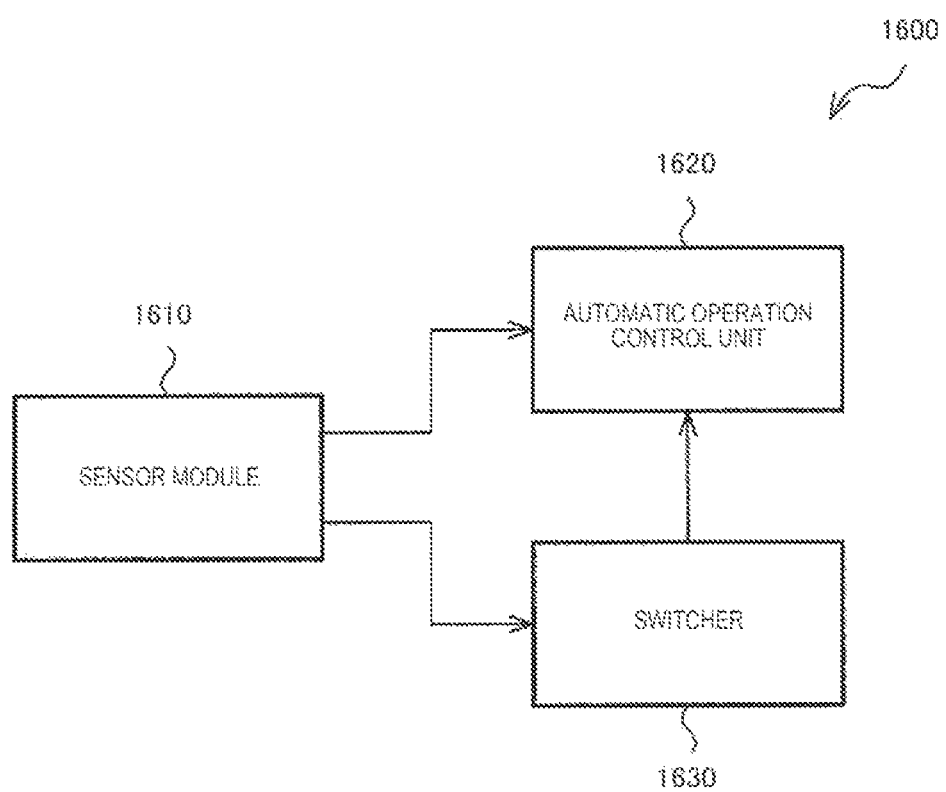
FIG. 34 is a block diagram of a system according to a sixteenth embodiment.

FIG. 34 is a block diagram illustrating a system 1600 related an advanced driver assistance systems (ADAS) locator. A switcher 1630 switches execution or non-execution of automatic operation in the automatic operation control unit 1620 based on change in the output (including change in the detection signal from the sensor module 1610) from the ADAS locator. The switcher 1630 outputs a signal for switching from execution of the automatic operation to non-execution of the automatic operation to the control unit 1620, for example, in a case of abnormality in which detection capability of the sensor (including the sensor module 1610) in the ADAS locator is deteriorated.

What is claimed is:

1. A positioning system which is equipped on a vehicle comprising:
   a satellite positioning receiver that receives a satellite signal transmitted from a satellite;
   an acquisition unit that acquires position information based on the received satellite signal;
   a multi-axis inertial sensor that accommodates a three-axis angular velocity sensor which detects angular velocity around an X-axis, angular velocity around a Y-axis, and angular velocity around a Z-axis, the X-axis, the Y-axis, and the Z-axis being orthogonal to each other;
   a gyro sensor that detects the angular velocity around the Z-axis;
   a computation unit that computes an attitude of the vehicle based on:
      the angular velocity around the X-axis and the angular velocity around the Y-axis detected by the multi-axis inertial sensor, and
      the angular velocity around the Z-axis detected by the gyro sensor, and
   a calculation unit that calculates a position of the vehicle by correcting the position information based on the calculated attitude.

2. The inertial measurement unit according to claim 1, wherein the multi-axis inertial sensor includes an X-axis angular velocity sensor which detects an angular velocity around the X-axis and outputs a first angular velocity signal and a Y-axis angular velocity sensor which detects an angular velocity around the Y-axis and outputs a second angular velocity signal,
   wherein the gyro sensor detects the angular velocity around the Z-axis and outputs a third angular velocity,
   wherein the computation unit computes a roll angle around the X-axis by integrating the first angular velocity signal of the X-axis angular velocity sensor with respect to time,
   wherein the computation unit computes a pitch angle around the Y-axis by integrating the second angular velocity signal of the Y-axis angular velocity sensor with respect to time, and
   wherein the computation unit computes a yaw angle around the Z-axis by integrating the third angular velocity of the gyro sensor.

3. The inertial measurement unit according to claim 1, wherein the X-axis is a front and rear direction of the vehicle,
   wherein the Y-axis is ta left and right direction of the vehicle, and
   wherein the Z-axis is a direction orthogonal to the X-axis and the Y-axis.

4. The inertial measurement unit according to claim 1, wherein the gyro sensor includes a gyro sensor element and a package accommodating the gyro sensor element, and
   wherein the package includes a base and a lid joined to the base.

5. The inertial measurement unit according to claim 1,
wherein the gyro sensor includes a first support base and a second support base constituting a support portion supporting the gyro sensor element, and
wherein the package accommodates the first support base and the second support base.

6. The inertial measurement unit according to claim 1,
wherein the multi-axis inertial sensor further comprises a three-axis acceleration sensor,
wherein the three-axis angular velocity sensor and the three-axis acceleration sensor are accommodated in the multi-axis inertial sensor.

7. The inertial measurement unit according to claim 1,
wherein multi-axis inertial sensor further comprises a resin package covering the three-axis angular velocity sensor.

8. The inertial measurement unit according to claim 1,
wherein the gyro sensor is a resonance frequency change crystal gyro sensor in which quartz crystal is used and which measures an angular velocity from a Coriolis force applied to a vibrating object.

9. The inertial measurement unit according to claim 1,
wherein the three-axis angular velocity sensor is a Si-MEMS angular velocity sensor.

10. The inertial measurement unit according to claim 2,
wherein the first angular velocity signal and the first acceleration signal become calculation reference signals for a roll angle of the vehicle, and
the second angular velocity signal and the second acceleration signal become calculation reference signals for a pitch angle of the vehicle.

\* \* \* \* \*